US012652833B2

(12) United States Patent
 Song et al.

(10) Patent No.: US 12,652,833 B2
(45) Date of Patent: Jun. 9, 2026

(54) SEMICONDUCTOR DEVICE

(71) Applicant: Samsung Electronics Co., Ltd.,
 Suwon-si (KR)

(72) Inventors: Seung Min Song, Suwon-si (KR);
 Myung Il Kang, Suwon-si (KR); **Do
 Young Choi**, Suwon-si (KR)

(73) Assignee: **SAMSUNG ELECTRONICS CO.,
 LTD.**, Suwon-si (KR)

( * ) Notice: Subject to any disclaimer, the term of this
 patent is extended or adjusted under 35
 U.S.C. 154(b) by 637 days.

(21) Appl. No.: 18/079,537

(22) Filed: Dec. 12, 2022

(65) Prior Publication Data

US 2023/0352523 A1 Nov. 2, 2023

(30) Foreign Application Priority Data

May 2, 2022 (KR) ........................ 10-2022-0054275

(51) Int. Cl.
 *H10D 62/10* (2025.01)
 *H10D 30/43* (2025.01)
 *H10D 30/67* (2025.01)
 *H10D 64/01* (2025.01)

(52) U.S. Cl.
 CPC .......... *H10D 62/115* (2025.01); *H10D 30/43*
 (2025.01); *H10D 30/6735* (2025.01); *H10D
 30/6757* (2025.01); *H10D 62/121* (2025.01);
 *H10D 64/017* (2025.01)

(58) Field of Classification Search
 CPC .. H10D 62/115; H10D 30/43; H10D 30/6735;
 H10D 30/6757; H10D 62/121; H10D
 64/017; H10D 30/014; H10D 64/015;
 H10D 84/0151; H10D 84/038; H10D
 84/83; H10D 88/00; H10D 88/01; H10D
 62/81; B82Y 10/00
 See application file for complete search history.

(56) References Cited

U.S. PATENT DOCUMENTS 10,269,983 B2 4/2019 Frougier et al.
 10,741,456 B2 8/2020 Cheng et al.
 10,784,171 B2 9/2020 Frougier et al.
 (Continued)

OTHER PUBLICATIONS

Interview Agenda.*

*Primary Examiner* — Fernando L Toledo
*Assistant Examiner* — Jorge Andres Lopez
(74) *Attorney, Agent, or Firm* — Muir Patent Law, PLLC

(57) ABSTRACT

A semiconductor device includes a substrate, an active pattern on the substrate, a plurality of lower nanosheets stacked on the active pattern, a separation structure spaced apart from the plurality of lower nanosheets in the vertical direction and disposed on the plurality of lower nanosheets, and including first to third layers sequentially stacked on each other, a plurality of upper nanosheets spaced apart from the separation structure in the vertical direction and disposed on the separation structure, and stacked on the separation structure, and a gate electrode extending in a second horizontal direction different from the first horizontal direction, and surrounding the separation structure, each of the plurality of lower nanosheets, and each of the plurality of upper nanosheets. The first and third layers include the same material, and each of the first layer and the third layer includes a material different from a material of the second layer.

13 Claims, 49 Drawing Sheets

(56)           References Cited

U.S. PATENT DOCUMENTS

| | | | |
|---|---|---|---|
| 10,833,078 B2 * | 11/2020 | Smith | H10D 30/6757 |
| 10,930,756 B2 | 2/2021 | Bi et al. | |
| 11,069,684 B1 | 7/2021 | Xie et al. | |
| 11,164,793 B2 | 11/2021 | Xie et al. | |
| 11,177,258 B2 | 11/2021 | Xie et al. | |
| 11,201,153 B2 | 12/2021 | Xie et al. | |
| 2019/0172828 A1 | 6/2019 | Smith et al. | |
| 2021/0202497 A1 | 7/2021 | Lin et al. | |
| 2021/0265345 A1 * | 8/2021 | Xie | H10D 62/116 |
| 2022/0020646 A1 | 1/2022 | Lin et al. | |
| 2023/0069054 A1 * | 3/2023 | Ghosh | H10D 88/00 |
| 2023/0197721 A1 * | 6/2023 | Bao | H10D 88/00 |
| | | | 257/369 |

* cited by examiner

SEMICONDUCTOR DEVICE

CROSS-REFERENCE TO RELATED APPLICATION

This application claims priority from Korean Patent Application No. 10-2022-0054275 filed on May 2, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device, and more particularly, to a semiconductor device including a multi-bridge channel field effect transistor (MBCFET™).

2. Description of the Related Art

As one of the scaling techniques to increase density of an integrated circuit device, a multi-gate transistor has been proposed. In such a multi-gate transistor, a fin-shaped or a nanowire-shaped silicon body is formed on a substrate, and a gate is formed on a surface of the silicon body.

Since such a multi-gate transistor uses a three-dimensional channel, it is easy to perform scaling. The multi-gate transistor may improve current control capability even without increasing a gate length of the multi-gate transistor. The multi-gate transistor may effectively suppress a short channel effect (SCE) in which a potential of a channel region is affected by a drain voltage.

SUMMARY

Aspects of the present disclosure provide a semiconductor device in which the degree of difficulty of a process of forming a separation structure having a relatively large thickness is reduced as the separation structure formed between a plurality of lower nanosheets and a plurality of upper nanosheets is formed to include a plurality of layers.

According to some embodiments of the present disclosure, there is provided a semiconductor device, comprising a substrate, an active pattern extending in a first horizontal direction on the substrate, a plurality of lower nanosheets stacked, while being spaced apart from each other in a vertical direction, on the active pattern, a separation structure spaced apart from the plurality of lower nanosheets in the vertical direction and disposed on the plurality of lower nanosheets, and including first to third layers sequentially stacked on each other, a plurality of upper nanosheets spaced apart from the separation structure in the vertical direction on the separation structure, and stacked while being spaced apart from each other in the vertical direction on the separation structure, and a gate electrode extending in a second horizontal direction different from the first horizontal direction, and surrounding the separation structure, each lower nanosheet of the plurality of lower nanosheets, and each upper nanosheet of the plurality of upper nanosheets. The first layer and the third layer include the same material, and each of the first layer and the third layer includes a material different from a material of the second layer.

According to some embodiments of the present disclosure, there is provided a semiconductor device, comprising a substrate, an active pattern extending in a first horizontal direction on the substrate, a plurality of lower nanosheets stacked, while being spaced apart from each other in a vertical direction, on the active pattern, a separation structure spaced apart from the plurality of lower nanosheets in the vertical direction and disposed on the plurality of lower nanosheets, and including first to third layers sequentially stacked on each other, and a plurality of upper nanosheets spaced apart from the separation structure in the vertical direction on the separation structure, and stacked, while being spaced apart from each other in the vertical direction, on the separation structure. The second layer contacts each of the first layer and the third layer, the first layer and the third layer include the same material, each of the first layer and the third layer includes a material different from a material of the second layer, and the second layer includes the same material as each lower nanosheet of the plurality of lower nanosheets and each upper nanosheet of the plurality of upper nanosheets.

According to some embodiments of the present disclosure, there is provided a semiconductor device, comprising a substrate, an active pattern extending in a first horizontal direction on the substrate, a plurality of lower nanosheets stacked, while being spaced apart from each other in a vertical direction, on the active pattern, a separation structure spaced apart from the plurality of lower nanosheets in the vertical direction and disposed on the plurality of lower nanosheets, and including first to third layers sequentially stacked on each other, a plurality of upper nanosheets spaced apart from the separation structure in the vertical direction and disposed on the separation structure, and stacked, while being spaced apart from each other in the vertical direction, on the separation structure, a gate electrode extending in a second horizontal direction different from the first horizontal direction, and surrounding the separation structure, each lower nanosheet of the plurality of lower nanosheets, and each upper nanosheet of the plurality of upper nanosheets, a lower source/drain region disposed on sidewalls of the plurality of lower nanosheets, an upper source/drain region disposed on sidewalls of the plurality of upper nanosheets, and spaced apart from the lower source/drain region in the vertical direction, an interlayer insulating layer disposed between the lower source/drain region and the upper source/drain region, and contacting sidewalls of the separation structure in the first horizontal direction, a gate insulating layer disposed between the gate electrode and each lower nanosheet of the plurality of lower nanosheets, between the gate electrode and the separation structure, and between the gate electrode and each upper nanosheet of the plurality of upper nanosheets, and an interface layer disposed between the gate insulating layer and the plurality of lower nanosheets, between the gate insulating layer and sidewalls of the second layer, and between the gate insulating layer and the plurality of upper nanosheets. A thickness of the second layer in the vertical direction is smaller than each of a thickness of each lower nanosheet of the plurality of lower nanosheets in the vertical direction and a thickness of each upper nanosheet of the plurality of upper nanosheets in the vertical direction, the first layer and the third layer include the same material, each of the first layer and the third layer includes a material different from a material of the second layer, and the second layer includes the same material as each lower nanosheet of the plurality of lower nanosheets and each upper nanosheet of the plurality of upper nanosheets.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

Hereinafter, a semiconductor device according to some embodiments of the present disclosure will be described with reference to FIGS. 1 to 5.

Figure 1:
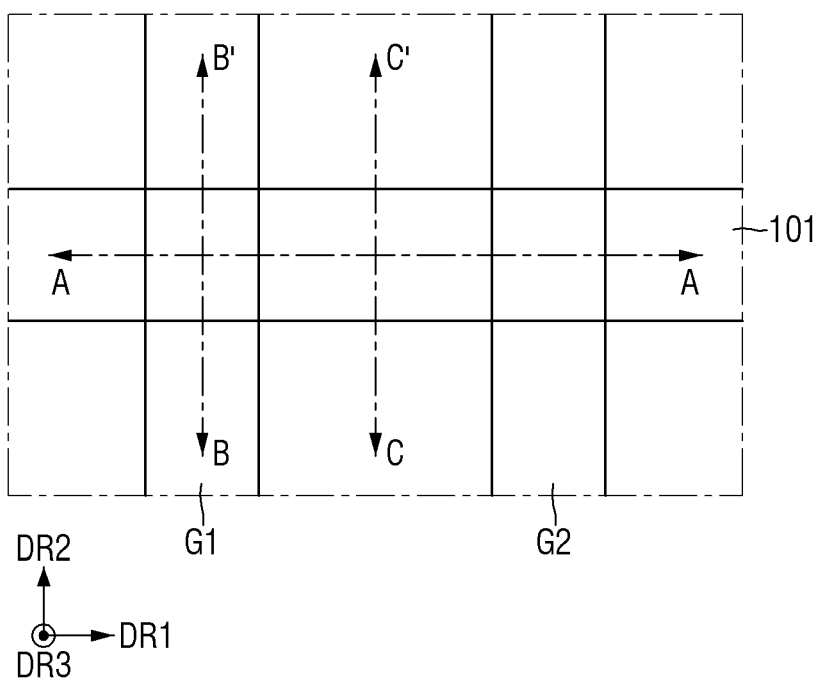
FIG. 1 is a layout view for describing a semiconductor device according to some embodiments of the present disclosure.
Figure 2:
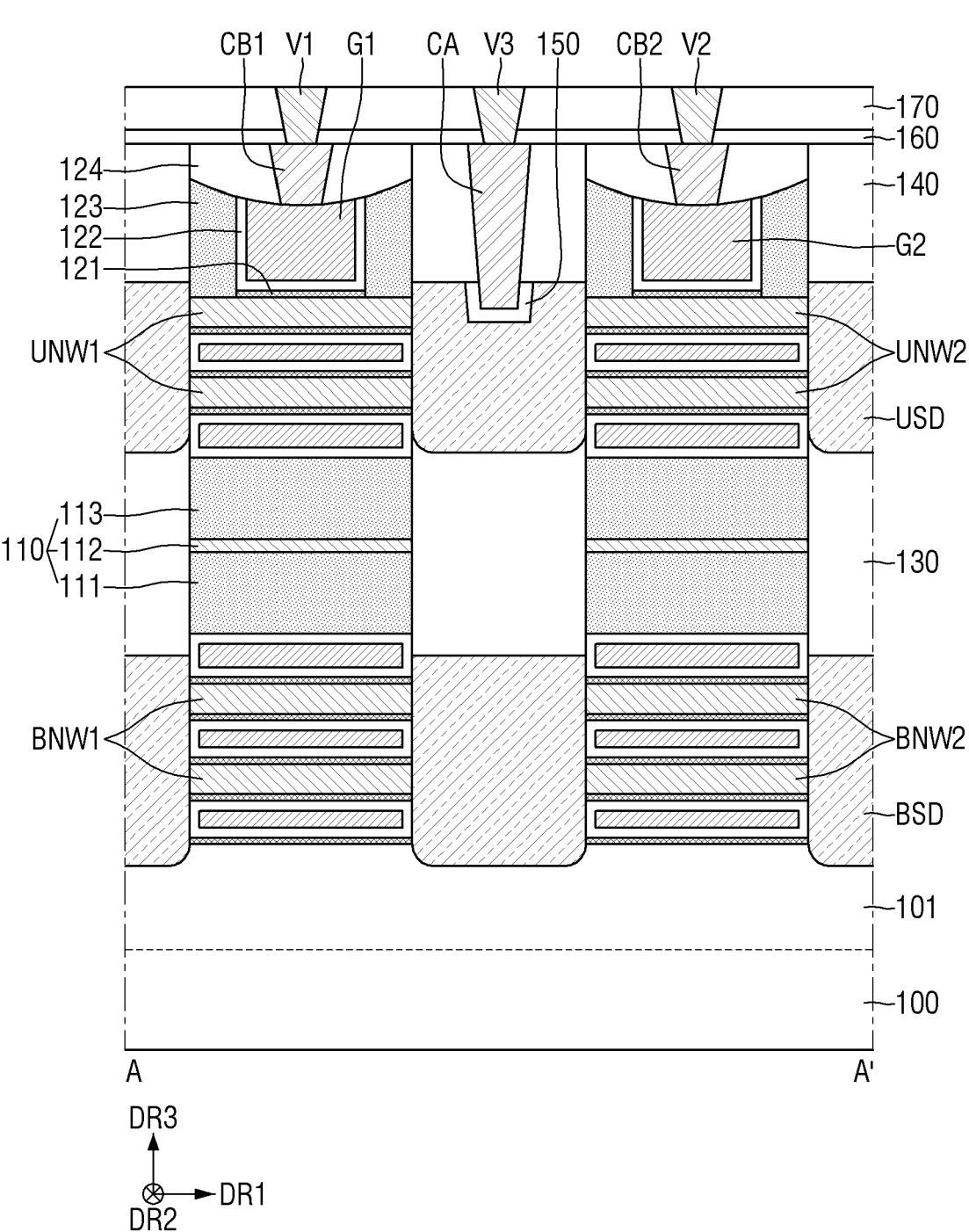
FIG. 2 is a cross-sectional view taken along line A-A' of FIG. 1.
Figure 3:
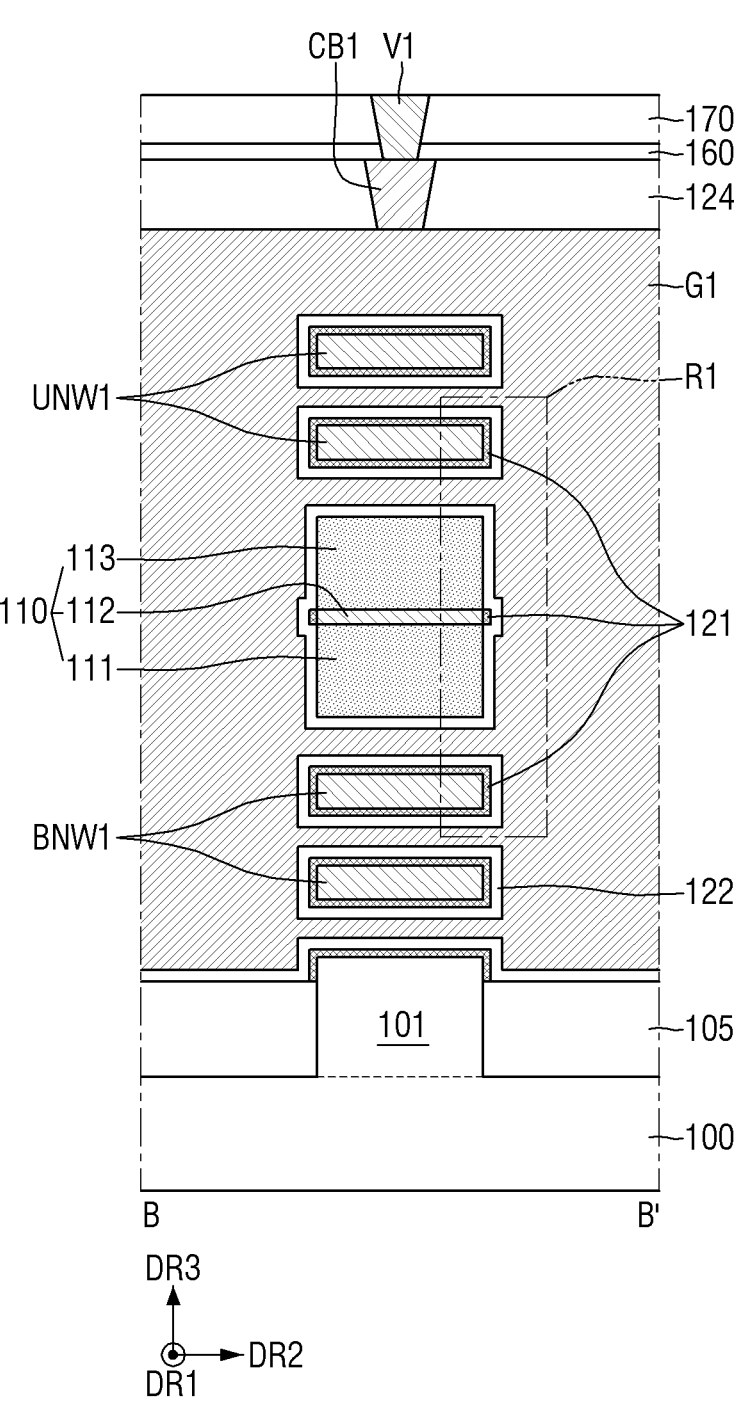
FIG. 3 is a cross-sectional view taken along line B-B' of FIG. 1.
Figure 4:
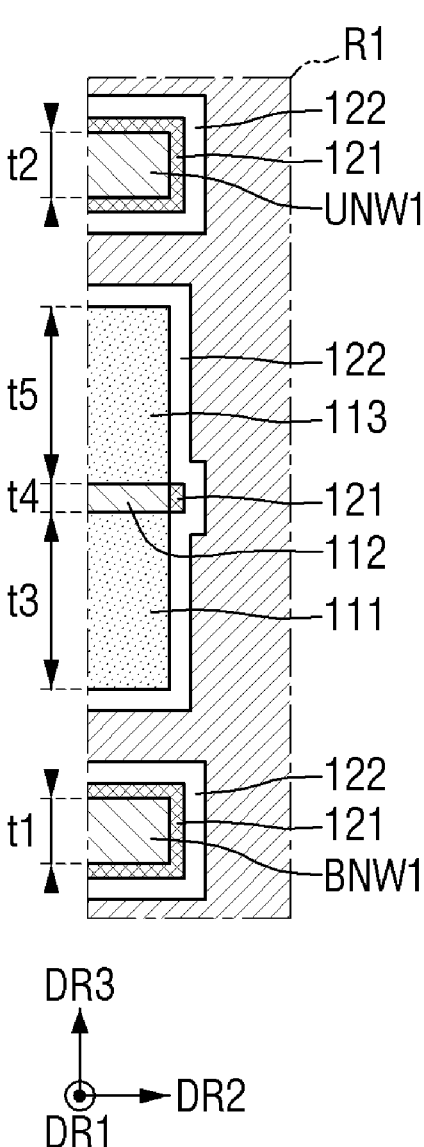
FIG. 4 is an enlarged view of area R1 of FIG. 3.
Figure 5:
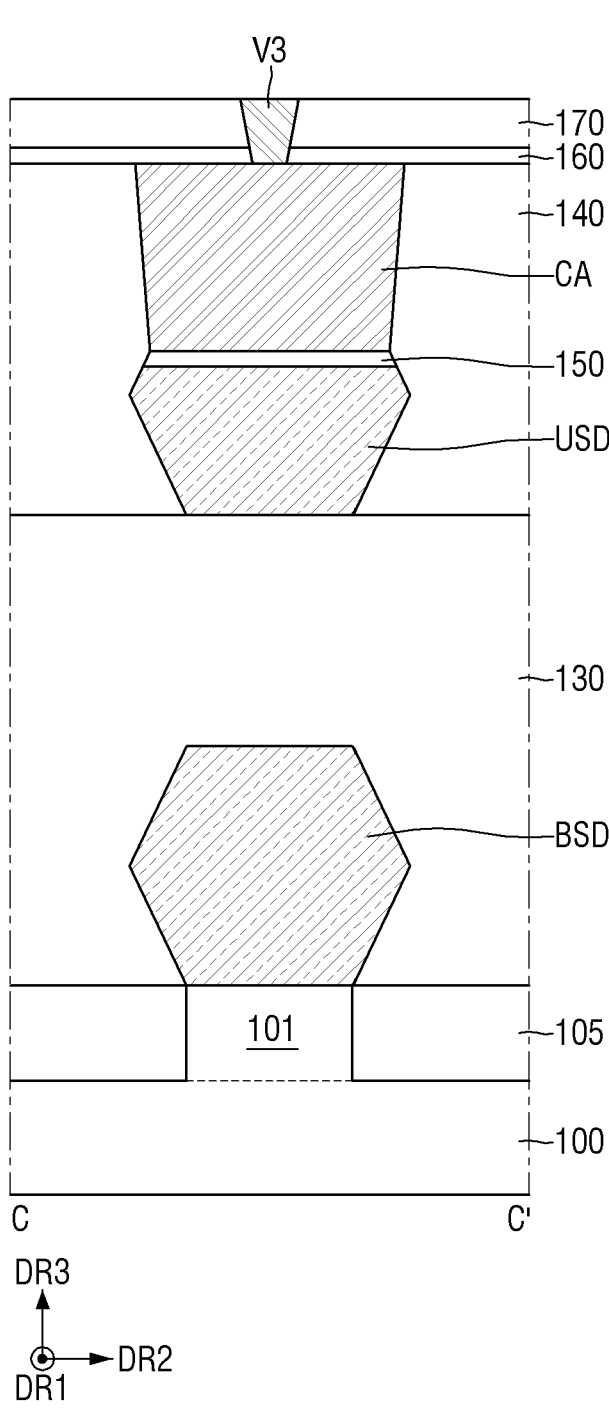
FIG. 5 is a cross-sectional view taken along line C-C' of FIG. 1.

FIG. 1 is a layout view for describing a semiconductor device according to some embodiments of the present disclosure. FIG. 2 is a cross-sectional view taken along line A-A' of FIG. 1. FIG. 3 is a cross-sectional view taken along line B-B' of FIG. 1. FIG. 4 is an enlarged view of area R1 of FIG. 3. FIG. 5 is a cross-sectional view taken along line C-C' of FIG. 1.

Referring to FIGS. 1 to 5, a semiconductor device according to some embodiments of the present disclosure may include a substrate 100, an active pattern 101, a field insulating layer 105, a plurality of first and second lower nanosheets BNW1 and BNW2, a plurality of first and second upper nanosheets UNW1 and UNW2, a separation structure 110, first and second gate electrodes G1 and G2, an interface layer 121, a gate insulating layer 122, a gate spacer 123, a capping pattern 124, a lower source/drain region BSD, an upper source/drain region USD, a first interlayer insulating layer 130, a second interlayer insulating layer 140, first and second gate contacts CB1 and CB2, a source/drain contact CA, a silicide layer 150, an etching stop layer 160, a third interlayer insulating layer 170, and first to third vias V1, V2, and V3.

The substrate 100 may be a silicon substrate or a silicon-on-insulator (SOI). In some embodiments, the substrate 100 may include or may be formed of silicon germanium, silicon germanium on insulator (SGOI), indium antimonide, a lead tellurium compound, indium arsenide, indium phosphide, gallium arsenide, or gallium antimonide, but the present disclosure is not limited thereto.

The active pattern 101 may protrude from the substrate 100 in a vertical direction DR3. Here, the vertical direction DR3 may be defined as a direction perpendicular to each of a first horizontal direction DR1 and a second horizontal direction DR2 different from the first horizontal direction DR1. The active pattern 101 may be a portion of the substrate 100. The present invention is not limited thereto. In some embodiments, the active pattern 101 may include or may be formed of an epitaxial layer grown from the substrate 100. The active pattern 101 may extend in the first horizontal direction DR1.

A field insulating layer 105 may be disposed on the substrate 100. The field insulating layer 105 may surround a sidewall of the active pattern 101. For example, an upper surface of the active pattern 101 may protrude in the vertical direction DR3 beyond an upper surface of the field insulating layer 105. However, the present disclosure is not limited thereto. In some embodiments, the upper surface of the active pattern 101 may be formed on the same plane as the upper surface of the field insulating layer 105.

The plurality of first lower nanosheets BNW1 and the plurality of second lower nanosheets BNW2 may be disposed on the active pattern 101. The plurality of second lower nanosheets BNW2 may be spaced apart from the plurality of first lower nanosheets BNW1 in the first horizontal direction DR1. The plurality of first lower nanosheets BNW1 and the plurality of second lower nanosheets BNW2 may include a plurality of nanosheets stacked while being spaced apart from each other in the vertical direction DR3 on the active pattern 101.

Although FIGS. 2 and 3 illustrate that the plurality of first lower nanosheets BNW1 and the plurality of second lower nanosheets BNW2 each includes two nanosheets stacked in the vertical direction DR3, this is for convenience of explanation. In some embodiments, the plurality of first lower nanosheets BNW1 and the plurality of second lower nanosheets BNW2 may each include three or more nanosheets stacked in the vertical direction DR3. The plurality of first lower nanosheets BNW1 and the plurality of second lower nanosheets BNW2 may each include or may be formed of, for example, silicon (Si).

The separation structure 110 may be disposed on the plurality of first lower nanosheets BNW1 and the plurality of second lower nanosheets BNW2. The separation structure 110 may be spaced apart from the plurality of first lower nanosheets BNW1 and the plurality of second lower nanosheets BNW2 in the vertical direction DR3. The separation structure 110 disposed on the plurality of second lower nanosheets BNW2 may be spaced apart from the separation structure 110 disposed on the plurality of first lower nanosheets BNW1 in the first horizontal direction DR1. The term "contact," as used herein, refers to a direct connection (i.e., touching) unless the context indicates otherwise.

The separation structure 110 may include first to third layers 111, 112, and 113 sequentially stacked. The first layer 111 may be disposed on the plurality of first lower nanosheets BNW1 and the plurality of second lower nanosheets BNW2. The first layer 111 may be spaced apart from the plurality of first lower nanosheets BNW1 and the plurality of second lower nanosheets BNW2 in the vertical direction DR3. The second layer 112 may be disposed on the first layer 111. The second layer 112 may be in contact with an upper surface of the first layer 111. The third layer 113 may be disposed on the second layer 112. The third layer 113 may be in contact with an upper surface of the second layer 112.

For example, the first layer 111 and the third layer 113 may include or may be formed of the same material. Each of the first layer 111 and the third layer 113 may include or may be formed of an insulating material. For example, each of the first layer 111 and the third layer 113 may include or may be formed of at least one of silicon nitride (SiN), silicon oxycarbonitride (SiOCN), silicon boron carbonitride (SiBCN), silicon carbonitride (SiCN), silicon oxynitride (SiON), and a combination thereof.

For example, the second layer 112 may include or may be formed of a material different from that of each of the first layer 111 and the third layer 113. For example, the second layer 112 may include or may be formed of the same material as the plurality of first lower nanosheets BNW1 and the plurality of second lower nanosheets BNW2. For example, the second layer 112 may include or may be formed of silicon (Si).

For example, a thickness t3 of the first layer 111 in the vertical direction DR3 and a thickness t5 of the third layer 113 in the vertical direction DR3 may be the same. However, the present disclosure is not limited thereto. In some embodiments, each of the thickness t3 of the first layer 111 in the vertical direction DR3 and the thickness t5 of the third layer 113 in the vertical direction DR3 may be greater than a thickness t1 of any one of the plurality of first lower nanosheets BNW1 in the vertical direction DR3.

For example, a thickness t4 of the second layer 112 in the vertical direction DR3 may be smaller than each of the thickness t3 of the first layer 111 in the vertical direction DR3 and the thickness t5 of the third layer 113 in the vertical direction DR3. For example, the thickness t4 of the second layer 112 in the vertical direction DR3 may be smaller than the thickness t1 of any one of the plurality of first lower nanosheets BNW1 in the vertical direction DR3.

For example, a width of the separation structure 110 disposed on the plurality of first lower nanosheets BNW1 in the first horizontal direction DR1 may be the same as a width of the plurality of first lower nanosheets BNW1 in the first horizontal direction DR1. A width of the separation structure 110 disposed on the plurality of second lower nanosheets BNW2 in the first horizontal direction DR1 may be the same as a width of the plurality of second lower nanosheets BNW2 in the first horizontal direction DR1.

For example, a width of the separation structure 110 disposed on the plurality of first lower nanosheets BNW1 in the second horizontal direction DR2 may be the same as a width of the plurality of first lower nanosheets BNW1 in the second horizontal direction DR2. A width of the separation structure 110 disposed on the plurality of second lower nanosheets BNW2 in the second horizontal direction DR2 may be the same as a width of the plurality of second lower nanosheets BNW2 in the second horizontal direction DR2. However, the present disclosure is not limited thereto.

The plurality of first upper nanosheets UNW1 and the plurality of second upper nanosheets UNW2 may be disposed on the separation structure 110. The plurality of first upper nanosheets UNW1 and the plurality of second upper nanosheets UNW2 may be spaced apart from the separation structure 110 in the vertical direction DR3. That is, the plurality of first upper nanosheets UNW1, the separation structure 110, and the plurality of first lower nanosheets BNW1 may overlap in the vertical direction DR3. The plurality of second upper nanosheets UNW2, the separation structure 110, and the plurality of second lower nanosheets BNW2 may overlap in the vertical direction DR3. The plurality of first upper nanosheets UNW1 and the plurality of second upper nanosheets UNW2 may each include a plurality of nanosheets stacked while being spaced apart from each other in the vertical direction DR3 on the separation structure 110.

Although FIGS. 2 and 3 illustrate that the plurality of first upper nanosheets UNW1 and the plurality of second upper nanosheets UNW2 each includes two nanosheets stacked in the vertical direction DR3, this is for convenience of explanation. In some embodiments, the plurality of first upper nanosheets UNW1 and the plurality of second upper nanosheets UNW2 may each include three or more nanosheets stacked in the vertical direction DR3. The plurality of first upper nanosheets UNW1 and the plurality of second upper nanosheets UNW2 may include or may be formed of, for example, silicon (Si).

For example, a thickness t2 of any one of the plurality of first upper nanosheets UNW1 in the vertical direction DR3 may be the same as the thickness t1 of any one of the plurality of first lower nanosheets BNW1 in the vertical direction DR3. For example, each of the thickness t3 of the first layer 111 in the vertical direction DR3 and the thickness t5 of the third layer 113 in the vertical direction DR3 may be greater than the thickness t2 of any one of the plurality of first upper nanosheets UNW1 in the vertical direction DR3. For example, the thickness t4 of the second layer 112 in the vertical direction DR3 may be smaller than the thickness t2 of any one of the plurality of first upper nanosheets UNW1 in the vertical direction DR3.

For example, a width of the plurality of first upper nanosheets UNW1 in the first horizontal direction DR1 may be the same as a width of the plurality of first lower nanosheets BNW1 in the first horizontal direction DR1. A width of the plurality of second upper nanosheets UNW2 in the first horizontal direction DR1 may be the same as a width of the plurality of second lower nanosheets BNW2 in the first horizontal direction DR1.

For example, a width of the plurality of first upper nanosheets UNW1 in the second horizontal direction DR2 may be the same as a width of the plurality of first lower nanosheets BNW1 in the second horizontal direction DR2. A width of the plurality of second upper nanosheets UNW2 in the second horizontal direction DR2 may be the same as a width of the plurality of second lower nanosheets BNW2 in the second horizontal direction DR2. However, the present disclosure is not limited thereto.

The first gate electrode G1 may extend in the second horizontal direction DR2 on the active pattern 101 and the field insulating layer 105. The first gate electrode G1 may surround the separation structure 110, each of the plurality of first lower nanosheets BNW1, and each of the plurality of first upper nanosheets UNW1. The second gate electrode G2 may extend in the second horizontal direction DR2 on the active pattern 101 and the field insulating layer 105. The second gate electrode G2 may be spaced apart from the first gate electrode G1 in the first horizontal direction DR1. The second gate electrode G2 may surround the separation structure 110, each of the plurality of second lower nanosheets BNW2, and each of the plurality of second upper nanosheets UNW2.

Each of the first and second gate electrodes G1 and G2 may include or may be formed of, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof. Each of the first and second gate electrodes G1 and G2 may include or may be formed of conductive metal oxide, conductive metal oxynitride, or the like. In some embodiments, each of the first and second gate electrodes G1 and G2 may include an oxidized form of the above-described material.

The lower source/drain region BSD may be disposed on at least one side of each of the first and second gate electrodes G1 and G2 on the active pattern 101. For example, the lower source/drain region BSD may be disposed on opposite sides of each of the first and second gate electrodes G1 and G2 on the active pattern 101. The lower source/drain region BSD may be disposed on a sidewall of each of the plurality of first and second lower nanosheets BNW1 and BNW2. The lower source/drain region BSD may be in contact with the sidewall of each of the plurality of first and second lower nanosheets BNW1 and BNW2.

An upper surface of the lower source/drain region BSD may be formed to be higher than an upper surface of the uppermost nanosheet among the plurality of first lower nanosheets BNW1. The upper surface of the lower source/drain region BSD may be formed to be higher than an upper surface of the uppermost nanosheet among the plurality of second lower nanosheets BNW2. For example, the upper surface of the lower source/drain region BSD may be formed to be lower than a lower surface of the separation structure 110, and the lower source/drain region BSD may not be in contact with the separation structure 110. However, the present disclosure is not limited thereto. In some embodiments, the upper surface of the lower source/drain region BSD may be formed to be higher than the lower surface of the separation structure 110, and the lower source/drain region BSD may be in contact with at least a portion of the separation structure 110.

The first interlayer insulating layer 130 may cover the lower source/drain region BSD on the field insulating layer 105. Although not illustrated, the first interlayer insulating layer 130 may surround a portion of a sidewall of each of the first and second gate electrodes G1 and G2 on the field insulating layer 105. The first interlayer insulating layer 130 may be in contact with opposite sidewalls of the separation structure 110 in the first horizontal direction DR1 on the lower source/drain region BSD. That is, the first interlayer insulating layer 130 may be in contact with opposite sidewalls of each of the first to third layers 111, 112, and 113 in the first horizontal direction DR1.

The first interlayer insulating layer 130 may include or may be formed of, for example, at least one of silicon oxide, silicon nitride, silicon oxynitride, and a low-k dielectric material. The low-k dielectric material may include, for example, fluorinated tetraethylorthosilicate (FTEOS), hydrogen silsesquioxane (HSQ), bis-benzocyclobutene (BCB), tetramethylorthosilicate (TMOS), octamethylcyclo-tetrasiloxane (OMCTS), hexamethyldisiloxane (HMDS), trimethylsilyl borate (TMSB), diacetoxyditertiarybutosi-loxane (DADBS), trimethylsilyl phosphate (TMSP), poly-tetrafluoroethylene (PTFE), tonen silazene (TOSZ), fluoride silicate glass (FSG), polyimide nanofoams such as polypro-pylene oxide, carbon doped silicon oxide (CDO), organo silicate glass (OSG), SiLK, amorphous fluorinated carbon, silica aerogels, silica xerogels, mesoporous silica, or a combination thereof, but the present disclosure is not limited thereto.

The upper source/drain region USD may be disposed on at least one side of each of the first and second gate electrodes G1 and G2 on the first interlayer insulating layer 130. For example, the upper source/drain region USD may be disposed on opposite sides of each of the first and second gate electrodes G1 and G2 on the first interlayer insulating layer 130. The upper source/drain region USD may be disposed on a sidewall of each of the plurality of first and second upper nanosheets UNW1 and UNW2. The upper source/drain region USD may be in contact with the sidewall of each of the plurality of first and second upper nanosheets UNW1 and UNW2. The upper source/drain region USD may overlap the lower source/drain region BSD in the vertical direction DR3.

An upper surface of the upper source/drain region USD may be formed to be higher than an upper surface of the uppermost nanosheet among the plurality of first upper nanosheets UNW1. The upper surface of the upper source/drain region USD may be formed to be higher than an upper surface of the uppermost nanosheet among the plurality of second upper nanosheets UNW2. However, the present disclosure is not limited thereto.

The upper source/drain region USD may not be in contact with the separation structure 110. However, the present disclosure is not limited thereto. In some embodiments, the upper source/drain region USD may be in contact with at least a portion of the separation structure 110.

The gate spacer 123 may extend in the second horizontal direction DR2 on opposite sidewalls of each of the first and second gate electrodes G1 and G2. The gate spacer 123 may be disposed on opposite sidewalls of the first gate electrode G1 on an uppermost nanosheet among the plurality of first upper nanosheets UNW1. Although not illustrated, the gate spacer 123 may be disposed on opposite sidewalls of the first gate electrode G1 on the field insulating layer 105. The gate spacer 123 may be disposed on opposite sidewalls of the second gate electrode G2 on an uppermost nanosheet among the plurality of second upper nanosheets UNW2. Although not illustrated, the gate spacer 123 may be disposed on opposite sidewalls of the second gate electrode G2 on the field insulating layer 105.

The gate spacer 123 may include or may be formed of, for example, at least one of silicon nitride (SiN), silicon oxyni-tride (SiON), silicon carbonitride (SiCN), silicon oxycarbo-nitride (SiOCN), silicon boron nitride (SiBN), silicon oxy-boron nitride (SiOBN), silicon oxycarbide (SiOC), and a combination thereof.

The gate insulating layer 122 may be disposed between each of the first and second gate electrodes G1 and G2 and the gate spacer 123. The gate insulating layer 122 may be disposed between each of the first and second gate electrodes G1 and G2 and the lower source/drain region BSD. The gate insulating layer 122 may be disposed between each of the first and second gate electrodes G1 and G2 and the upper source/drain region USD. The gate insulating layer 122 may be disposed between each of the first and second gate electrodes G1 and G2 and the active pattern 101. The gate insulating layer 122 may be disposed between each of the first and second gate electrodes G1 and G2 and the field insulating layer 105.

The gate insulating layer 122 may be disposed between the first gate electrode G1 and the plurality of first lower nanosheets BNW1. The gate insulating layer 122 may be disposed between the first gate electrode G1 and the plurality of first upper nanosheets UNW1. The gate insulating layer 122 may be disposed between the second gate electrode G2 and the plurality of second lower nanosheets BNW2. The gate insulating layer 122 may be disposed between the second gate electrode G2 and the plurality of second upper nanosheets UNW2.

The gate insulating layer 122 may be disposed between the first gate electrode G1 and the separation structure 110. The gate insulating layer 122 may be disposed between the second gate electrode G2 and the separation structure 110. For example, as illustrated in FIG. 3, the gate insulating layer 122 may be in contact with each of the uppermost surface and the lowermost surface of the separation structure 110. For example, the gate insulating layer 122 may be in contact with each of a lower surface and a sidewall of the first layer 111. The gate insulating layer 122 may be in contact with each of an upper surface and a sidewall of the third layer 113.

The gate insulating layer 122 may include or may be formed of at least one of silicon oxide, silicon oxynitride, silicon nitride, and a high-k dielectric material having a dielectric constant greater than that of the silicon oxide. The high-k dielectric material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some embodiments may include a negative capacitance (NC) field effect transistor (FET) using a negative capacitor. For example, the gate insulating layer 122 may include or may be formed of a ferroelectric material film having ferroelectric characteristics and a paraelectric material film having paraelectric characteristics.

The ferroelectric material film may have a negative capacitance, and the paraelectric material film may have a positive capacitance. For example, when two or more capacitors are connected with each other in series and the capacitance of each capacitor has a positive value, a total capacitance decreases as compared to a capacitance of each individual capacitor. On the other hand, when at least one of the capacitances of two or more capacitors connected with each other in series has a negative value, the total capacitance may have a positive value and may be greater than an absolute value of each individual capacitance.

When the ferroelectric material film having the negative capacitance and the paraelectric material film having the positive capacitance are connected with each other in series, a total capacitance value of the ferroelectric material film and the paraelectric material film connected with each other in series may increase. A transistor may include the gate insulating layer 122 including a ferroelectric material film and a paraelectric material film connected with each other in series, and a total capacitance value of the gate insulating layer 122 may increase as described above. The increased total capacitance value of the gate insulating layer 122 may allow the transistor to have an electrical characteristic of a subthreshold swing (SS) less than 60 mV/decade at the room temperature.

The ferroelectric material film may have the ferroelectric characteristics. The ferroelectric material film may include or may be formed of, for example, at least one of hafnium oxide, hafnium zirconium oxide, barium strontium titanium oxide, barium titanium oxide, and lead zirconium titanium oxide. In some embodiments, the hafnium zirconium oxide may be a material obtained by doping hafnium oxide with zirconium (Zr). In some embodiments, the hafnium zirconium oxide may be a compound of hafnium (Hf), zirconium (Zr), and oxygen (O).

The ferroelectric material film may further include a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A type of dopant doped in the ferroelectric material film may vary depending on a type of ferroelectric material included in the ferroelectric material film.

When the ferroelectric material film includes the hafnium oxide, the dopant doped in the ferroelectric material layer may include, for example, at least one of gadolinium (Gd), silicon (Si), zirconium (Zr), aluminum (Al), and yttrium (Y).

When the dopant is aluminum (Al), the ferroelectric material film may include 3 to 8 atomic % (at %) or an atomic ratio of aluminum. Here, the atomic % or the atomic ratio of the dopant (aluminum) may be a ratio of a number of aluminum atoms to the sum of a number of hafnium atoms and the number of aluminum atoms.

When the dopant is silicon (Si), the ferroelectric material film may include 2 to 10 at % of silicon. When the dopant is yttrium (Y), the ferroelectric material film may include 2 to 10 at % of yttrium. When the dopant is gadolinium (Gd), the ferroelectric material film may contain 1 to 7 at % of gadolinium. When the dopant is zirconium (Zr), the ferroelectric material film may include 50 to 80 at % of zirconium.

The paraelectric material film may have the paraelectric characteristics. The paraelectric material film may include or may be formed of, for example, at least one of silicon oxide and metal oxide having a high dielectric constant. The metal oxide included in the paraelectric material film may include, for example, at least one of hafnium oxide, zirconium oxide, and aluminum oxide, but is not limited thereto.

The ferroelectric material film and the paraelectric material film may include or may be formed of the same material. The ferroelectric material film may have the ferroelectric characteristics, but the paraelectric material film may not have the ferroelectric characteristics. For example, when the ferroelectric material film and the paraelectric material film include the hafnium oxide, a crystal structure of the hafnium oxide included in the ferroelectric material film is different from a crystal structure of the hafnium oxide included in the paraelectric material film.

The ferroelectric material film may have a thickness having the ferroelectric characteristics. The thickness of the ferroelectric material film may be, for example, 0.5 to 10 nm, but is not limited thereto. Since a critical thickness representing the ferroelectric characteristics may vary for each ferroelectric material, the thickness of the ferroelectric material film may vary depending on the ferroelectric material.

In some embodiments, the gate insulating layer 122 may include or may be one ferroelectric material film. The present invention is not limited thereto. In some embodiments, the gate insulating layer 122 may include or may be formed of a plurality of ferroelectric material films spaced apart from each other. The gate insulating layer 122 may have a stacked film structure in which a plurality of ferroelectric material films and a plurality of paraelectric material films are alternately stacked.

The interface layer 121 may be disposed between the gate insulating layer 122 and the plurality of first lower nanosheets BNW1. The interface layer 121 may be disposed between the gate insulating layer 122 and the plurality of first upper nanosheets UNW1. The interface layer 121 may be disposed between the gate insulating layer 122 and the plurality of second lower nanosheets BNW2. The interface layer 121 may be disposed between the gate insulating layer 122 and the plurality of second upper nanosheets UNW2. For example, the interface layer 121 may be in contact with each of the plurality of first and second lower nanosheets BNW1 and BNW2 and each of the plurality of first and second upper nanosheets UNW1 and UNW2.

The interface layer 121 may be disposed between the gate insulating layer 122 and a sidewall of the second layer 112. The interface layer 121 may be in contact with the sidewall of the second layer 112. The interface layer 121 may include or may be formed of silicon oxide ($SiO_2$). However, the present disclosure is not limited thereto.

The capping pattern 124 may extend in the second horizontal direction DR2 on the first gate electrode G1, the second gate electrode G2, the gate insulating layer 122, and the gate spacer 123. For example, the capping pattern 124 may be in contact with an upper surface of the gate spacer 123. However, the present disclosure is not limited thereto. In some embodiments, the capping pattern 124 may be disposed between the gate spacers 123. In this case, an upper surface of the capping pattern 124 may be formed on the same plane as the upper surface of the gate spacer 123. The capping pattern 124 may include or may be formed of, for example, at least one of silicon nitride (SiN), silicon oxynitride (SiON), silicon oxide ($SiO_2$), silicon carbonitride (SiCN), silicon oxycarbonitride (SiOCN), and a combination thereof.

The second interlayer insulating layer 140 may cover the upper source/drain region USD on the first interlayer insulating layer 130. Although not illustrated, the second interlayer insulating layer 140 may surround a portion of a sidewall of each of the first and second gate electrodes G1 and G2 on the field insulating layer 105.

For example, an upper surface of the second interlayer insulating layer 140 may be formed on the same plane as the upper surface of the capping pattern 124. However, the present disclosure is not limited thereto. In some embodiments, the second interlayer insulating layer 140 may cover the upper surface of the capping pattern 124. For example, the second interlayer insulating layer 140 may include or may be formed of the same material as the first interlayer insulating layer 130. The second interlayer insulating layer 140 may include or may be formed of, for example, at least one of silicon oxide, silicon nitride, silicon oxynitride, and a low-k dielectric material.

The source/drain contact CA may penetrate through the second interlayer insulating layer 140 in the vertical direction DR3 to be connected to the upper source/drain region USD. At least a portion of the source/drain contact CA may extend into the upper source/drain region USD. For example, an upper surface of the source/drain contact CA may be formed on the same plane as the upper surface of the second interlayer insulating layer 140. However, the present disclosure is not limited thereto. In FIG. 2, the source/drain contact CA is formed as a single film. The present invention is not limited thereto. In some embodiments, the source/drain contact CA may be formed as multiple films. The source/drain contact CA may include or may be formed of a conductive material.

The silicide layer 150 may be disposed between the upper source/drain region USD and the source/drain contact CA. The silicide layer 150 may include or may be formed of, for example, a metal silicide material.

The first gate contact CB1 may be disposed on the first gate electrode G1. The first gate contact CB1 may penetrate through the capping pattern 124 in the vertical direction DR3 to be electrically connected to the first gate electrode G1. The second gate contact CB2 may be disposed on the second gate electrode G2. The second gate contact CB2 may penetrate through the capping pattern 124 in the vertical direction DR3 to be electrically connected to the second gate electrode G2.

For example, an upper surface of each of the first and second gate contacts CB1 and CB2 may be formed on the same plane as the upper surface of the second interlayer insulating layer 140. However, the present disclosure is not limited thereto. In FIG. 2, each of the first and second gate contacts CB1 and CB2 is formed as a single film. The present invention is not limited thereto. In some embodiments, each of the first and second gate contacts CB1 and CB2 may be formed as multiple films. Each of the first and second gate contacts CB1 and CB2 may include or may be formed of a conductive material.

The etching stop layer 160 may be disposed on the upper surface of each of the second interlayer insulating layer 140 and the capping pattern 124. The etching stop layer 160 may be conformally formed, for example. In FIGS. 2 to 5, the etching stop layer 160 is formed as a single film. The present disclosure is not limited thereto. In some embodiments, the etching stop layer 160 may be formed as multiple films. The etching stop layer 160 may include or may be formed of, for example, at least one of aluminum oxide, aluminum nitride, hafnium oxide, zirconium oxide, silicon oxide, silicon nitride, silicon oxynitride, and a low-k dielectric material.

The third interlayer insulating layer 170 may be disposed on the etching stop layer 160. The third interlayer insulating layer 170 may include or may be formed of, for example, at least one of silicon oxide, silicon nitride, silicon oxynitride, and a low-k dielectric material.

The first via V1 may penetrate through the third interlayer insulating layer 170 and the etching stop layer 160 in the vertical direction DR3 to be connected to the first gate contact CB1. The second via V2 may penetrate through the third interlayer insulating layer 170 and the etching stop layer 160 in the vertical direction DR3 to be connected to the second gate contact CB2. The third via V3 may penetrate through the third interlayer insulating layer 170 and the etching stop layer 160 in the vertical direction DR3 to be connected to the source/drain contact CA. In FIG. 2, each of the first to third vias V1, V2, and V3 is formed as a single film. The present invention is not limited thereto. In some embodiments, each of the first to third vias V1, V2, and V3 may be formed as multiple films. Each of the first to third vias V1, V2, and V3 may include or may be formed of a conductive material.

In the semiconductor device according to some embodiments of the present disclosure, as the separation structure 110 formed between the plurality of lower nanosheets BNW1 and BNW2 and the plurality of upper nanosheets UNW1 and UNW2 is formed to include a plurality of layers 111, 112, and 113, the degree of difficulty of a process of forming the separation structure 110 having a relatively large thickness may be reduced. In some embodiments, one of the plurality of layers 111, 112, and 113 may include or may be formed of a material different from materials of the others. For example, a material of the layer 112 may be different from a material of the layer 111 and a material of the layer 113. The material of the layer 111 may be the same as the material of the layer 113.

Hereinafter, a method of manufacturing a semiconductor device according to some embodiments of the present disclosure will be described with reference to FIGS. 2 to 28.

FIGS. 6 to 28 are intermediate step views for describing a method of manufacturing a semiconductor device according to some embodiments of the present disclosure.

Figure 6:
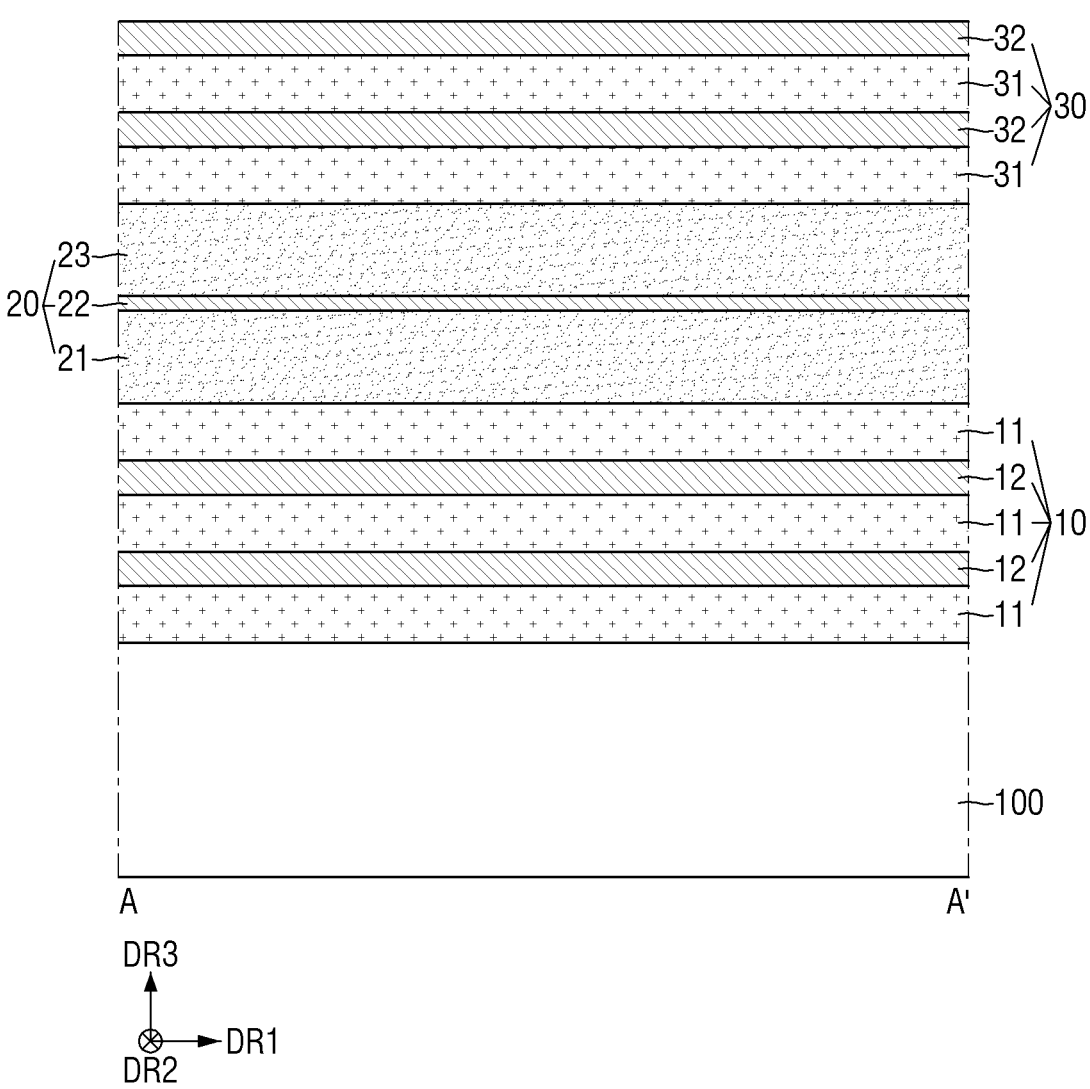
FIGS. 6 to 28 are intermediate step views for describing a method of manufacturing a semiconductor device according to some embodiments of the present disclosure.
Figure 7:
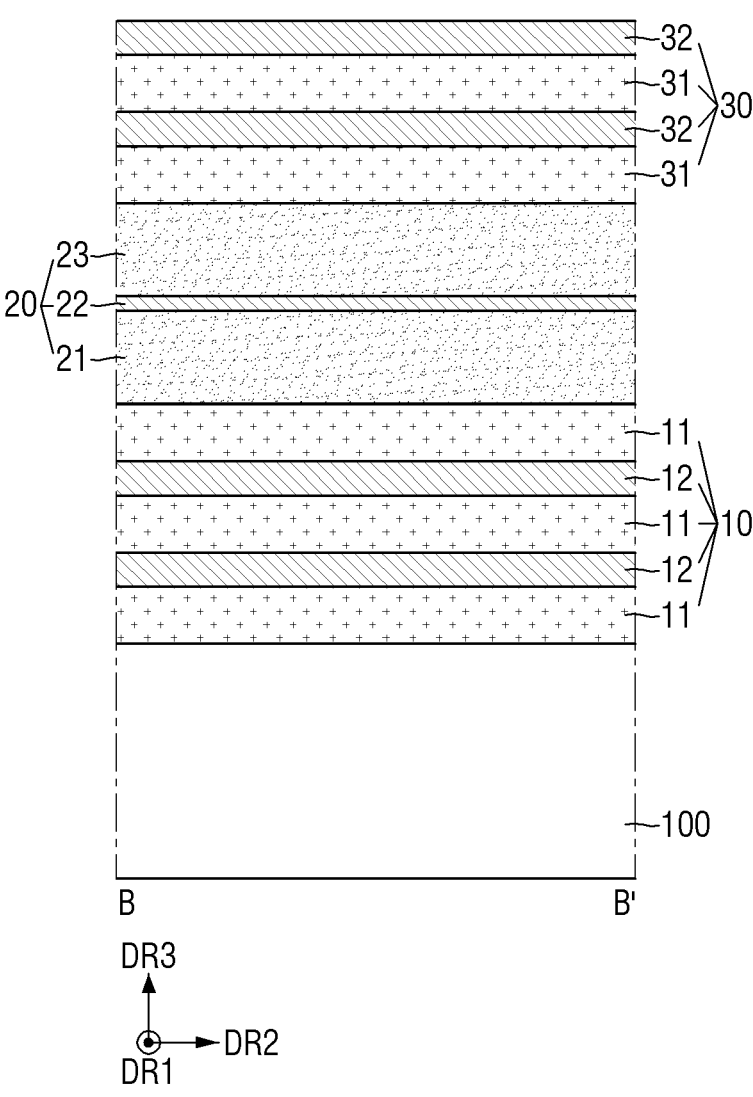

Referring to FIGS. 6 and 7, a first stacked structure 10, a second stacked structure 20, and a third stacked structure 30 may be sequentially stacked on the substrate 100. The first stacked structure 10 may include a first sacrificial layer 11 and a first semiconductor layer 12 alternately stacked on the substrate 100. For example, the first sacrificial layer 11 may be formed on the lowermost portion of the first stacked structure 10, and the first semiconductor layer 12 may be formed on the uppermost portion of the first stacked structure 10. However, the present disclosure is not limited thereto. In some embodiments, the first sacrificial layer 11 may be formed on the uppermost portion of the first stacked structure 10. The first sacrificial layer 11 may include or may be formed of, for example, silicon germanium (SiGe). The first semiconductor layer 12 may include or may be formed of, for example, silicon (Si).

The second stacked structure 20 may include a second sacrificial layer 21, a second semiconductor layer 22, and a third sacrificial layer 23 sequentially stacked on the first stacked structure 10. A thickness of each of the second sacrificial layer 21 and the third sacrificial layer 23 in the vertical direction DR3 may be greater than that of the second semiconductor layer 22 in the vertical direction DR3.

Each of the second sacrificial layer 21 and the third sacrificial layer 23 may include or may be formed of, for example, silicon germanium (SiGe). For example, a concentration of germanium (Ge) included in each of the second sacrificial layer 21 and the third sacrificial layer 23 may be greater than a concentration of germanium (Ge) included in the first sacrificial layer 11. The second semiconductor layer 22 may include or may be formed of, for example, silicon (Si).

The third stacked structure 30 may include a fourth sacrificial layer 31 and a third semiconductor layer 32 alternately stacked on the second stacked structure 20. For example, the fourth sacrificial layer 31 may be formed on the lowermost portion of the third stacked structure 30, and the third semiconductor layer 32 may be formed on the uppermost portion of the third stacked structure 30. However, the present disclosure is not limited thereto. In some embodiments, the fourth sacrificial layer 31 may be formed on the uppermost portion of the third stacked structure 30.

The fourth sacrificial layer 31 may include or may be formed of, for example, silicon germanium (SiGe). For example, a concentration of germanium (Ge) included in the fourth sacrificial layer 31 may be smaller than a concentration of germanium (Ge) included in the second sacrificial layer 21. The third semiconductor layer 32 may include or may be formed of, for example, silicon (Si).

Figure 8:
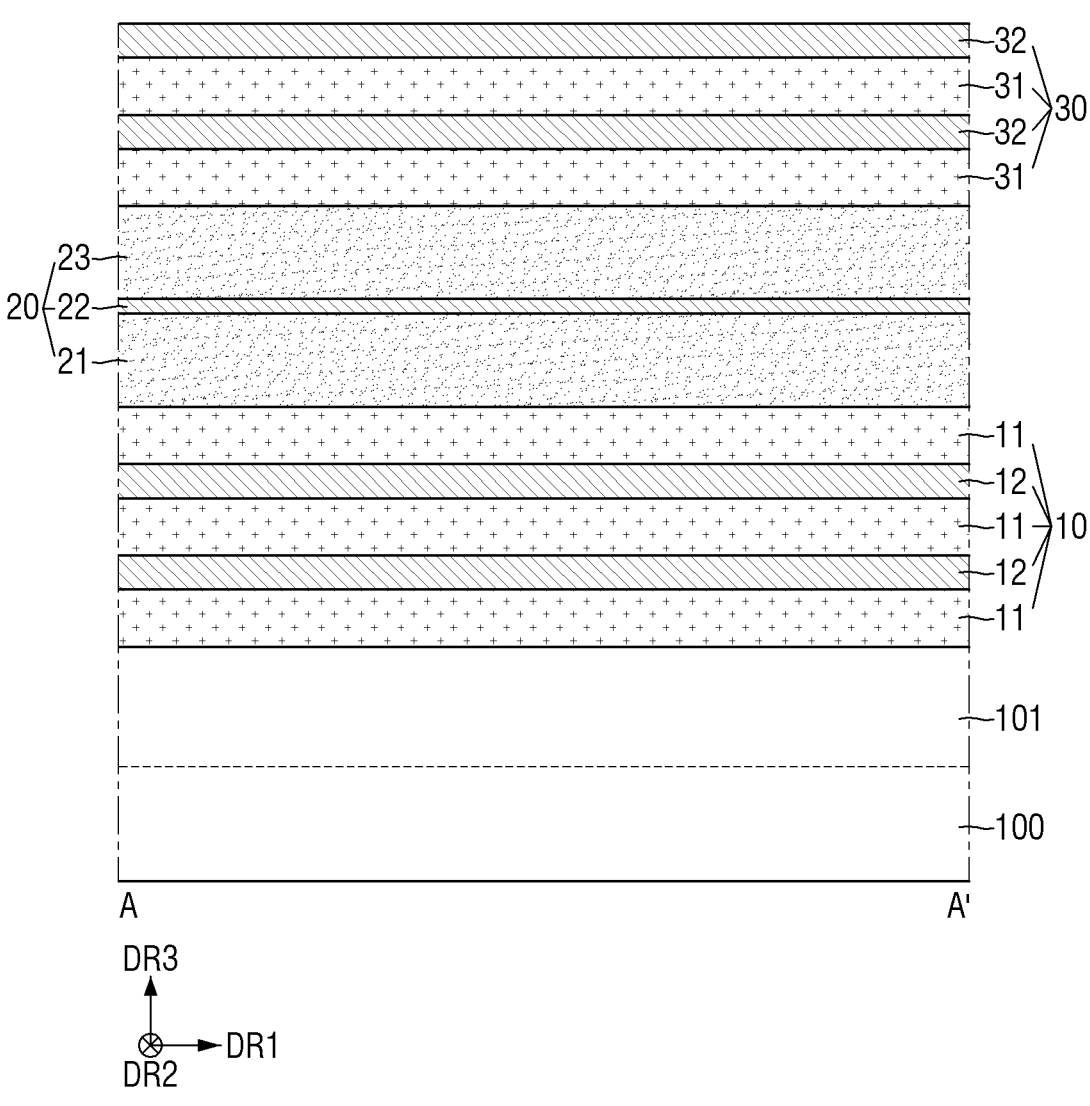
Figure 9:
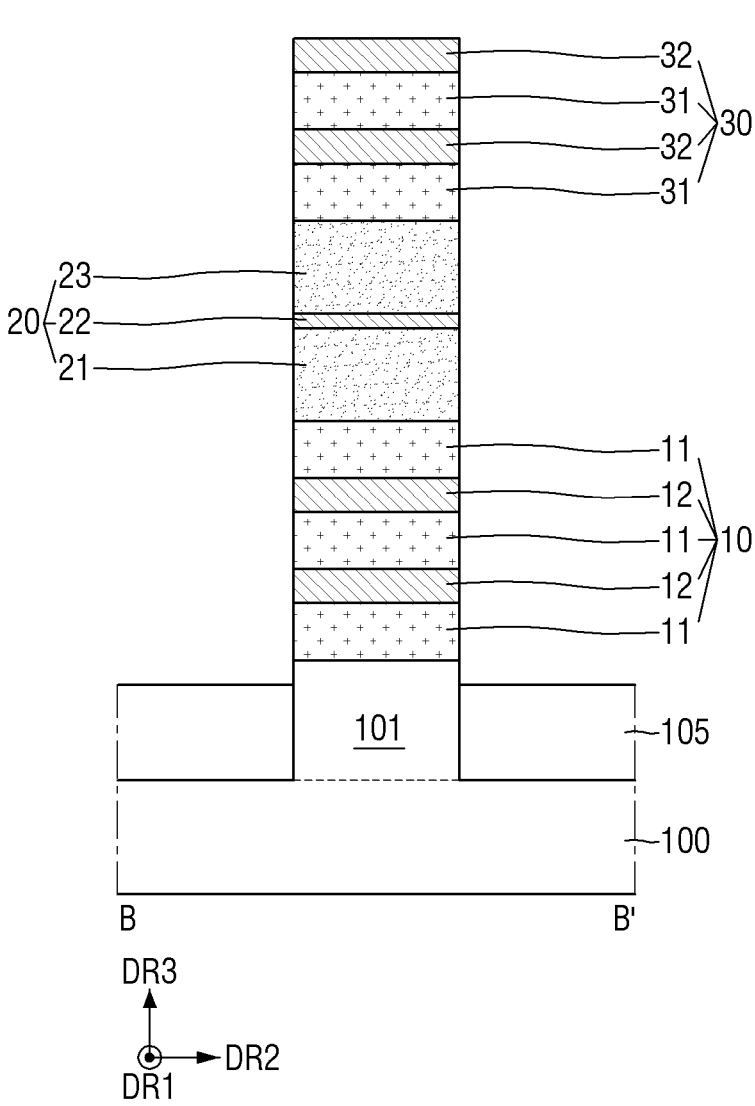

Referring to FIGS. 8 and 9, a portion of the first stacked structure 10, the second stacked structure 20, the third stacked structure 30, and the substrate 100 may be etched to form an active pattern 101 on the substrate 100. The active pattern 101 may extend in the first horizontal direction DR1. The active pattern 101 may protrude from the substrate 100 in the vertical direction DR3. In some embodiments, the active pattern 101 may be formed by partially etching the substrate 100 or may be epitaxially formed.

Subsequently, a field insulating layer 105 surrounding a sidewall of the active pattern 101 may be formed on the substrate 100. For example, the active pattern 101 may protrude in the vertical direction DR3 beyond an upper surface of the field insulating layer 105.

Figure 10:
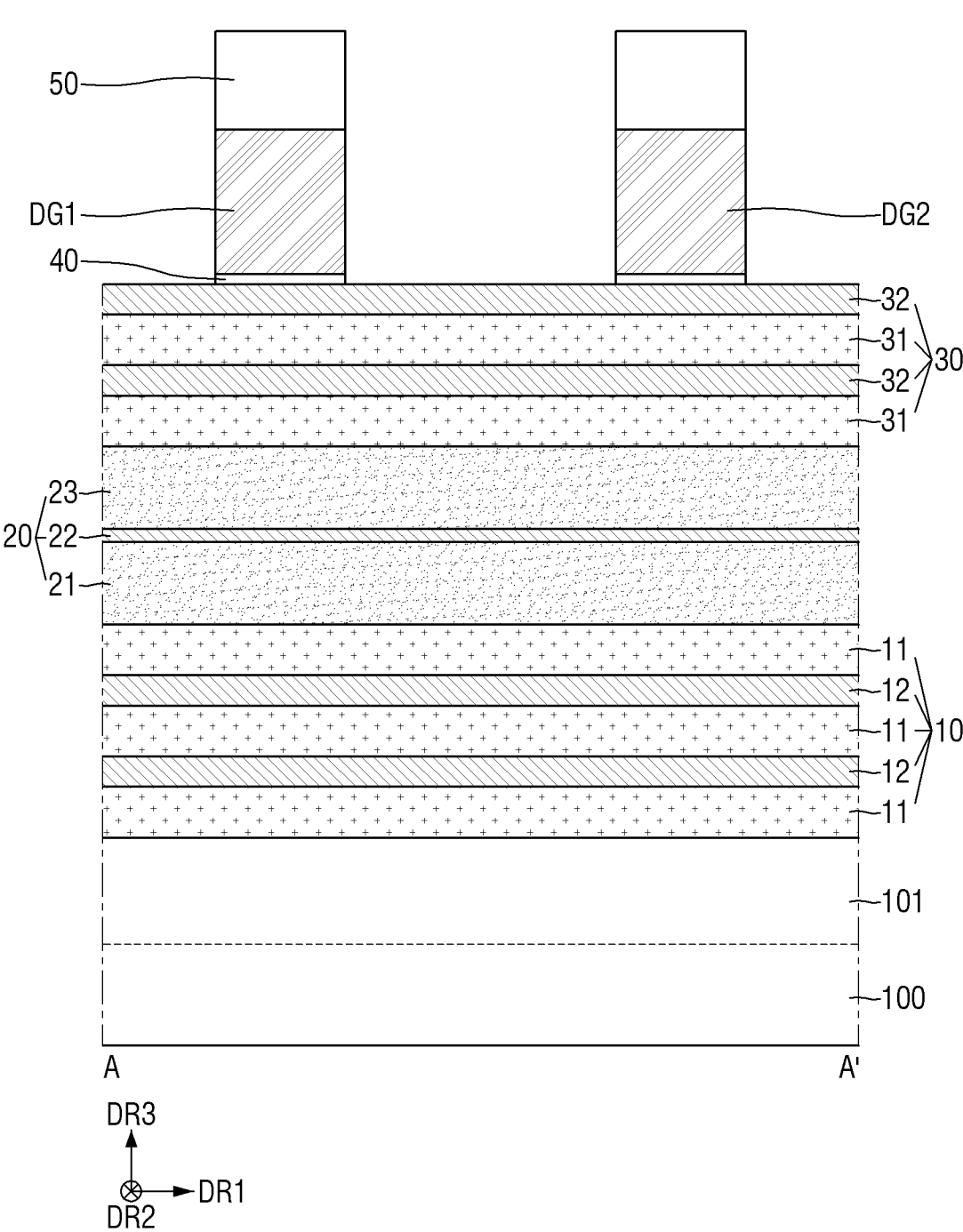
Figure 11:
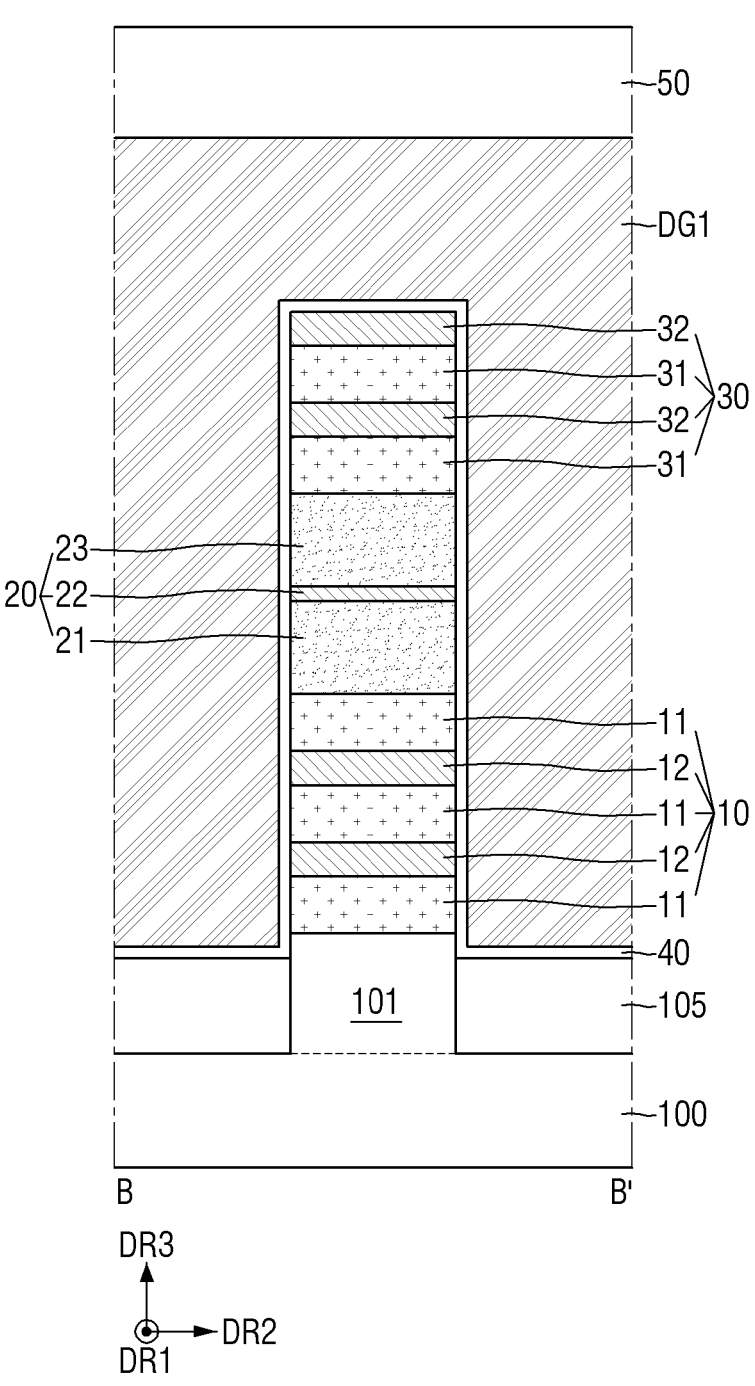
Figure 12:
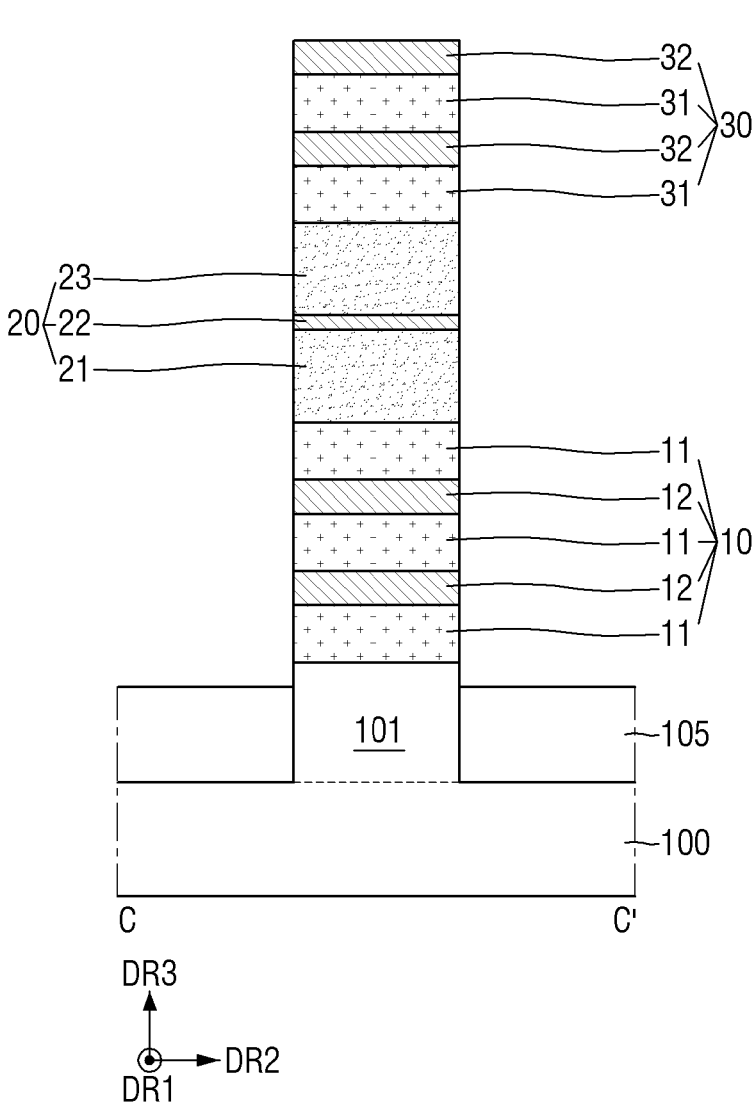

Referring to FIGS. 10 to 12, a pad oxide layer 40 may be formed to cover the field insulating layer 105 and the first to third stacked structures 10, 20, and 30. For example, the pad oxide layer 40 may be conformally formed. The pad oxide layer 40 may include or may be formed of, for example, silicon oxide ($SiO_2$).

First and second dummy gates DG1 and DG2 may be formed on the pad oxide layer 40 on the first to third stacked structures 10, 20, and 30. Each of the first and second dummy gates DG1 and DG2 may extend in the second horizontal direction DR2. The second dummy gate DG2 may be spaced apart from the first dummy gate DG1 in the first horizontal direction DR1. A dummy capping pattern 50 may be formed on each of the first and second dummy gates DG1 and DG2.

For example, the pad oxide layer 40 on a remaining portion except for a portion overlapping each of the first and second dummy gates DG1 and DG2 in the vertical direction DR3 may be removed.

Figure 13:
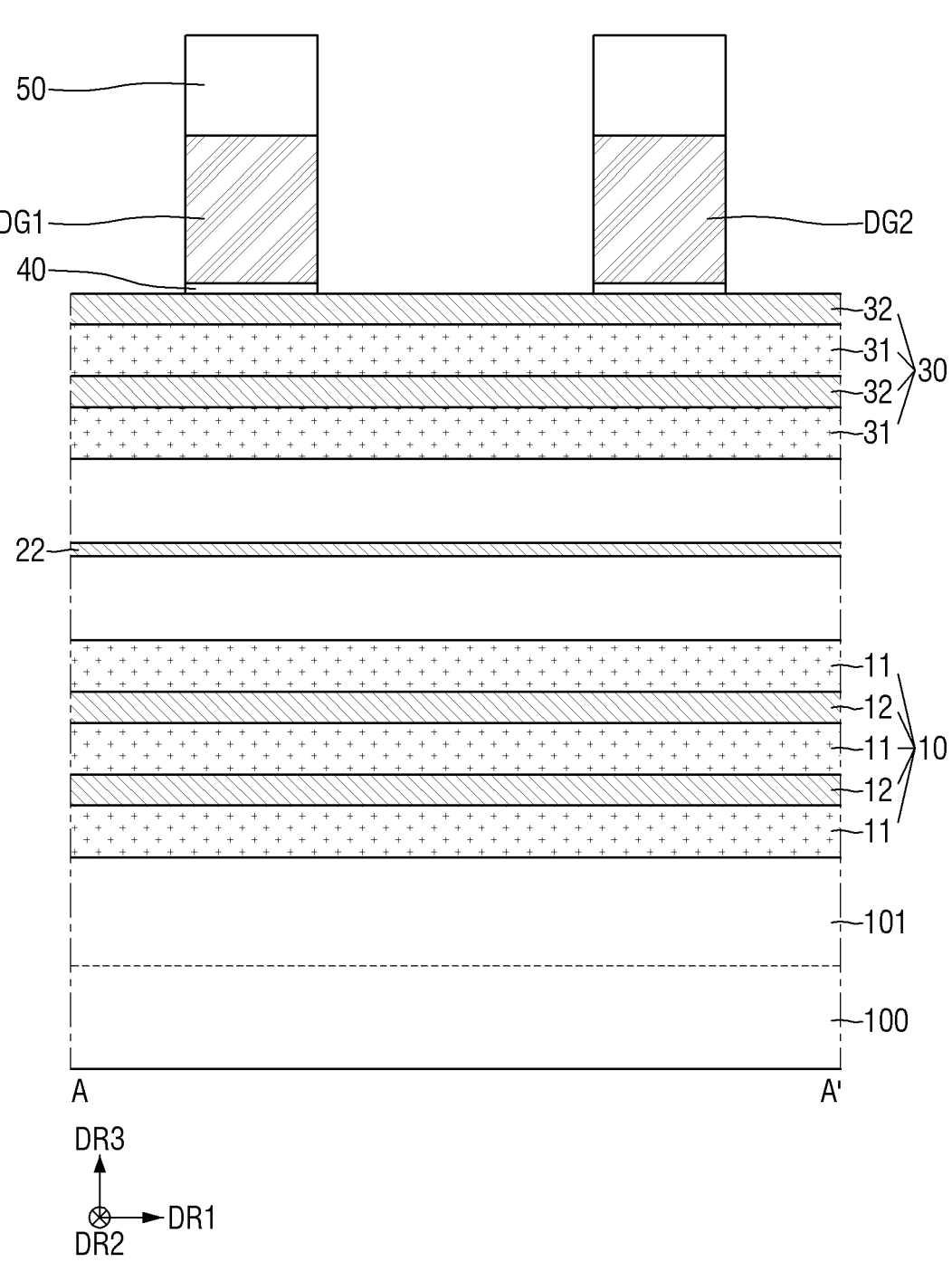
Figure 14:
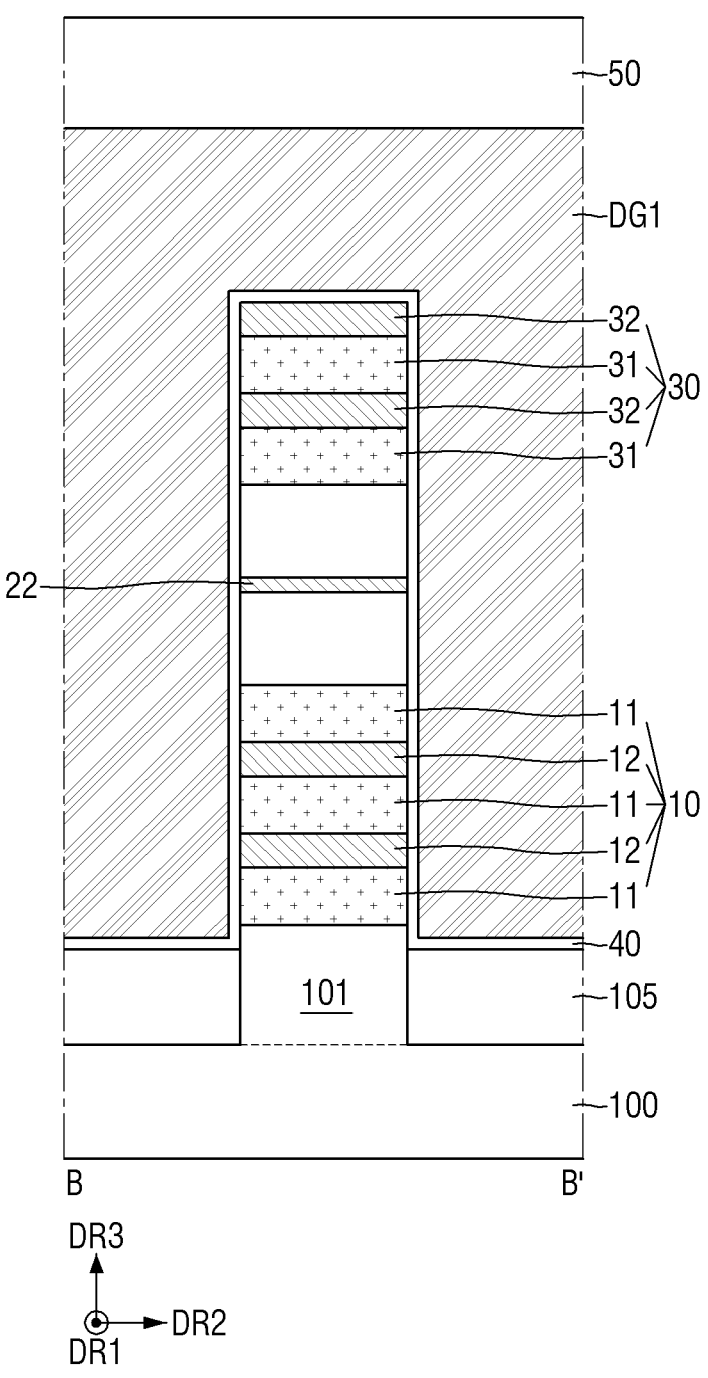
Figure 15:
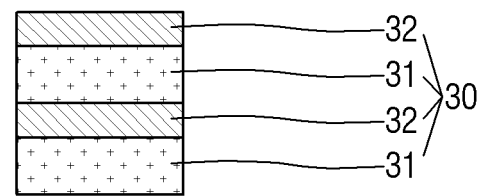
Figure 15:
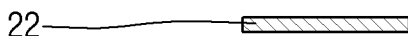
Figure 15:
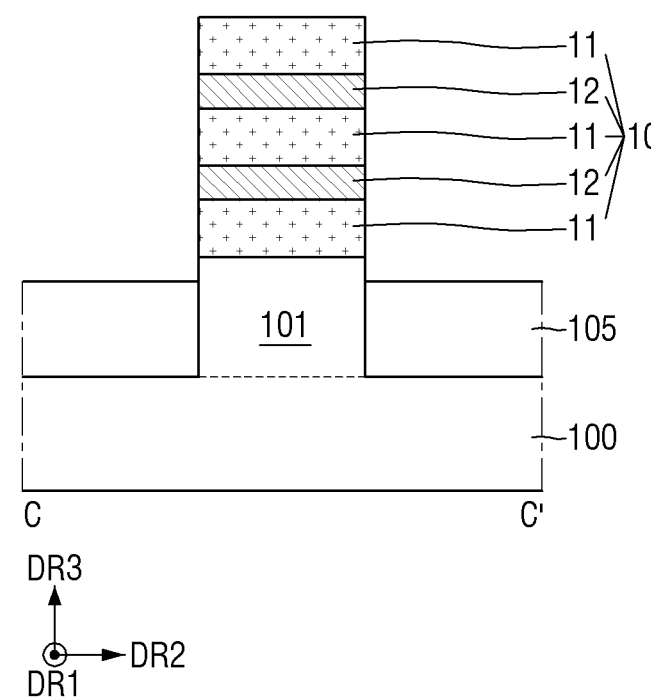

Referring to FIGS. 13 to 15, each of the second sacrificial layer 21 and the third sacrificial layer 23 may be removed. Each of the second sacrificial layer 21 and the third sacrificial layer 23 may be removed through a wet etching process.

Figure 16:
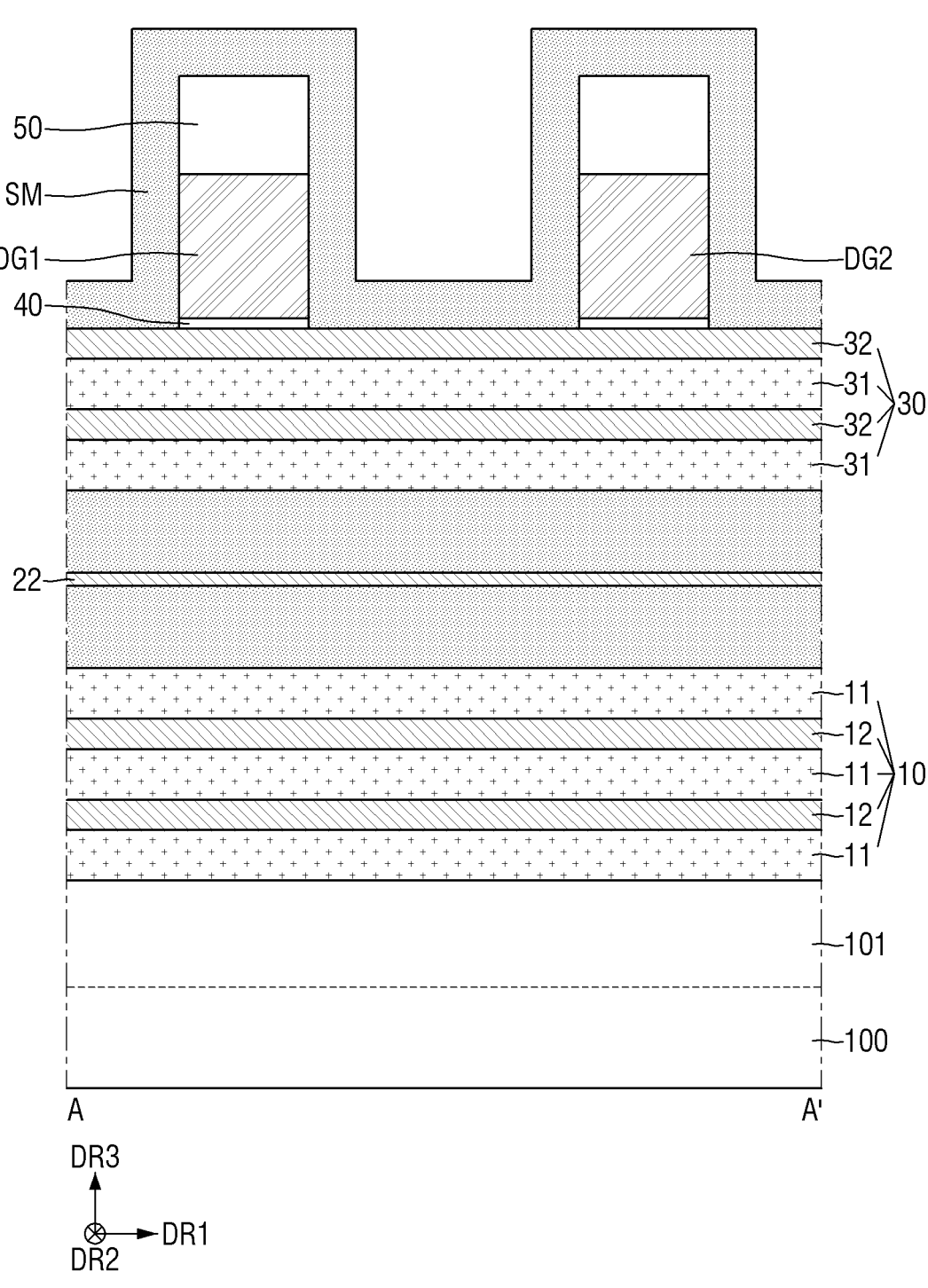
Figure 17:
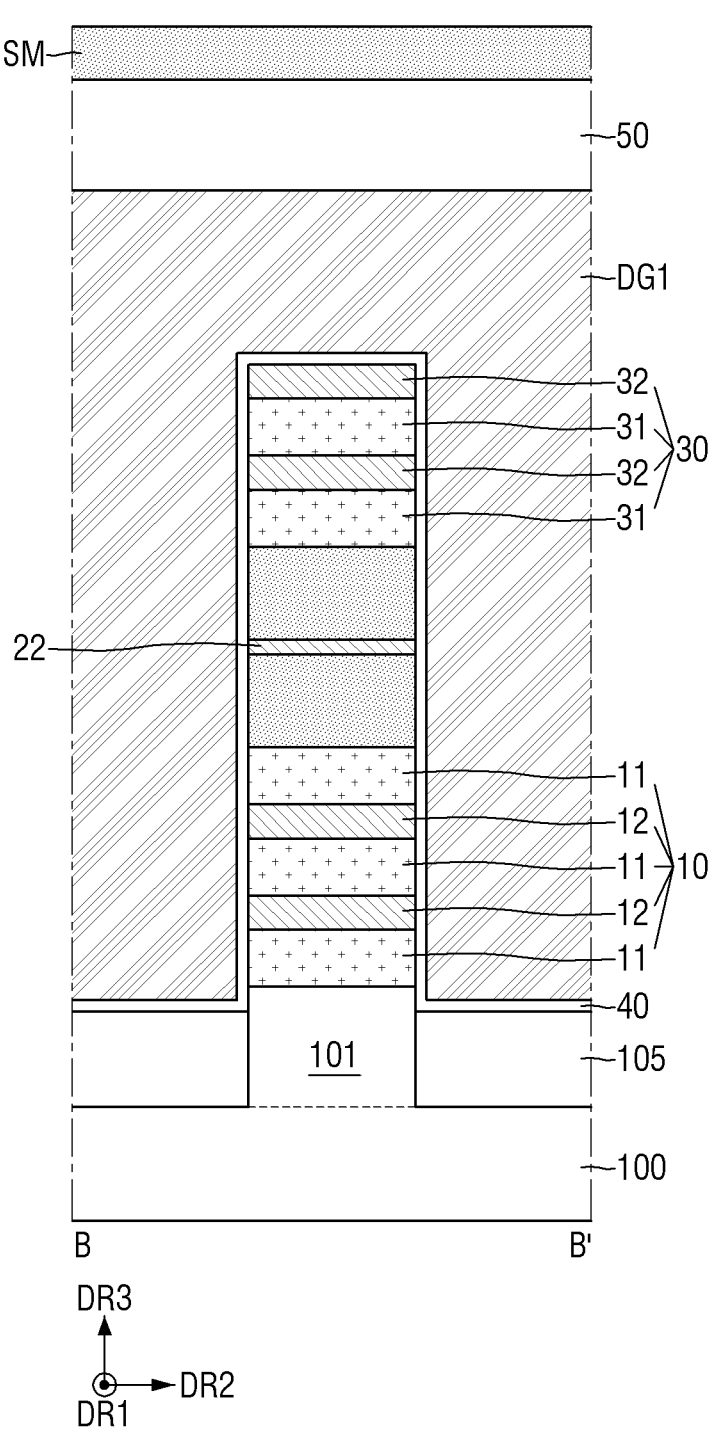
Figure 18:
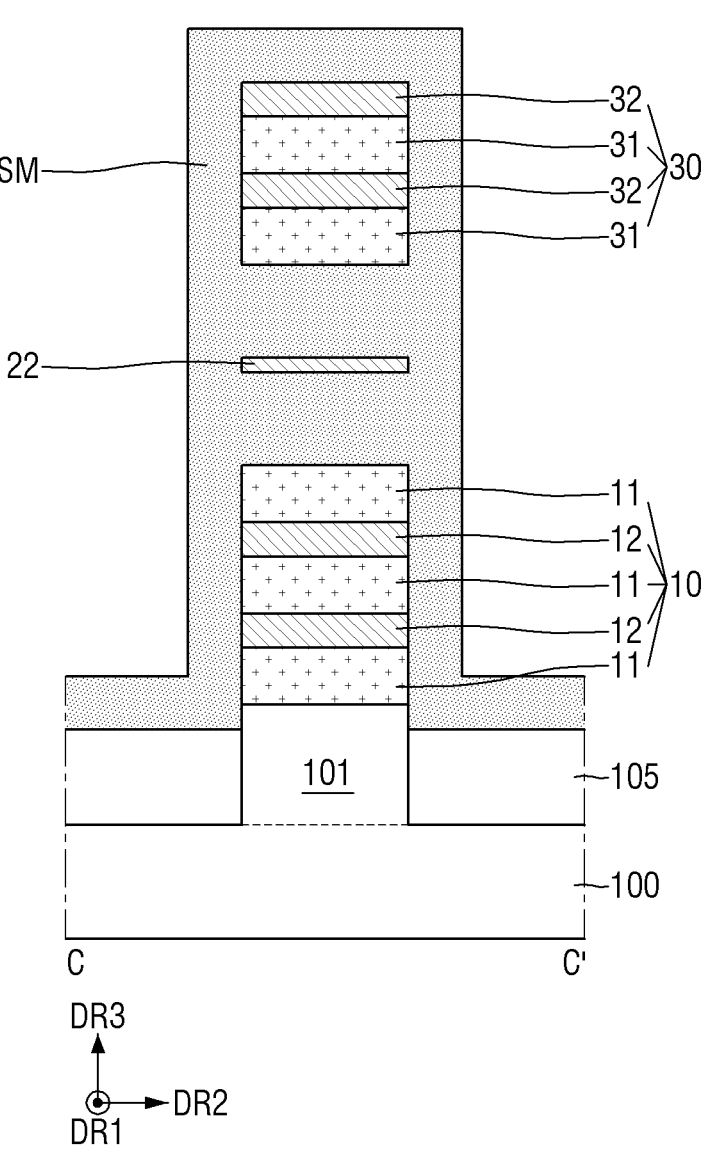

Referring to FIGS. 16 to 18, a spacer material layer SM may be formed to cover a sidewall of each of the first and second dummy gates DG1 and DG2, and a sidewall and an upper surface of the dummy capping pattern 50. The spacer material layer SM may also be formed on the exposed upper surface of the field insulating layer 105, the sidewall of the first stacked structure 10, and the sidewall and upper surface of the third stacked structure 30. The spacer material layer SM may fill a portion in which each of the second sacrificial layer (21 in FIGS. 10 to 12) and the third sacrificial layer (23 in FIGS. 10 to 12) is removed. For example, the spacer material layer SM may be conformally formed. The spacer material layer SM may include or may be formed of, for example, at least one of silicon nitride (SiN), silicon oxycarbonitride (SiOCN), silicon boron carbonitride (SiBCN), silicon carbonitride (SiCN), silicon oxynitride (SiON), and a combination thereof.

Figure 19:
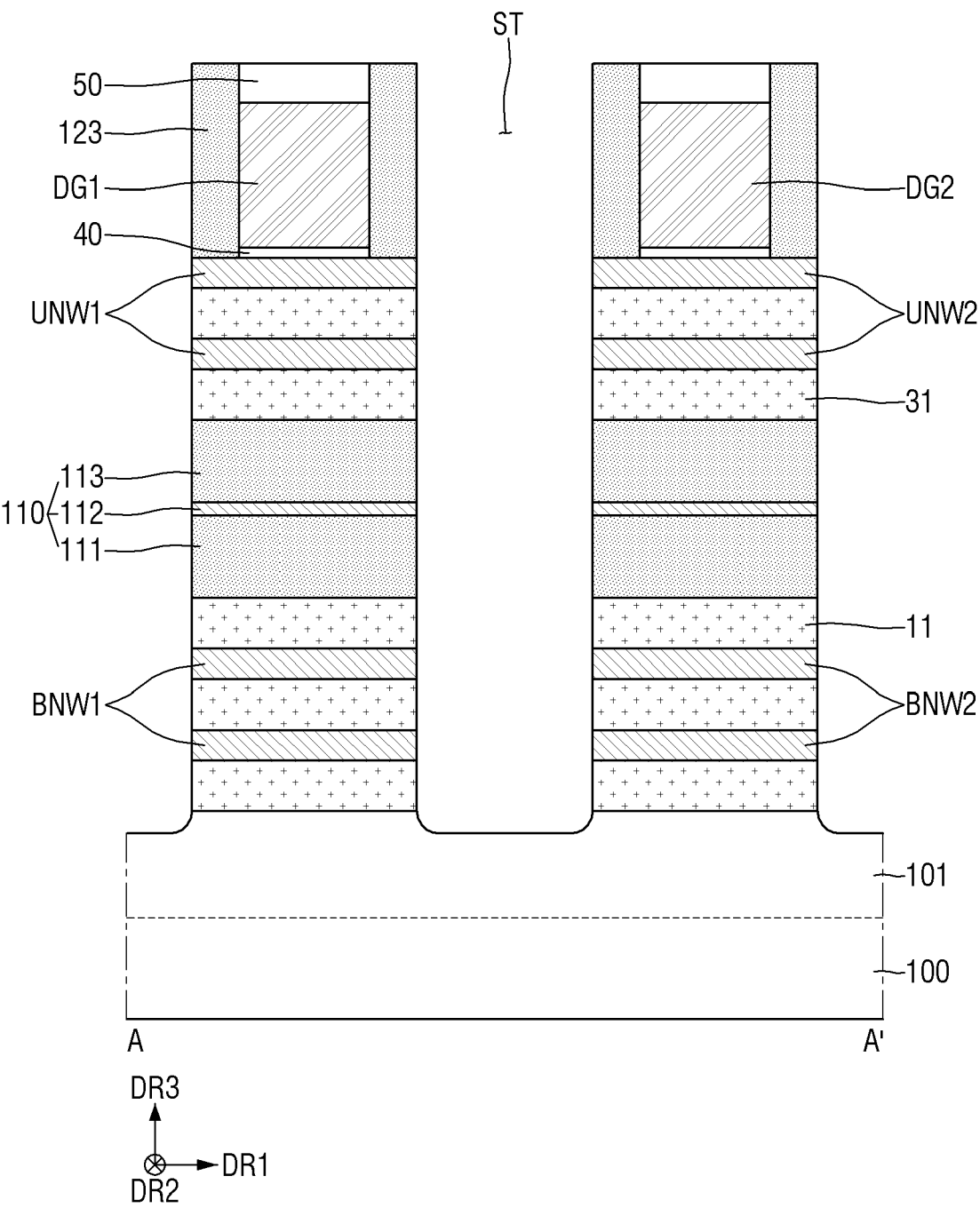
Figure 20:
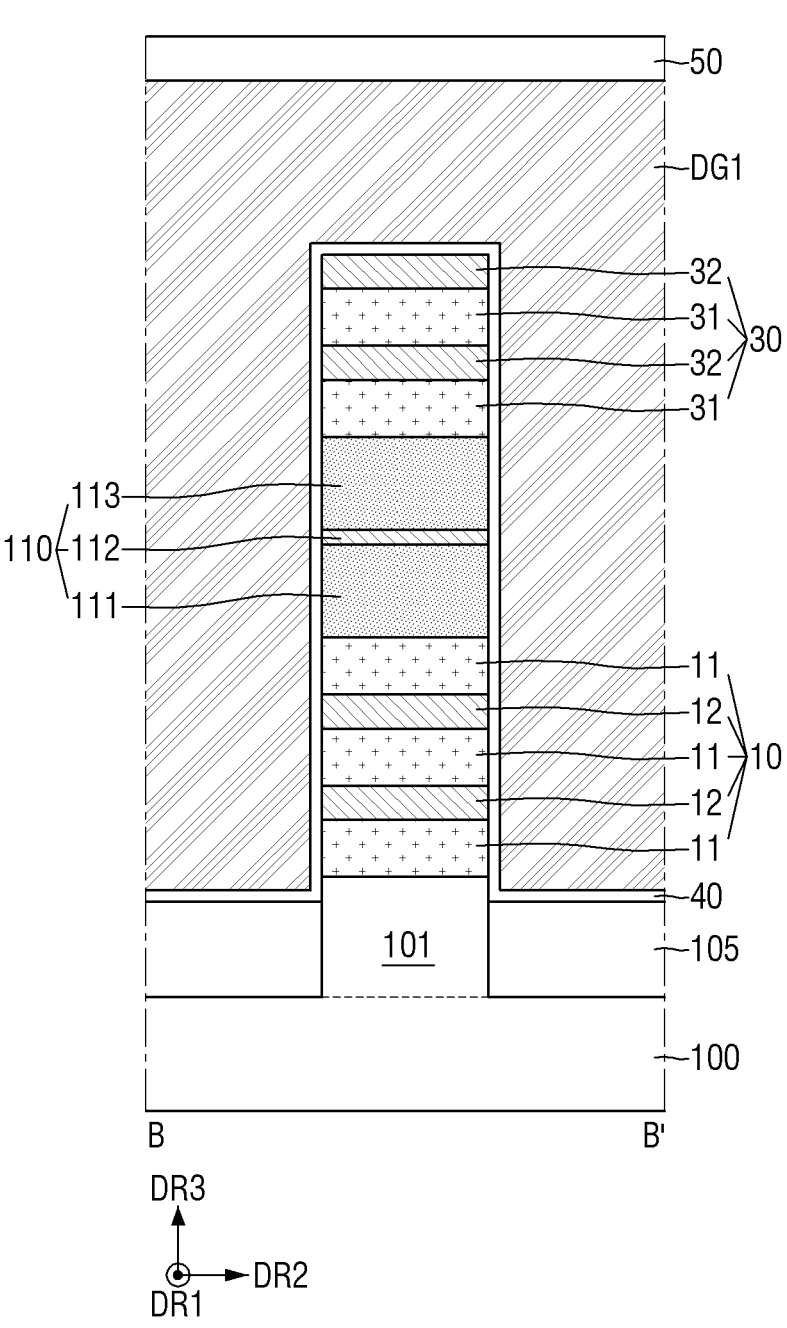
Figure 21:
Figure 21:
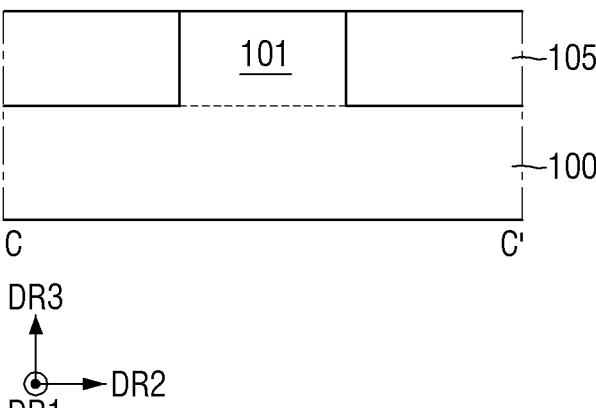

Referring to FIGS. 19 to 21, the first stacked structure 10, the third stacked structure 30, the second semiconductor layer 22, and the spacer material layer (SM in FIGS. 16 to 18) between the first stacked structure 10 and the third stacked structure 30 may be etched using the dummy capping pattern 50 and the first and second dummy gates DG1 and DG2 as etch masks to form a source/drain trench ST. For example, the source/drain trench ST may extend into the active pattern 101, and the source/drain trench ST may be formed between the first dummy gate DG1 and the second dummy gate DG2 on the active pattern 101.

During a time when the source/drain trenches ST are formed, the spacer material layer (SM in FIGS. 16 to 18) formed on the upper surface of the dummy capping pattern 50 and a portion of the dummy capping pattern 50 may be removed. The spacer material layer (SM in FIGS. 16 to 18) remaining on the sidewall of each of the first and second dummy gates DG1 and DG2 and the remaining dummy capping pattern 50 may be defined as a gate spacer 123.

After the source/drain trench ST is formed, the first semiconductor layer (12 in FIGS. 16 to 18) and the third semiconductor layer (32 in FIGS. 16 to 18) remaining on a lower side of the first dummy gate DG1 may be defined as a plurality of first lower nanosheets BNW1 and a plurality of first upper nanosheets UNW1. The first semiconductor layer (12 in FIGS. 16 to 18) and the third semiconductor layer (32 in FIGS. 16 to 18) remaining on a lower side of the second dummy gate DG2 may be defined as a plurality of second lower nanosheets BNW2 and a plurality of second upper nanosheets UNW2.

The second semiconductor layer (22 in FIGS. 16 to 18) may be defined as a second layer 112, the spacer material layer (SM in FIGS. 16 to 18) formed on a lower side of the second layer 112 may be defined as a first layer 111, and the spacer material layer (SM in FIGS. 16 to 18) formed on an upper side of the second layer 112 may be defined as a third layer 113. A separation structure 110 including the third layers 111, 112, and 113 may be formed between the plurality of first lower nanosheets BNW1 and the plurality of first upper nanosheets UNW1 and between the plurality of second lower nanosheets BNW2 and the plurality of second upper nanosheets UNW2.

Figure 22:
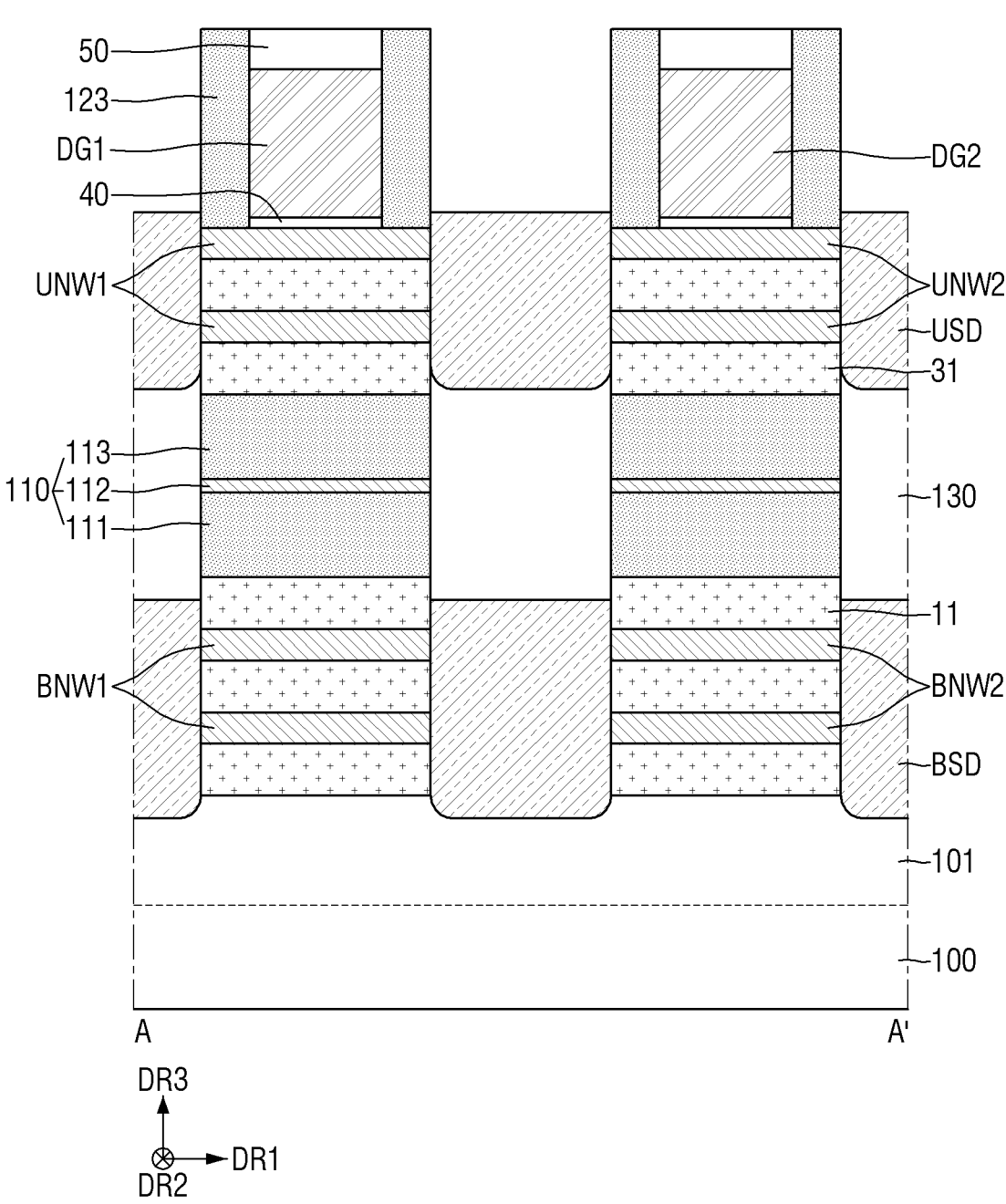
Figure 23:
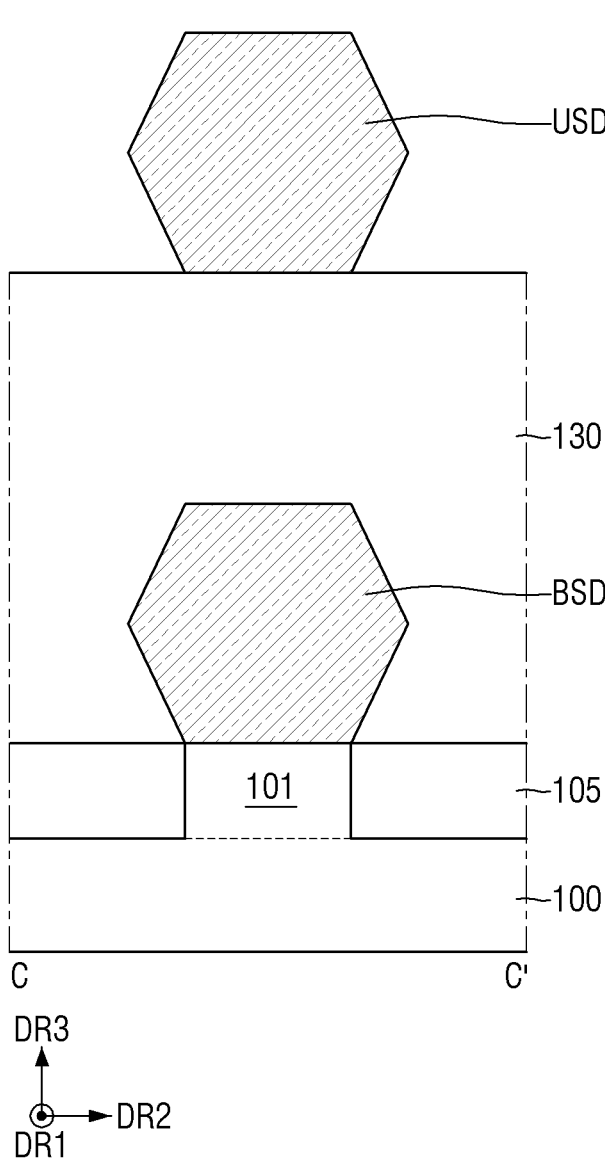

Referring to FIGS. 22 and 23, a lower source/drain region BSD, a first interlayer insulating layer 130, and an upper source/drain region USD may be sequentially formed in the source/drain trench (ST in FIG. 19).

For example, in the source/drain trench (ST in FIG. 19), the lower source/drain region BSD may be formed on a sidewall of each of the plurality of first and second lower nanosheets BNW1 and BNW2. For example, the upper surface of the lower source/drain region BSD may be formed to be lower than a lower surface of the separation structure 110.

Subsequently, the first interlayer insulating layer 130 may be formed to cover the lower source/drain region BSD. Subsequently, a portion of the first interlayer insulating layer 130 may be etched to expose the sidewall of each of the plurality of first and second upper nanosheets UNW1 and UNW2. Subsequently, in the source/drain trench (ST in FIG. 19), the upper source/drain region USD may be formed on a sidewall of each of the plurality of first and second upper nanosheets UNW1 and UNW2.

Figure 24:
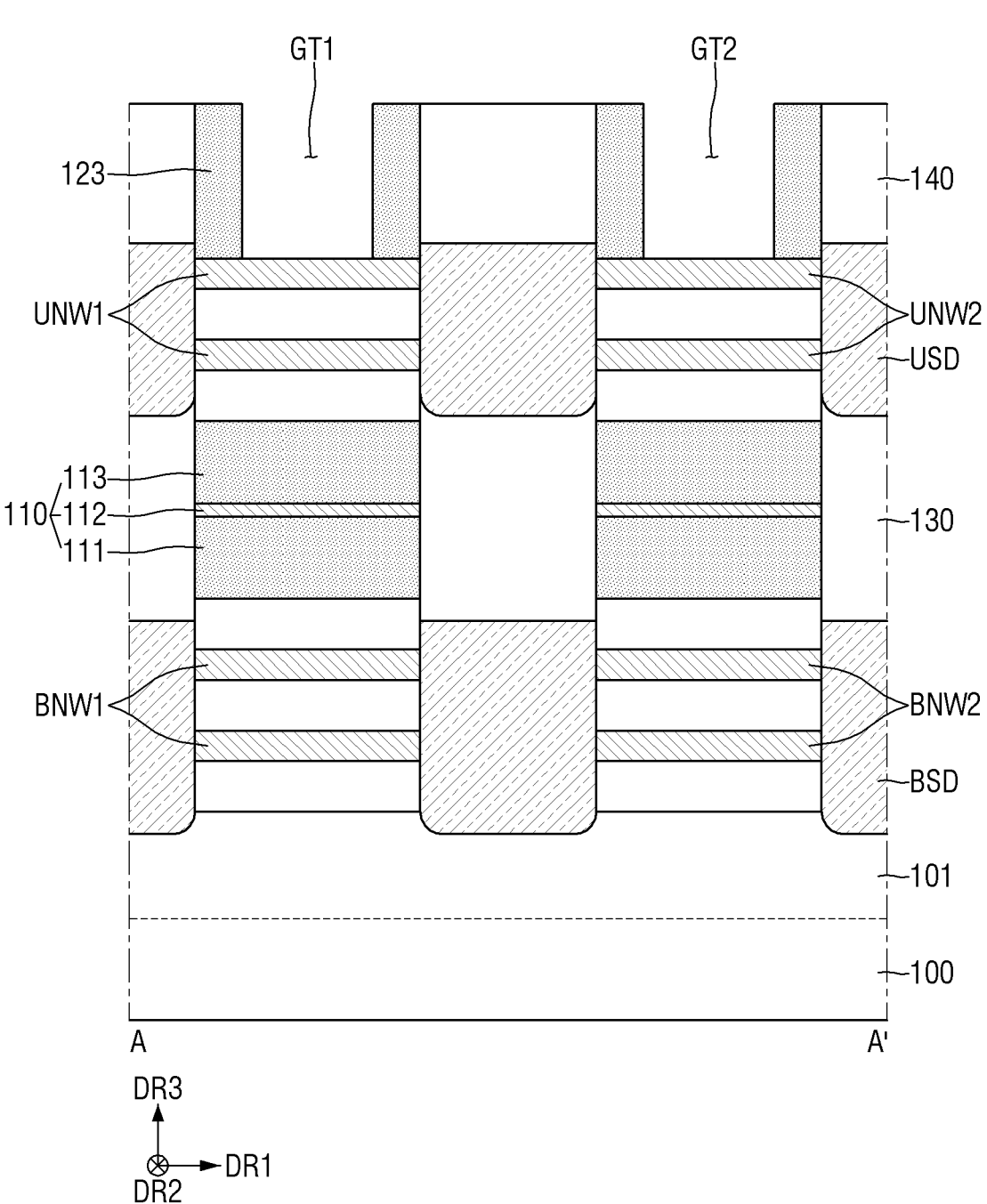
Figure 25:
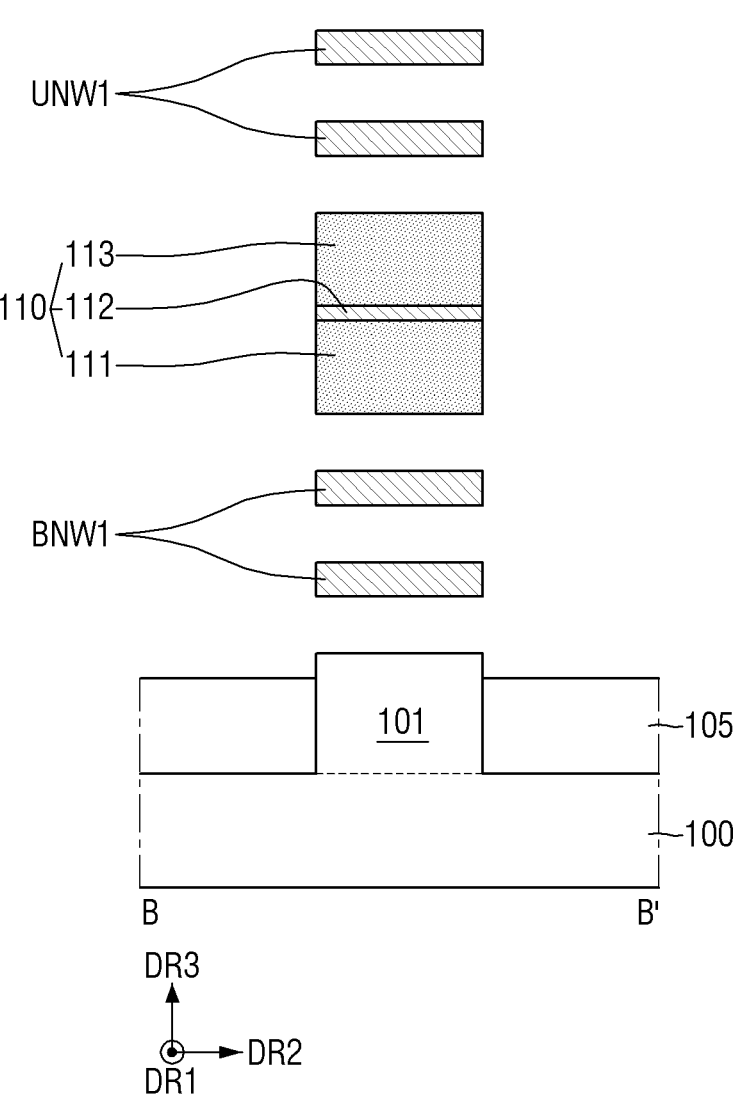
Figure 26:
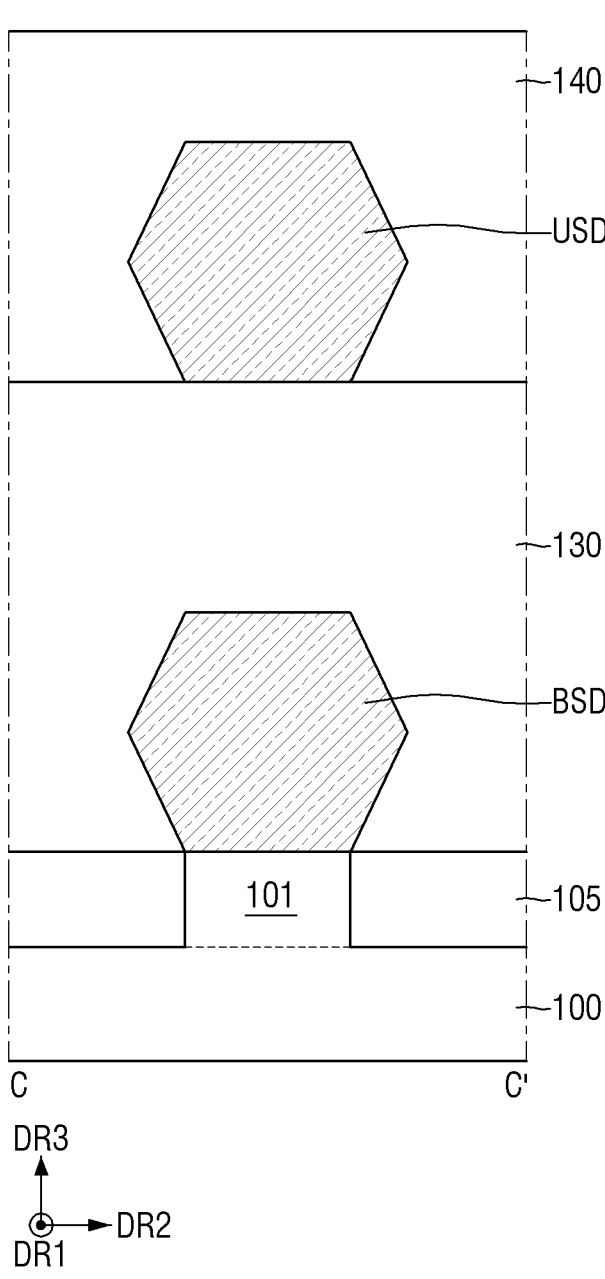

Referring to FIGS. 24 to 26, a second interlayer insulating layer 140 may be formed to cover each of the upper source/drain region USD, the gate spacer 123, and the dummy capping pattern (50 in FIG. 22). Subsequently, an upper surface of each of the first and second dummy gates (DG1 and DG2 in FIG. 22) may be exposed through a planarization process. Subsequently, each of the first and second dummy gates (DG1 and DG2 in FIG. 22), the first sacrificial layer (11 in FIG. 22), and the fourth sacrificial layer (31 of FIG. 22) may be removed. A portion from which the first dummy gate (DG1 in FIG. 22) is removed may be defined as a first gate trench GT1, and a portion from which the second dummy gate (DG2 in FIG. 22) is removed may be defined as a second gate trench GT2.

Figure 27:
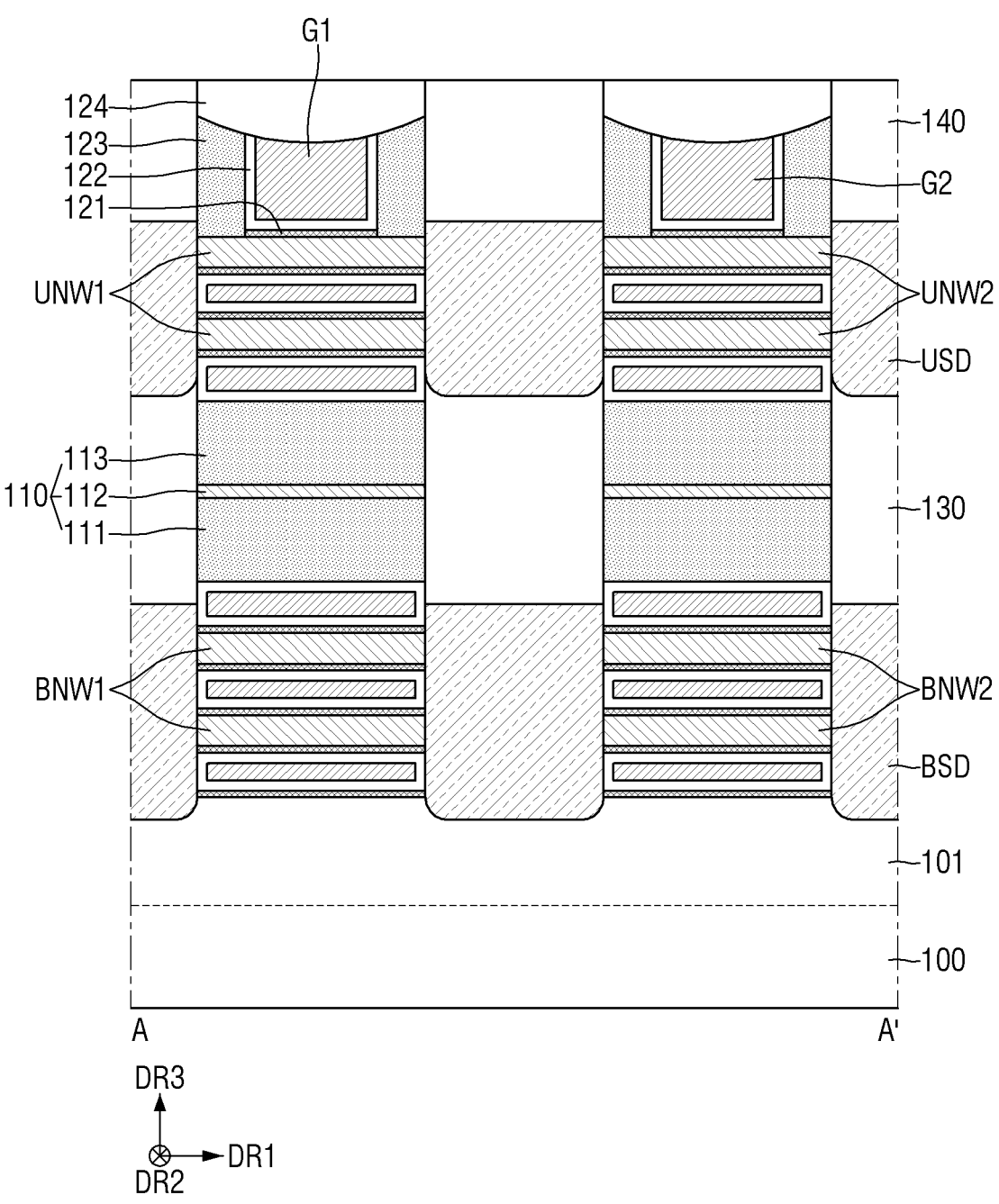
Figure 28:
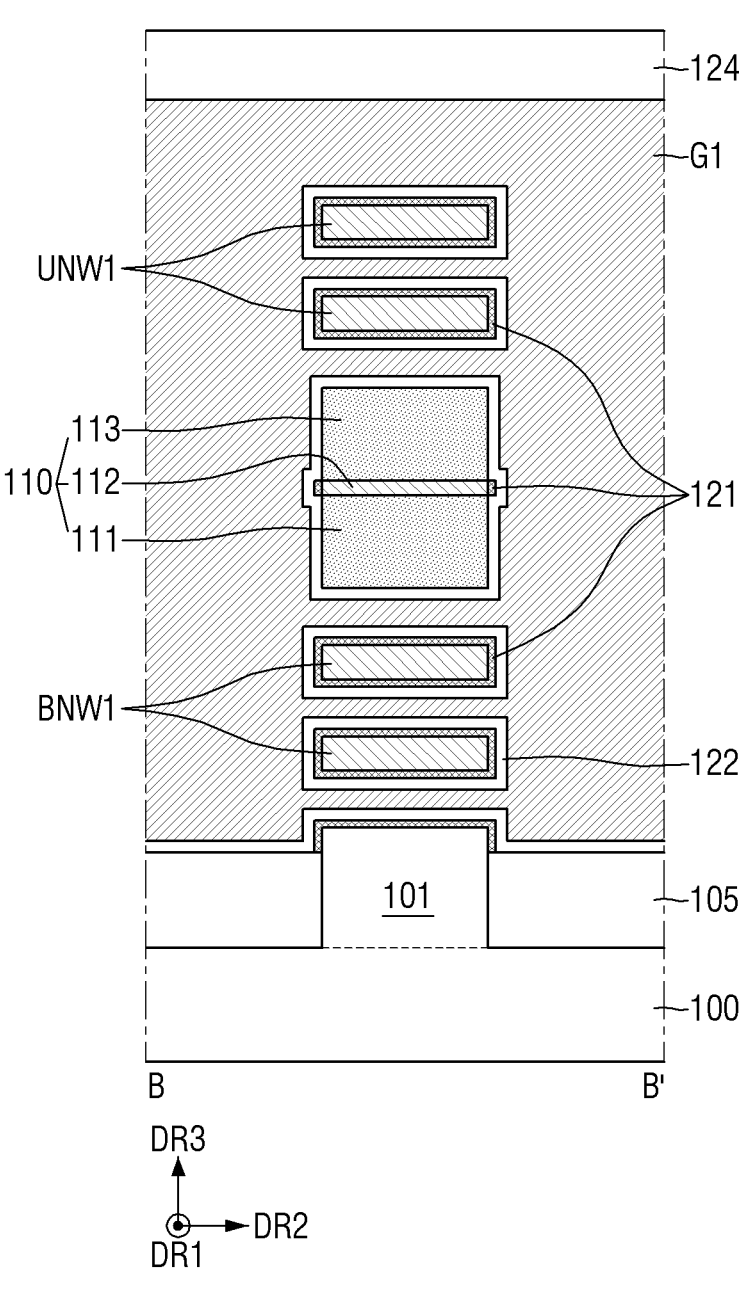

Referring to FIGS. 27 and 28, in a portion in which each of the first and second dummy gates (DG1 and DG2 in FIG. 22), the first sacrificial layer (11 in FIG. 22), and the fourth sacrificial layer (31 in FIG. 22) is removed, an interface layer 121 and a gate insulating layer 122 may be sequentially formed.

Subsequently, in an interior of the first gate trench GT1 and a region overlapping the first gate trench GT1 in the vertical direction DR3, a first gate electrode G1 surrounding each of the plurality of first lower nanosheets BNW1 and each of the plurality of first upper nanosheets UNW1 may be formed. In an interior of the second gate trench GT2 and a region overlapping the second gate trench GT2 in the vertical direction DR3, a second gate electrode G2 surrounding each of the plurality of second lower nanosheets BNW2 and each of the plurality of second upper nanosheets UNW2 may be formed. Subsequently, a capping pattern 124 may be formed on each of the first and second gate electrodes G1 and G2.

Referring to FIGS. 2 to 5, the source/drain contact CA penetrating through the second interlayer insulating layer 140 in the vertical direction DR3 to be connected to the upper source/drain region USD may be formed. The silicide layer 150 may be formed between the upper source/drain region USD and the source/drain contact CA. A first gate contact CB1 penetrating the capping pattern 124 in the vertical direction DR3 to be connected to the first gate electrode G1 may be formed, and a second gate contact CB2 penetrating the capping pattern 124 in the vertical direction DR3 to be connected to the second gate electrode G2 may be formed.

Subsequently, an etching stop layer 160 and a third interlayer insulating layer 170 may be sequentially formed on each of the second interlayer insulating layer 140, the capping pattern 124, the source/drain contact CA, and the first and second gate contacts CB1 and CB2. Subsequently, each of a first via V1, a second via V2, and a third via V3 penetrating through the third interlayer insulating layer 170 and the etching stop layer 160 in the vertical direction DR3 to be connected to each of the first gate contact CB1, the second gate contact CB2, and the source/drain contact CA may be formed. Through the manufacturing process as described above, the semiconductor device illustrated in FIGS. 2 to 5 may be manufactured.

Hereinafter, a semiconductor device according to some embodiments of the present disclosure will be described with reference to FIGS. 29 to 31. Differences from the semiconductor device illustrated in FIGS. 1 to 5 will be mainly described.

Figure 29:
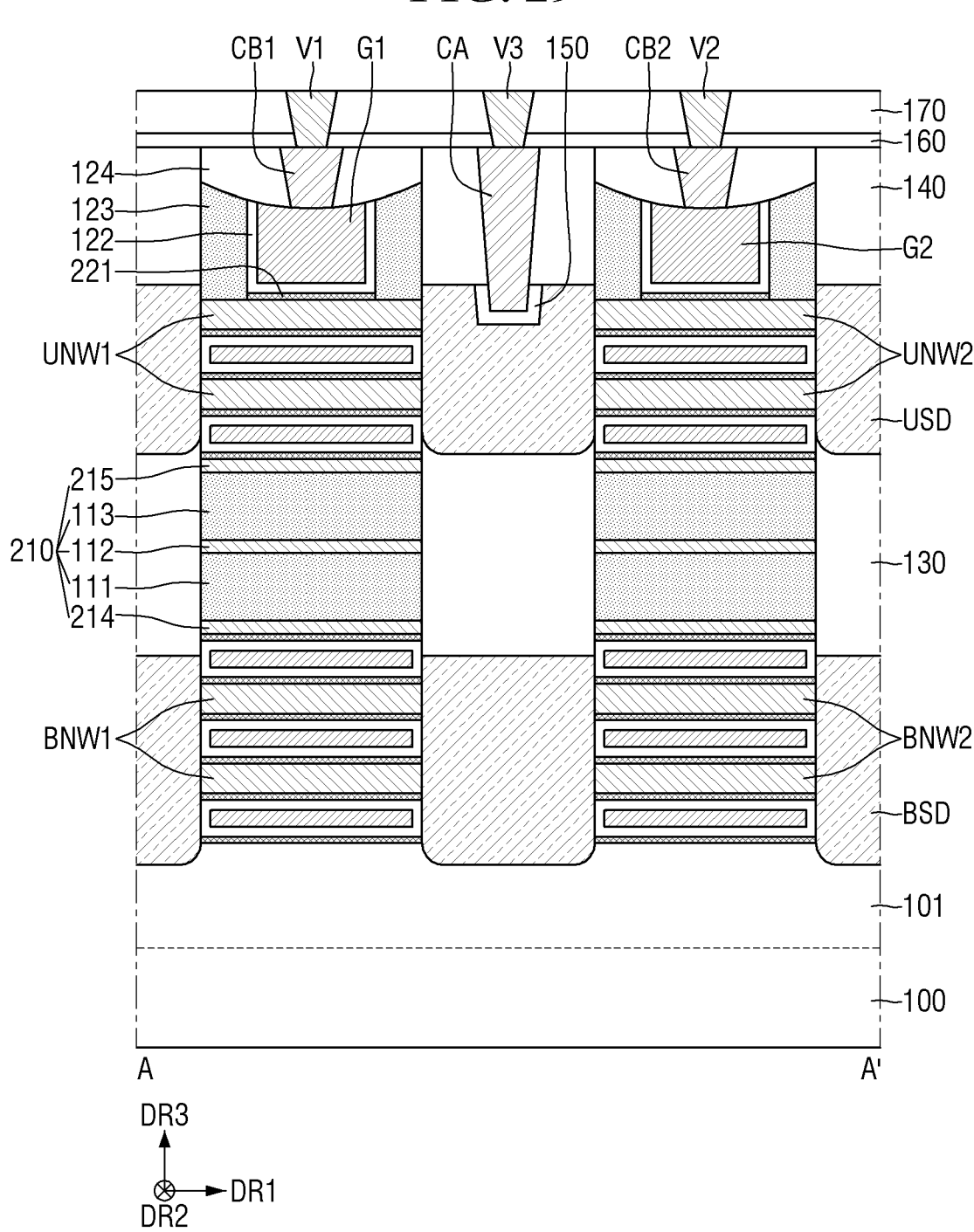
FIGS. 29 and 30 are cross-sectional views for describing a semiconductor device according to some embodiments.
Figure 30:
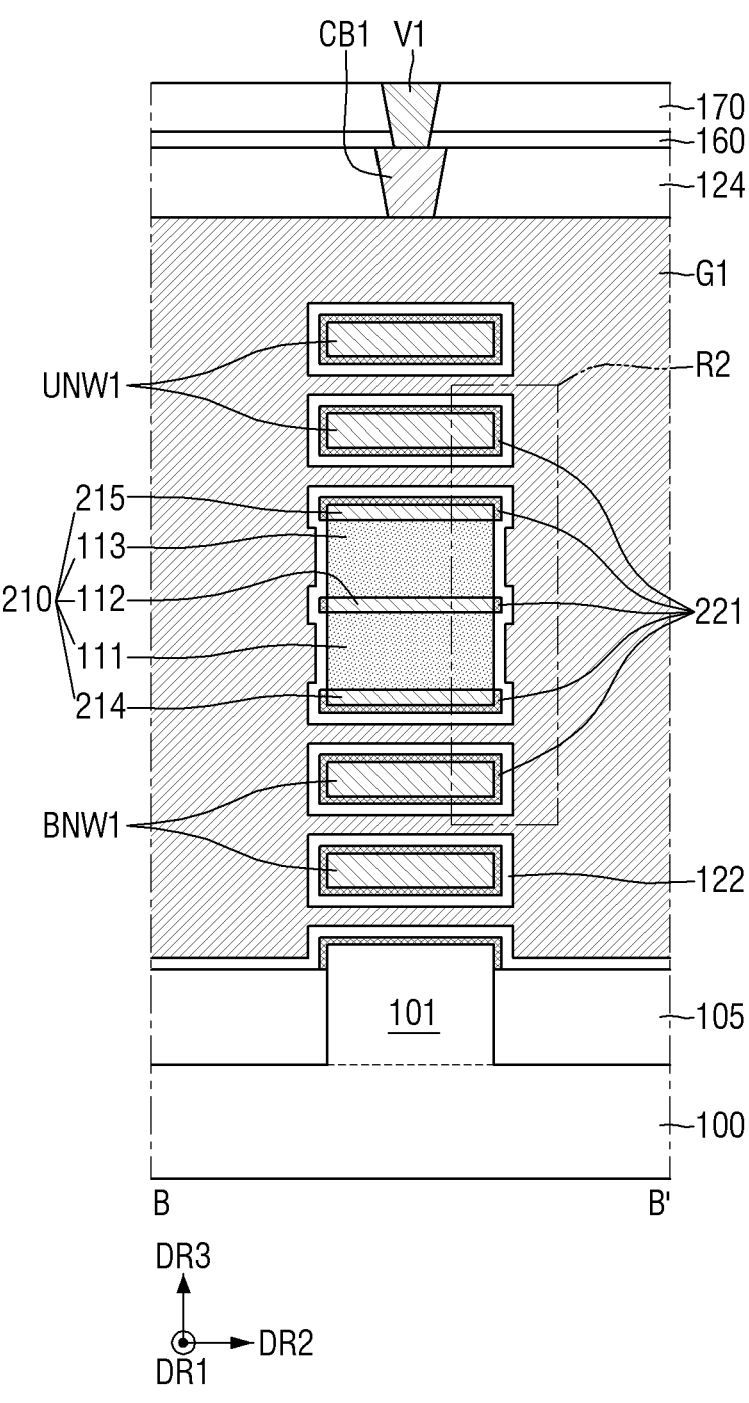

FIGS. 29 and 30 are cross-sectional views for describing a semiconductor device according to some embodiments. FIG. 31 is an enlarged view of area R2 of FIG. 30.

Figure 31:
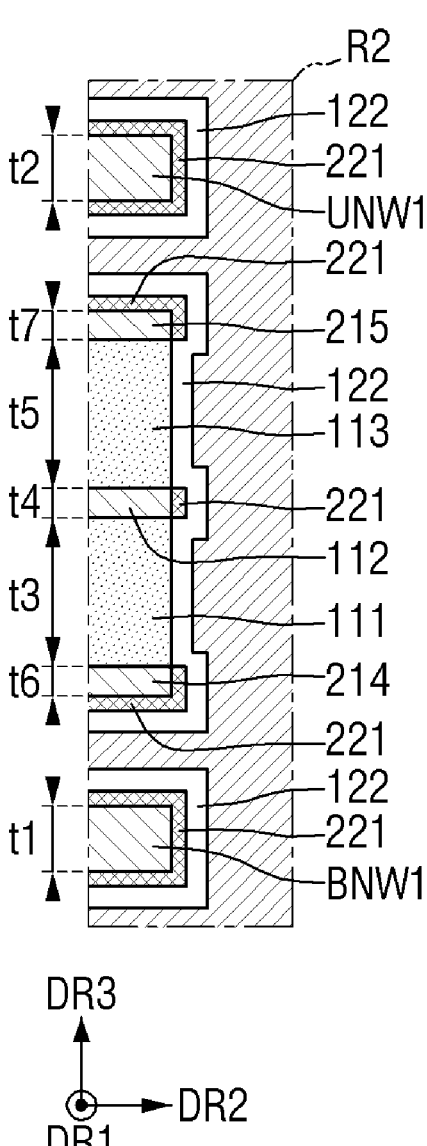
FIG. 31 is an enlarged view of area R2 of FIG. 30.

Referring to FIGS. 29 to 31, in a semiconductor device according to some embodiments of the present disclosure, a separation structure 210 may include first to fifth layers 111, 112, 113, 214, and 215.

For example, the separation structure 210 may include a fourth layer 214, a first layer 111, a second layer 112, a third layer 113, and a fifth layer 215 sequentially stacked. The fourth layer 214 may be disposed between the plurality of first lower nanosheets BNW1 and the first layer 111 and between the plurality of second lower nanosheets BNW2 and the first layer 111. The fourth layer 214 may be in contact with the first layer 111. The fifth layer 215 may be disposed between the third layer 113 and the plurality of first upper nanosheets UNW1 and between the third layer 113 and the plurality of second upper nanosheets UNW2. The fifth layer 215 may be in contact with the third layer 113.

For example, each of the fourth layer 214 and the fifth layer 215 may include or may be formed of the same material as the second layer 112. For example, each of the fourth layer 214 and the fifth layer 215 may include or may be formed of the same material as the plurality of first and second lower nanosheets BNW1 and BNW2 and the plurality of first and second upper nanosheets UNW1 and UNW2. For example, each of the fourth layer 214 and the fifth layer 215 may include or may be formed of silicon (Si).

For example, each of a thickness t6 of the fourth layer 214 in the vertical direction DR3 and a thickness t7 of the fifth layer 215 in the vertical direction DR3 may be the same as a thickness t4 of the second layer 112 in the vertical direction DR3. For example, each of the thickness t6 of the fourth layer 214 in the vertical direction DR3 and the thickness t7 of the fifth layer 215 in the vertical direction DR3 may be smaller than each of a thickness t3 of the first layer 111 in the vertical direction DR3 and the thickness t5 of the third layer 113 in the vertical direction DR3. For example, each of the thickness t6 of the fourth layer 214 in the vertical direction DR3 and the thickness t7 of the fifth layer 215 in the vertical direction DR3 may be smaller than each of a thickness t1 of any one of the plurality of first lower nanosheets BNW1 in the vertical direction DR3 and a thickness t2 of any one of the plurality of first upper nanosheets UNW1 in the vertical direction DR3.

An interface layer 221 may be disposed between the uppermost surface of the separation structure 210 and the gate insulating layer 122. That is, the interface layer 221 may be disposed between an upper surface and a sidewall of the fifth layer 215 and the gate insulating layer 122. The interface layer 221 may be in contact with the upper surface and the sidewall of the fifth layer 215. The interface layer 221 may be disposed between the lowermost surface of the separation structure 210 and the gate insulating layer 122. That is, the interface layer 221 may be disposed between a lower surface and a sidewall of the fourth layer 214 and the gate insulating layer 122. The interface layer 221 may be in contact with the lower surface and the sidewall of the fourth layer 214. The interface layer 221 may be disposed between a sidewall of the second layer 112 and the gate insulating layer 122. The interface layer 221 may be in contact with the sidewall of the second layer 112.

Hereinafter, a semiconductor device according to some embodiments of the present disclosure will be described with reference to FIGS. 32 to 34. Differences from the semiconductor device illustrated in FIGS. 1 to 5 will be mainly described.

Figure 32:
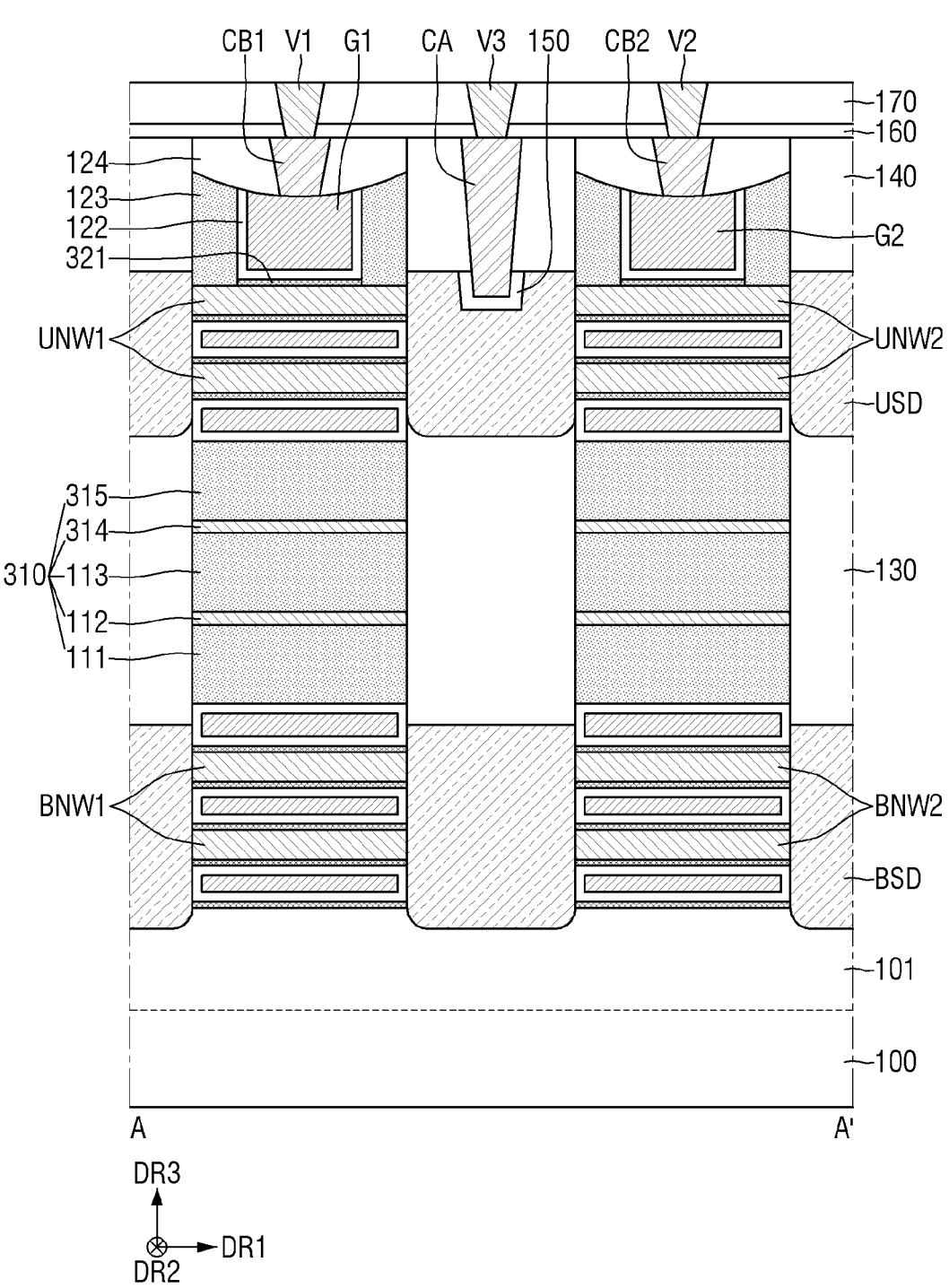
FIGS. 32 and 33 are cross-sectional views for describing a semiconductor device according to some embodiments.
Figure 33:
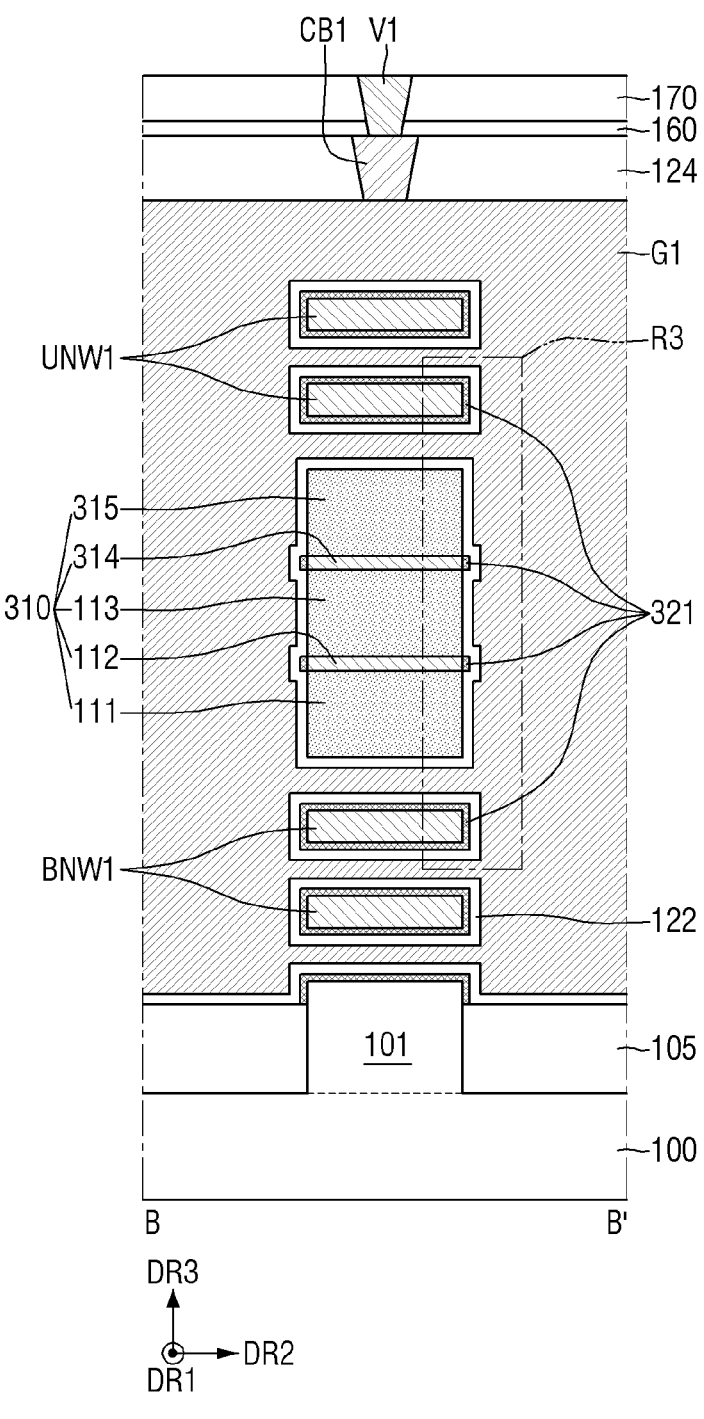

FIGS. 32 and 33 are cross-sectional views for describing a semiconductor device according to some embodiments. FIG. 34 is an enlarged view of area R3 of FIG. 33.

Figure 34:
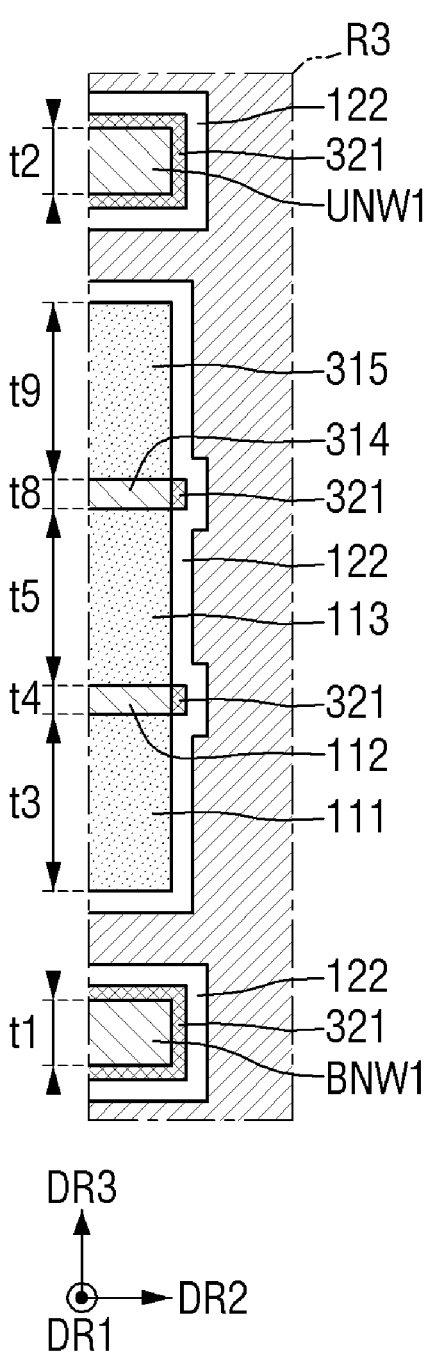
FIG. 34 is an enlarged view of area R3 of FIG. 33.

Referring to FIGS. 32 to 34, in a semiconductor device according to some embodiments of the present disclosure, a separation structure 310 may include first to fifth layers 111, 112, 113, 314, and 315.

For example, the separation structure 310 may include a first layer 111, a second layer 112, a third layer 113, a fourth layer 314, and a fifth layer 315 sequentially stacked. The fourth layer 314 may be disposed on the third layer 113. The fourth layer 314 may be in contact with the third layer 113.

The fifth layer 315 may be disposed on the fourth layer 314. The fifth layer 315 may be in contact with the fourth layer 314.

For example, the fourth layer 314 may include or may be formed of the same material as the second layer 112. For example, the fourth layer 314 may include or may be formed of the same material as the plurality of first and second lower nanosheets BNW1 and BNW2 and the plurality of first and second upper nanosheets UNW1 and UNW2. For example, the fourth layer 314 may include or may be formed of silicon (Si). The fifth layer 315 may include or may be formed of the same material as each of the first layer 111 and the third layer 113. For example, the fifth layer 315 may include or may be formed of at least one of silicon nitride (SiN), silicon oxycarbonitride (SiOCN), silicon boron carbonitride (SiBCN), silicon carbonitride (SiCN), silicon oxynitride (SiON), and a combination thereof.

For example, a thickness t8 of the fourth layer 314 in the vertical direction DR3 may be the same as the thickness t4 of the second layer 112 in the vertical direction DR3. A thickness t9 of the fifth layer 315 in the vertical direction DR3 may be the same as each of the thickness t3 of the first layer 111 in the vertical direction DR3 and the thickness t5 of the third layer 113 in the vertical direction DR3. For example, the thickness t8 of the fourth layer 314 in the vertical direction DR3 may be smaller than each of the thickness t3 of the first layer 111 in the vertical direction DR3, the thickness t5 of the third layer 113 in the vertical direction DR3, and the thickness t9 of the fifth layer 315 in the vertical direction DR3. For example, the thickness t9 of the fourth layer 314 in the vertical direction DR3 may be smaller than each of the thickness t1 of any one of the plurality of first lower nanosheets BNW1 in the vertical direction DR3 and the thickness t2 of any one of the plurality of first upper nanosheets UNW1 in the vertical direction DR3.

An interface layer 321 may be disposed between the sidewall of the second layer 112 and the gate insulating layer 122. The interface layer 321 may be in contact with the sidewall of the second layer 112. The interface layer 321 may be disposed between a sidewall of the fourth layer 314 and the gate insulating layer 122. The interface layer 321 may be in contact with the sidewall of the fourth layer 314.

Hereinafter, a semiconductor device according to some embodiments of the present disclosure will be described with reference to FIGS. 35 to 37. Differences from the semiconductor device illustrated in FIGS. 1 to 5 will be mainly described.

Figure 35:
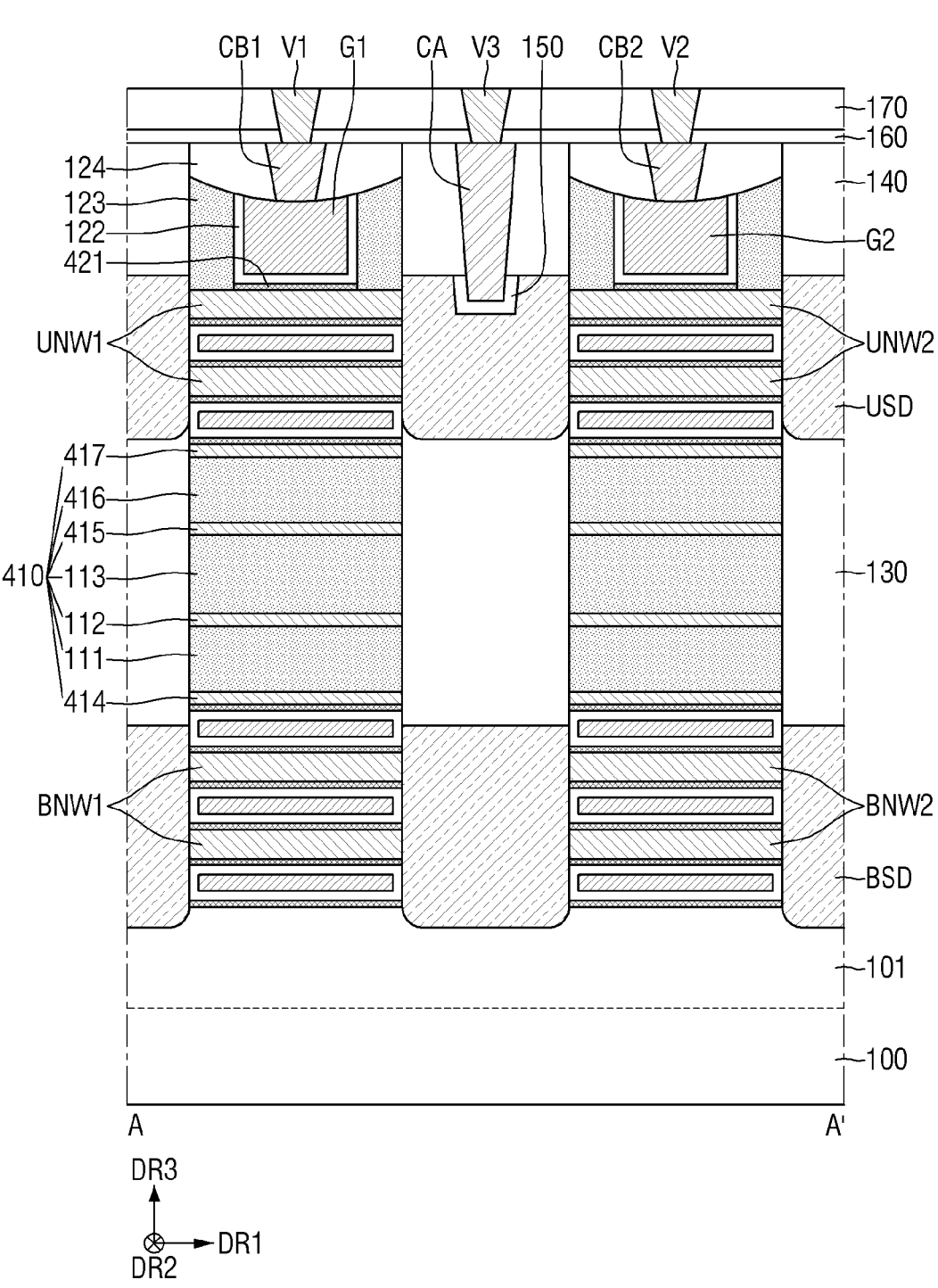
FIGS. 35 and 36 are cross-sectional views for describing a semiconductor device according to some embodiments.
Figure 36:
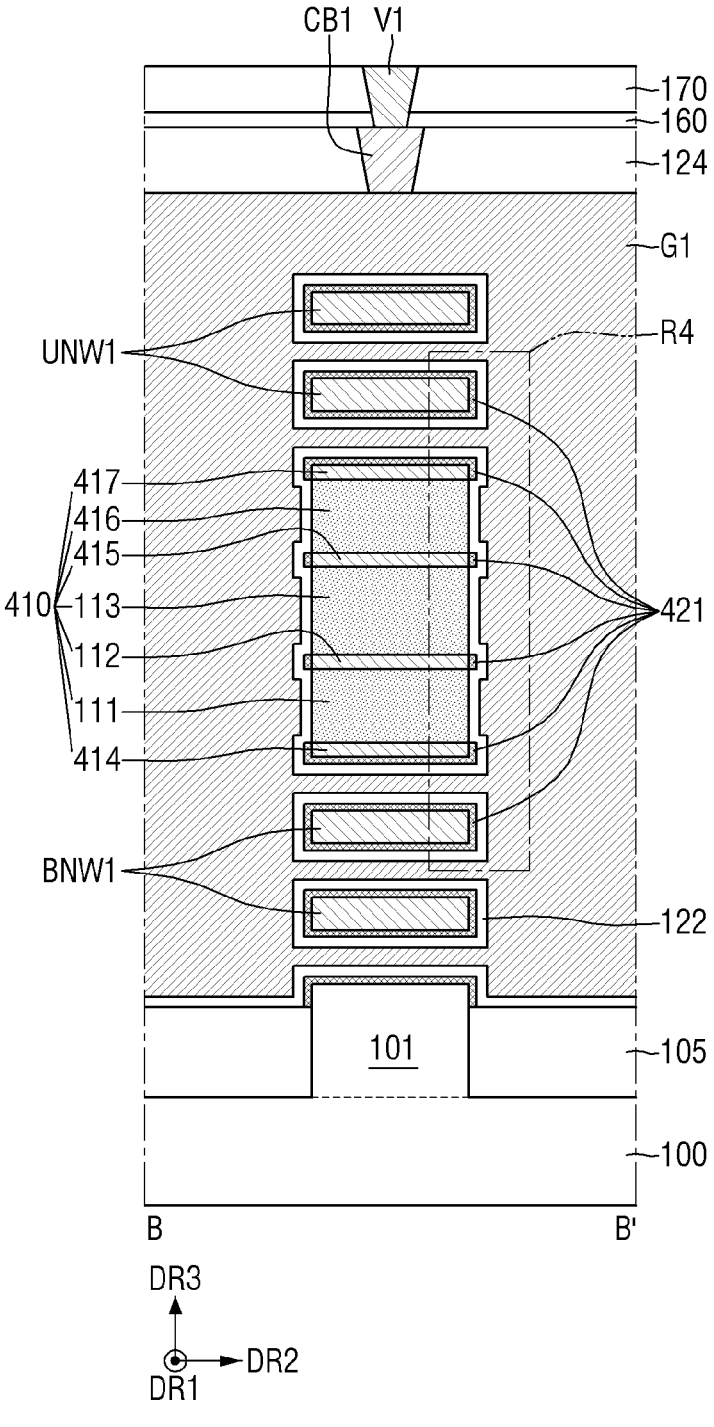

FIGS. 35 and 36 are cross-sectional views for describing a semiconductor device according to some embodiments. FIG. 37 is an enlarged view of area R4 of FIG. 36.

Figure 37:
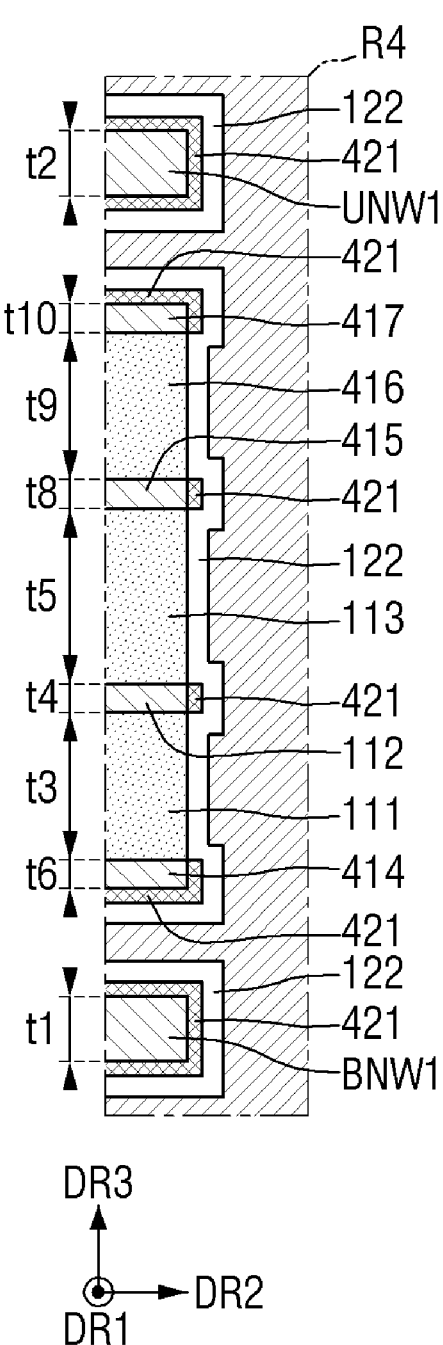
FIG. 37 is an enlarged view of area R4 of FIG. 36.

Referring to FIGS. 35 to 37, in a semiconductor device according to some embodiments of the present disclosure, a separation structure 410 may include first to seventh layers 111, 112, 113, 414, 415, 416, and 417.

For example, the separation structure 410 may include a fourth layer 414, a first layer 111, a second layer 112, a third layer 113, a fifth layer 415, a sixth layer 416, and a seventh layer 417 sequentially stacked. The fourth layer 414 may be disposed between the plurality of first lower nanosheets BNW1 and the first layer 111 and between the plurality of second lower nanosheets BNW2 and the first layer 111. The fourth layer 414 may be in contact with the first layer 111. The fifth layer 415 may be disposed on the third layer 113. The fifth layer 415 may be in contact with the third layer 113. The sixth layer 416 may be disposed on the fifth layer 415. The sixth layer 416 may be in contact with the fifth layer 415. The seventh layer 417 may be disposed on the sixth layer 416. The seventh layer 417 may be in contact with the sixth layer 416.

For example, each of the fourth layer 414, the fifth layer 415, and the seventh layer 417 may include or may be formed of the same material as the second layer 112. For example, each of the fourth layer 414, the fifth layer 415, and the seventh layer 417 may include or may be formed of the same material as the plurality of first and second lower nanosheets BNW1 and BNW2 and the plurality of first and second upper nanosheets UNW1 and UNW2. For example, each of the fourth layer 414, the fifth layer 415, and the seventh layer 417 may include or may be formed of silicon (Si). The sixth layer 416 may include or may be formed of the same material as each of the first layer 111 and the third layer 113. For example, the sixth layer 416 may include or may be formed of at least one of silicon nitride (SiN), silicon oxycarbonitride (SiOCN), silicon boron carbonitride (SiBCN), silicon carbonitride (SiCN), silicon oxynitride (SiON), and a combination thereof.

For example, each of a thickness t6 of the fourth layer 414 in the vertical direction DR3, a thickness t8 of the fifth layer 415 in the vertical direction DR3, and a thickness t10 of the seventh layer 417 in the vertical direction DR3 may be the same as the thickness t4 of the second layer 112 in the vertical direction DR3. A thickness t9 of the sixth layer 416 in the vertical direction DR3 may be the same as each of the thickness t3 of the first layer 111 in the vertical direction DR3 and the thickness t5 of the third layer 113 in the vertical direction DR3. For example, each of the thickness t6 of the fourth layer 414 in the vertical direction DR3, the thickness t8 of the fifth layer 415 in the vertical direction DR3, and the thickness t10 of the seventh layer 417 in the vertical direction DR3 may be smaller than each of the thickness t3 of the first layer 111 in the vertical direction DR3, the thickness t5 of the third layer 113 in the vertical direction DR3, and the thickness t9 of the sixth layer 416 in the vertical direction DR3. For example, each of the thickness t6 of the fourth layer 414 in the vertical direction DR3, the thickness t8 of the fifth layer 415 in the vertical direction DR3, and the thickness t10 of the seventh layer 417 in the vertical direction DR3 may be smaller than each of the thickness t1 of any one of the plurality of first lower nanosheets BNW1 in the vertical direction DR3 and the thickness t2 of any one of the plurality of first upper nanosheets UNW1 in the vertical direction DR3.

An interface layer 421 may be disposed between the uppermost surface of the separation structure 410 and the gate insulating layer 122. That is, the interface layer 421 may be disposed between an upper surface and a sidewall of the seventh layer 417 and the gate insulating layer 122. The interface layer 421 may be in contact with the upper surface and the sidewall of the seventh layer 417. The interface layer 421 may be disposed between the lowermost surface of the separation structure 410 and the gate insulating layer 122. That is, the interface layer 421 may be disposed between a lower surface and a sidewall of the fourth layer 414 and the gate insulating layer 122. The interface layer 421 may be in contact with the lower surface and the sidewall of the fourth layer 414. The interface layer 421 may be disposed between the sidewall of the second layer 112 and the gate insulating layer 122. The interface layer 421 may be in contact with the sidewall of the second layer 112. The interface layer 421 may be disposed between a sidewall of the fifth layer 415 and the gate insulating layer 122. The interface layer 421 may be in contact with the sidewall of the fifth layer 415.

Hereinafter, a semiconductor device according to some embodiments of the present disclosure will be described with reference to FIGS. 38 to 40. Differences from the semiconductor device illustrated in FIGS. 1 to 5 will be mainly described.

Figure 38:
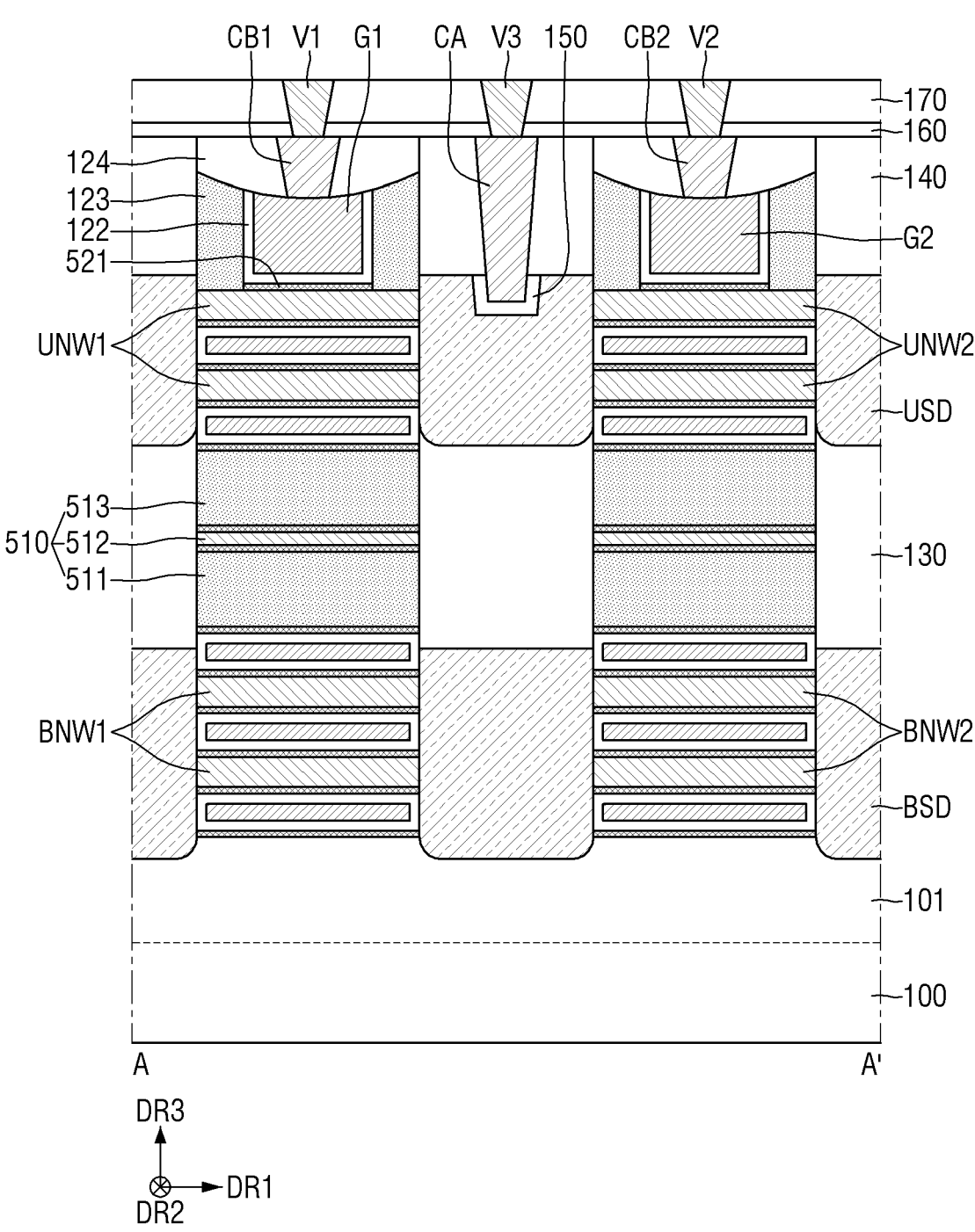
FIGS. 38 and 39 are cross-sectional views for describing a semiconductor device according to some embodiments.
Figure 39:
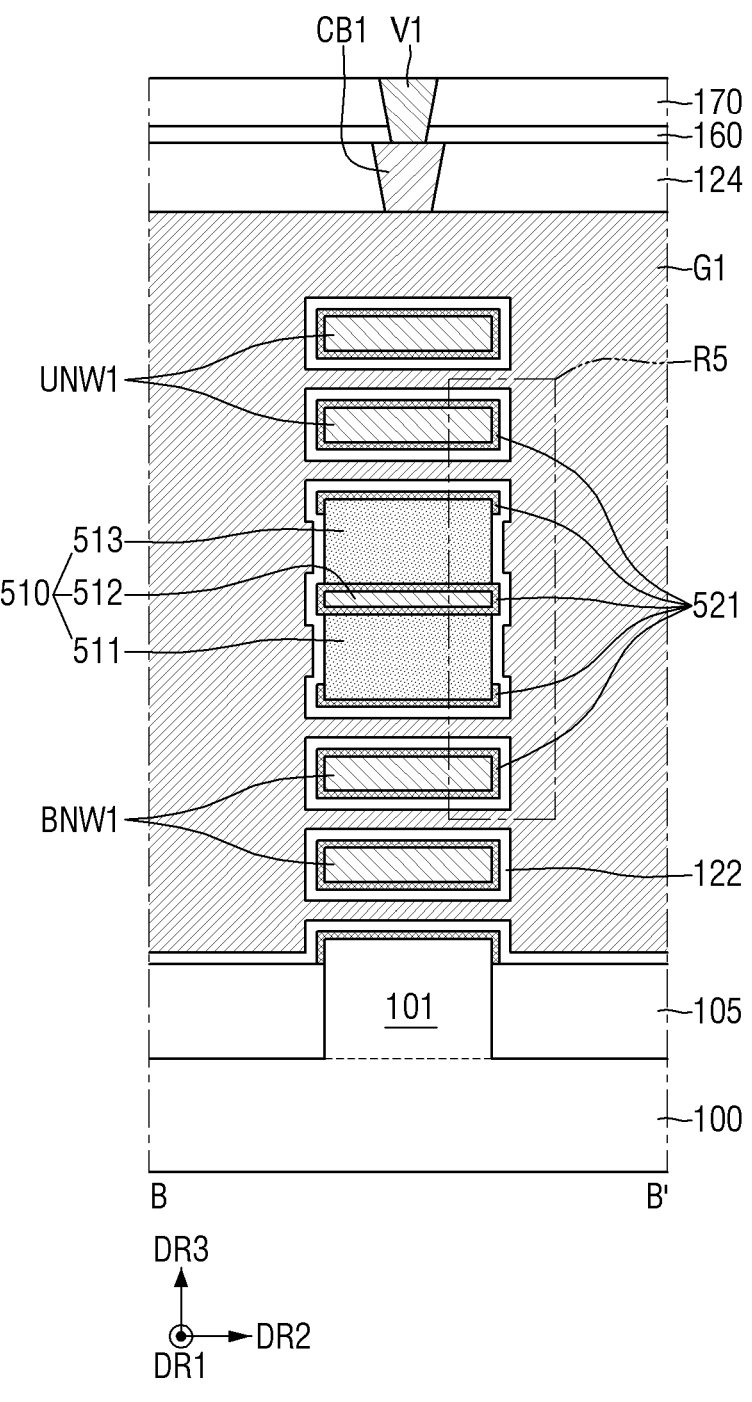

FIGS. 38 and 39 are cross-sectional views for describing a semiconductor device according to some embodiments. FIG. 40 is an enlarged view of area R5 of FIG. 39.

Figure 40:
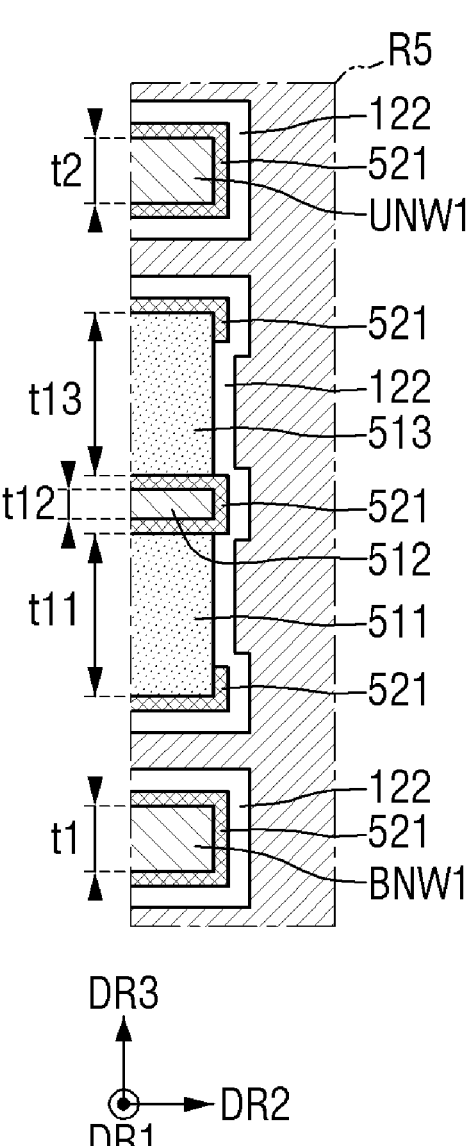
FIG. 40 is an enlarged view of area R5 of FIG. 39.

Referring to FIGS. 38 to 40, in a semiconductor device according to some embodiments of the present disclosure, a separation structure 510 may include first to third layers 511, 512, and 513.

For example, the separation structure 510 may include a first layer 511, a second layer 512, and a third layer 513 sequentially stacked. For example, the first layer 511 and the third layer 513 may include or may be formed of the same material. For example, each of the first layer 511 and the third layer 513 may include or may be formed of at least one of silicon nitride (SiN), silicon oxycarbonitride (SiOCN), silicon boron carbonitride (SiBCN), silicon carbonitride (SiCN), silicon oxynitride (SiON), and a combination thereof. For example, the second layer 512 may include or may be formed of the same material as the plurality of first and second lower nanosheets BNW1 and BNW2 and the plurality of first and second upper nanosheets UNW1 and UNW2. For example, the second layer 512 may include or may be formed of silicon (Si).

For example, a thickness t11 of the first layer 511 in the vertical direction DR3 and a thickness t13 of the third layer 513 in the vertical direction DR3 may be the same. For example, each of the thickness t11 of the first layer 511 in the vertical direction DR3 and the thickness t13 of the third layer 513 in the vertical direction DR3 may be greater than each of the thickness t1 of any one of the plurality of first lower nanosheets BNW1 in the vertical direction DR3 and the thickness t2 of any one of the plurality of first upper nanosheets UNW1 in the vertical direction DR3. For example, a thickness t12 of the second layer 112 in the vertical direction DR3 may be smaller than each of the thickness t11 of the first layer 511 in the vertical direction DR3 and the thickness t13 of the third layer 513 in the vertical direction DR3. For example, the thickness t12 of the second layer 512 in the vertical direction DR3 may be smaller than each of the thickness t1 of any one of the plurality of first lower nanosheets BNW1 in the vertical direction DR3 and the thickness t2 of any one of the plurality of first upper nanosheets UNW1 in the vertical direction DR3.

An interface layer 521 may be disposed between the uppermost surface of the separation structure 510 and the gate insulating layer 122. That is, the interface layer 521 may be disposed between an upper surface and a sidewall of the third layer 513 and the gate insulating layer 122. The interface layer 521 may be in contact with the upper surface and the sidewall of the third layer 513. The interface layer 521 may be disposed between the lowermost surface of the separation structure 510 and the gate insulating layer 122. That is, the interface layer 521 may be disposed between a lower surface and a sidewall of the first layer 511 and the gate insulating layer 122. The interface layer 521 may be in contact with the lower surface and the sidewall of the first layer 511. The interface layer 521 may be disposed between a sidewall of the second layer 512 and the gate insulating layer 122. The interface layer 521 may be disposed between the first layer 511 and the second layer 512 and between the second layer 512 and the third layer 513. The interface layer

521 may be in contact with each of the upper surface, the lower surface, and the sidewall of the second layer 512.

Hereinafter, a semiconductor device according to some embodiments of the present disclosure will be described with reference to FIGS. 41 to 43. Differences from the semiconductor device illustrated in FIGS. 1 to 5 will be mainly described.

Figure 41:
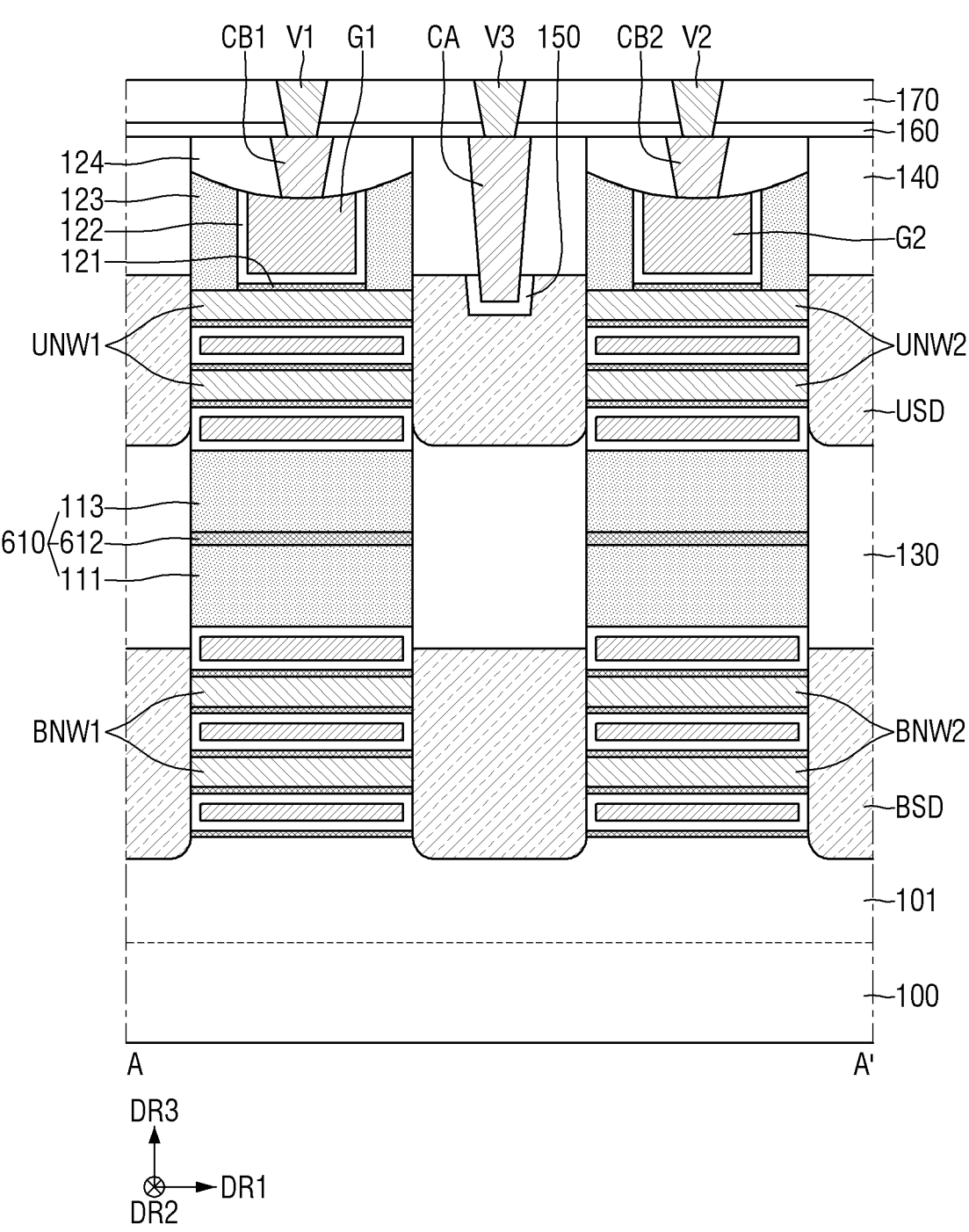
FIGS. 41 and 42 are cross-sectional views for describing a semiconductor device according to some embodiments.
Figure 42:
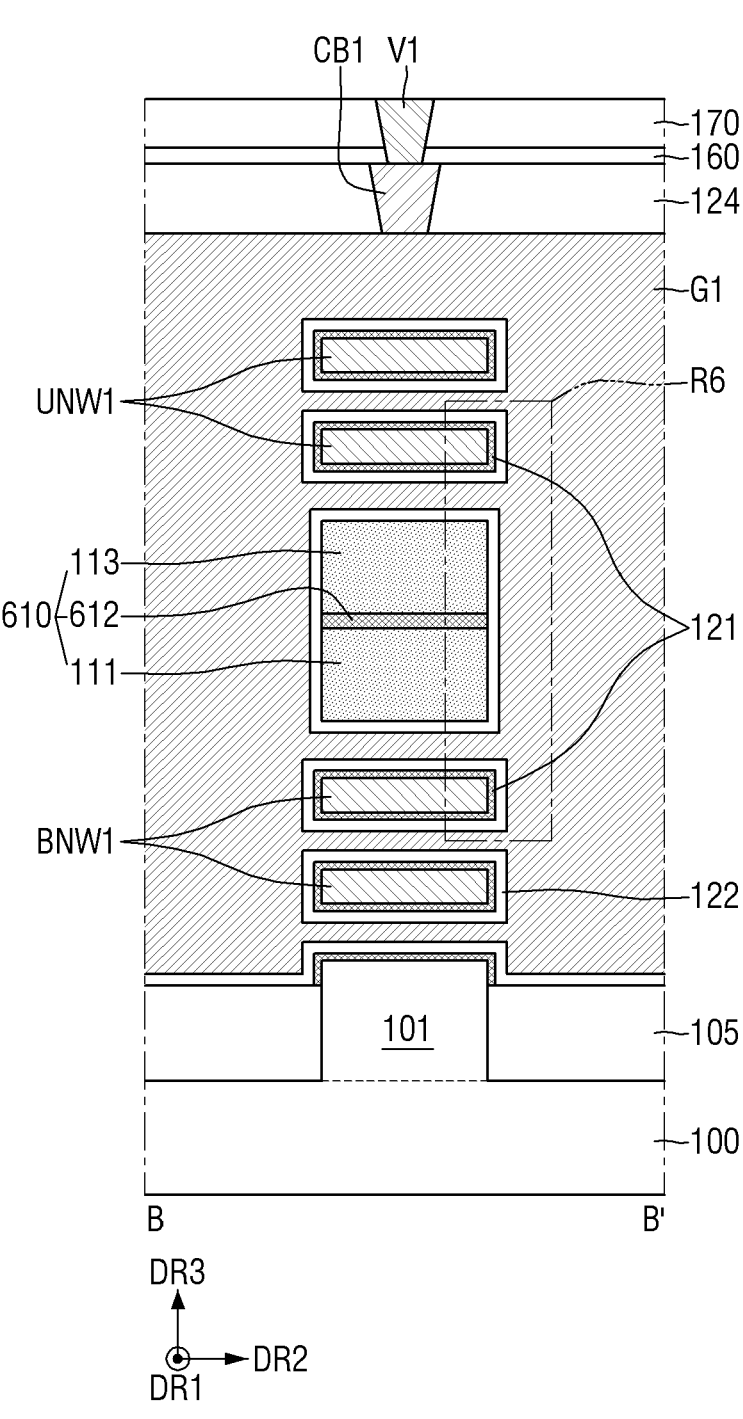

FIGS. 41 and 42 are cross-sectional views for describing a semiconductor device according to some embodiments. FIG. 43 is an enlarged view of area R6 of FIG. 42.

Figure 43:
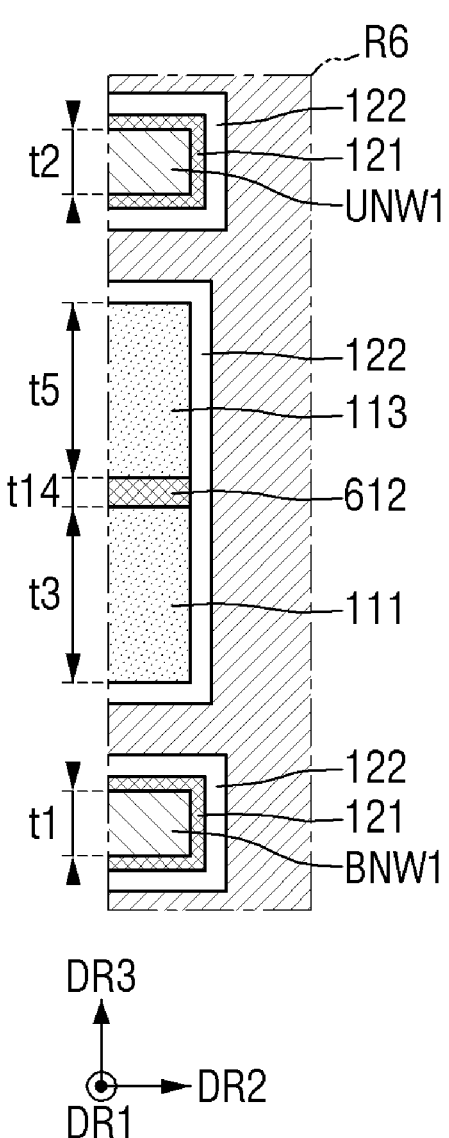
FIG. 43 is an enlarged view of area R6 of FIG. 42.

Referring to FIGS. 41 to 43, in a semiconductor device according to some embodiments of the present disclosure, a separation structure 610 may include first to third layers 111, 612, and 113.

For example, the separation structure 610 may include a first layer 111, a second layer 612, and a third layer 113 sequentially stacked. The second layer 612 may be in contact with each of the first layer 111 and the third layer 113. A sidewall of the second layer 612 may be in contact with the gate insulating layer 122. For example, the second layer 612 may include or may be formed of the same material as the interface layer 121. For example, the second layer 612 may include or may be formed of silicon oxide (SiO$_2$).

For example, a thickness t14 of the second layer 612 in the vertical direction DR3 may be smaller than each of the thickness t3 of the first layer 111 in the vertical direction DR3 and the thickness t5 of the third layer 113 in the vertical direction DR3. For example, the thickness t14 of the second layer 612 in the vertical direction DR3 may be smaller than each of the thickness t1 of any one of the plurality of first lower nanosheets BNW1 in the vertical direction DR3 and the thickness t2 of any one of the plurality of first upper nanosheets UNW1 in the vertical direction DR3.

Hereinafter, a semiconductor device according to some embodiments of the present disclosure will be described with reference to FIGS. 44 and 45. Differences from the semiconductor device illustrated in FIGS. 1 to 5 will be mainly described.

Figure 44:
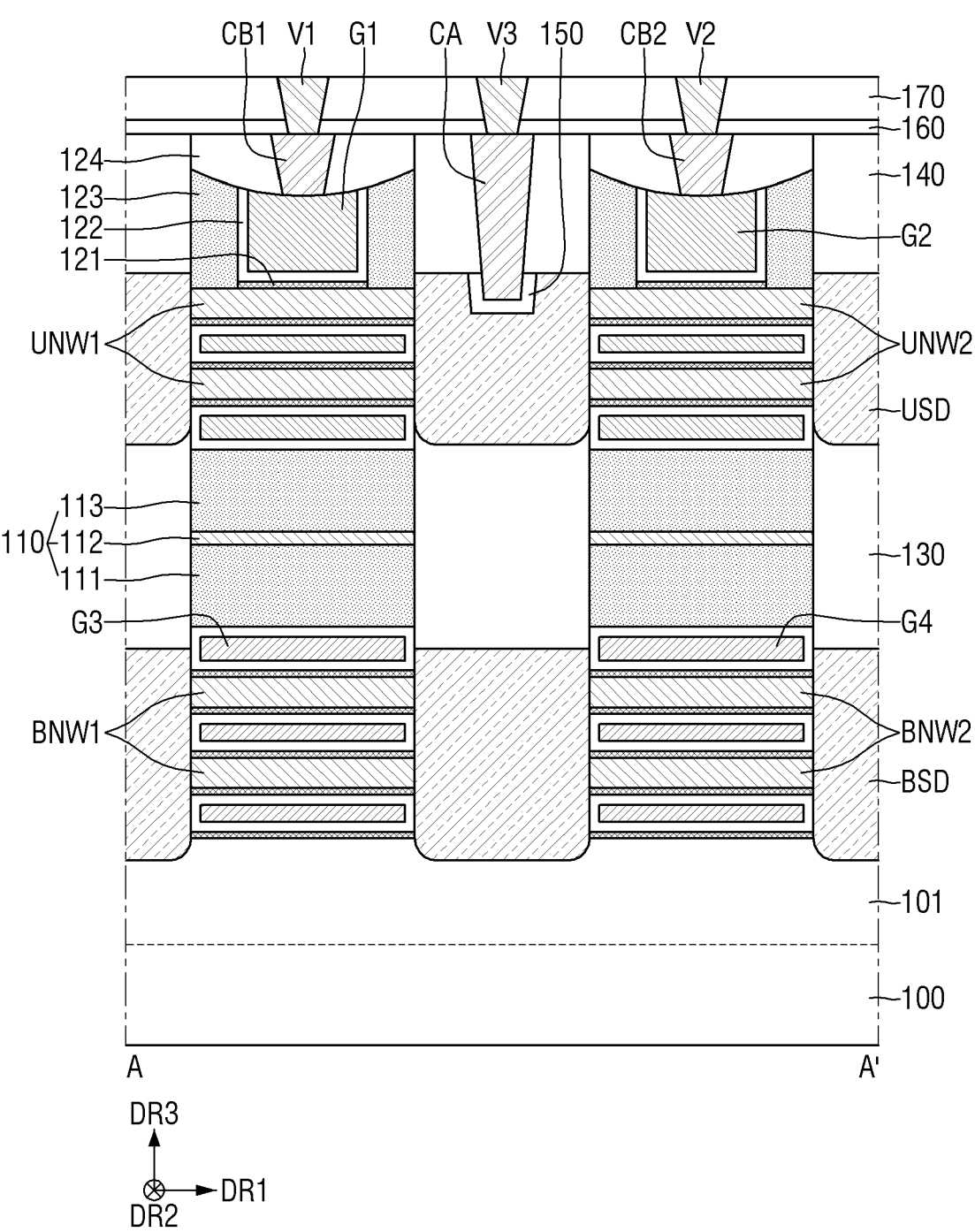
FIGS. 44 and 45 are cross-sectional views for describing a semiconductor device according to some embodiments.
Figure 45:
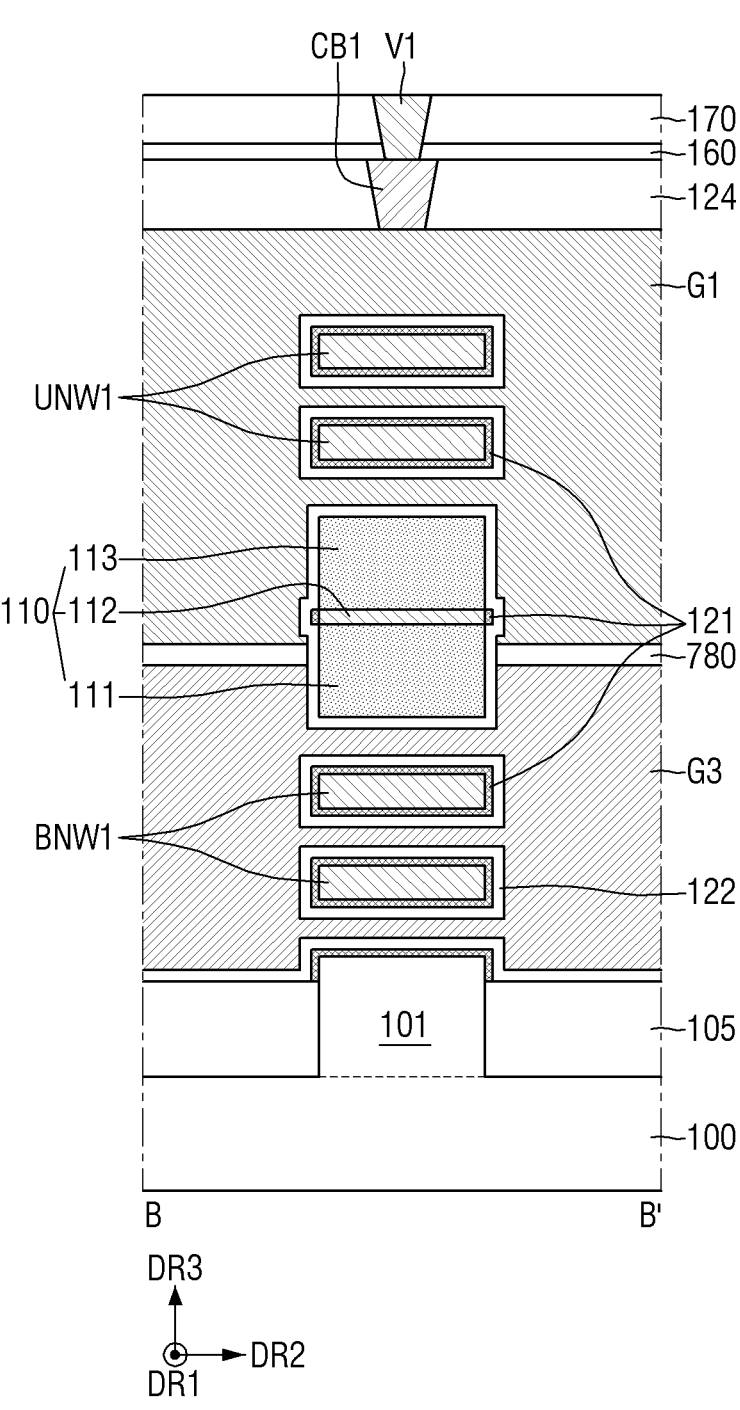

FIGS. 44 and 45 are cross-sectional views for describing a semiconductor device according to some embodiments.

Referring to FIGS. 44 and 45, a semiconductor device according to some embodiments may include a third gate electrode G3 disposed on a lower side of the first gate electrode G1 and a fourth gate electrode G4 disposed on a lower side of the second gate electrode G2.

Each of the third and fourth gate electrodes G3 and G4 may extend in the second horizontal direction DR2 on the active pattern 101. The fourth gate electrode G4 may be spaced apart from the third gate electrode G3 in the first horizontal direction DR1. The third gate electrode G3 may surround each of the plurality of first lower nanosheets BNW1. The third gate electrode G3 may surround a portion of the first layer 111. The fourth gate electrode G4 may surround each of the plurality of second lower nanosheets BNW2. The fourth gate electrode G4 may surround a portion of the first layer 111.

The first gate electrode G1 may extend in the second horizontal direction DR2 on the third gate electrode G3. The first gate electrode G1 may overlap the third gate electrode G3 in the vertical direction DR3. The first gate electrode G1 may be spaced apart from the third gate electrode G3 in the vertical direction DR3. The first gate electrode G1 may surround each of the plurality of first upper nanosheets UNW1. The first gate electrode G1 may surround a portion of the first layer 111, the second layer 112, and the third layer 113.

The second gate electrode G2 may extend in the second horizontal direction DR2 on the fourth gate electrode G4. The second gate electrode G2 may overlap the fourth gate electrode G4 in the vertical direction DR3. The second gate electrode G2 may be spaced apart from the fourth gate electrode G4 in the vertical direction DR3. The second gate electrode G2 may surround each of the plurality of second upper nanosheets UNW2. The second gate electrode G2 may surround a portion of the first layer 111, the second layer 112, and the third layer 113.

Each of the first to fourth gate electrodes G1, G2, G3, and G4 may include or may be formed of, for example, at least one of titanium nitride (TiN), tantalum carbide (TaC), tantalum nitride (TaN), titanium silicon nitride (TiSiN), tantalum silicon nitride (TaSiN), tantalum titanium nitride (Ta-TiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof. Each of the first to fourth gate electrodes G1, G2, G3, and G4 may include or may be formed of conductive metal oxide, conductive metal oxynitride, or the like. In some embodiment, each of the first to fourth gate electrodes G1, G2, G3, and G4 may include an oxidized form of the above-described material.

In some embodiments, the first and second gate electrodes G1 and G2 may include or may be formed of a material different from that of the third and fourth gate electrodes G3 and G4. However, the present disclosure is not limited thereto. In some embodiments, the first to fourth gate electrodes G1, G2, G3, and G4 may include or may be formed of the same material as each other.

A gate separation layer 780 may be disposed between the first gate electrode G1 and the third gate electrode G3 and between the second gate electrode G2 and the fourth gate electrode G4. The gate separation layer 780 may be disposed on a sidewall of the separation structure 110. In FIG. 45, the gate separation layer 780 is disposed on the sidewall of the first layer 111. The present disclosure is not limited thereto. In some embodiments, the gate separation layer 780 may be disposed on a sidewall of the second layer 112 or a sidewall of the third layer 113.

The gate separation layer 780 may include or may be formed of, for example, a conductive material, but the present disclosure is not limited thereto. In some embodiments, the gate separation layer 780 may include or may be formed of a conductive material and an insulating material.

Hereinafter, a semiconductor device according to some still other exemplary embodiments of the present disclosure will be described with reference to FIGS. 46 to 48. Differences from the semiconductor device illustrated in FIGS. 1 to 5 will be mainly described.

Figure 46:
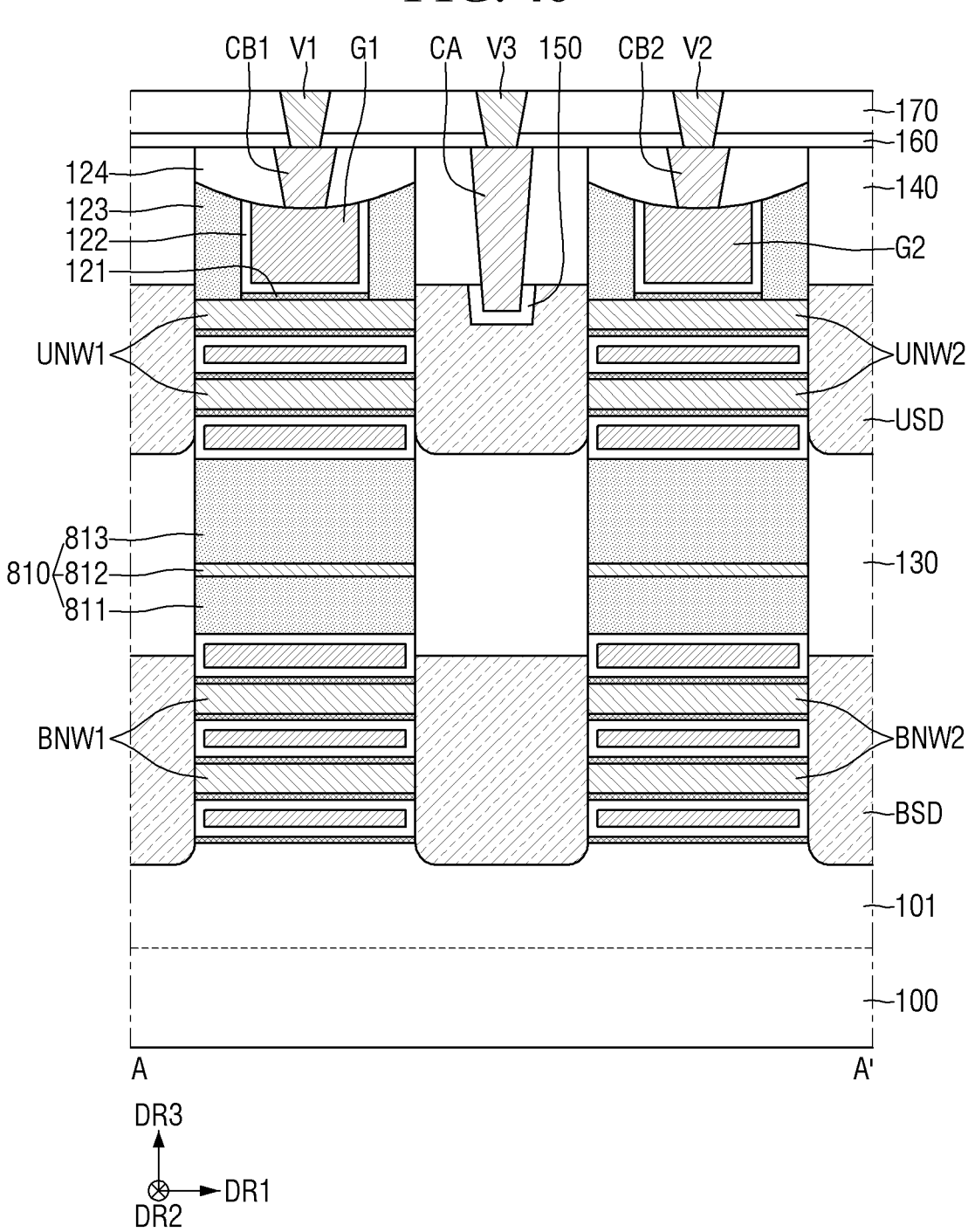
FIGS. 46 and 47 are cross-sectional views for describing a semiconductor device according to some embodiments.
Figure 47:
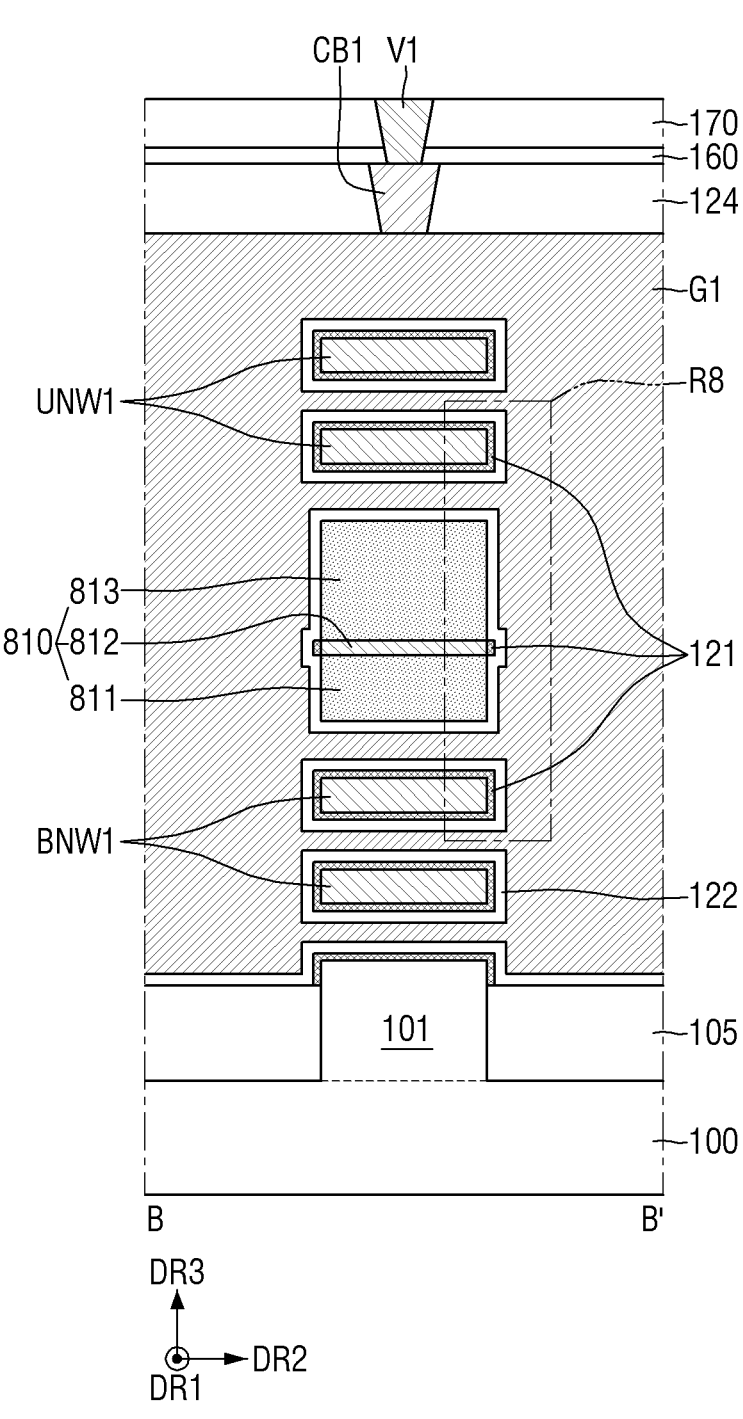

FIGS. 46 and 47 are cross-sectional views for describing a semiconductor device according to some embodiments. FIG. 48 is an enlarged view of area R8 of FIG. 47.

Figure 48:
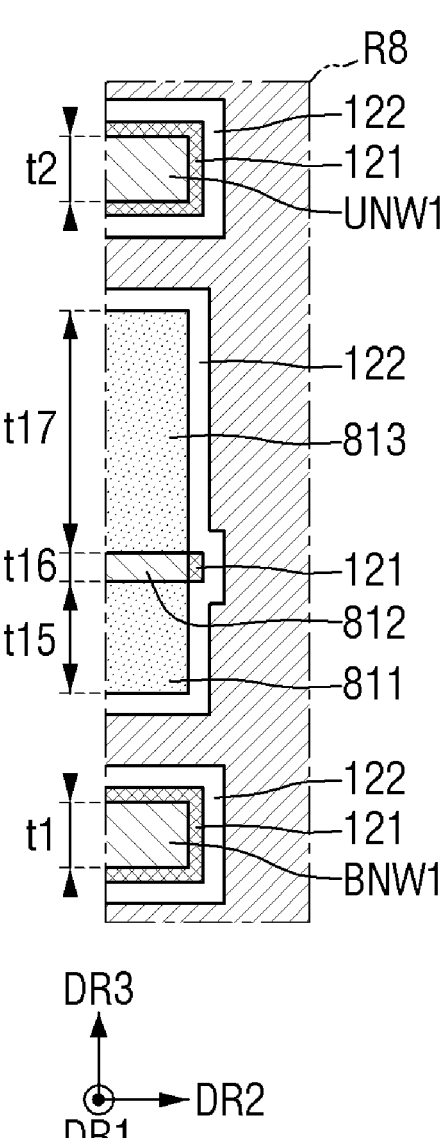
FIG. 48 is an enlarged view of area R8 of FIG. 47.

Referring to FIGS. 46 to 48, in a semiconductor device according to some embodiments of the present disclosure, a separation structure 810 may include first to third layers 811, 812, and 813.

The separation structure 810 may include a first layer 811, a second layer 812, and a third layer 813 sequentially stacked. The second layer 812 may be in contact with each of the first layer 811 and the third layer 813. The second layer 812 may include or may be formed of the same material as the plurality of first and second lower nanosheets BNW1 and BNW2 and the plurality of first and second upper nanosheets UNW1 and UNW2. For example, the second layer 812 may include or may be formed of silicon (Si). For example, each of the first layer 811 and the third layer 813 may include or may be formed of at least one of silicon nitride (SiN), silicon oxycarbonitride (SiOCN), silicon boron carbonitride (SiBCN), silicon carbonitride (SiCN), silicon oxynitride (SiON), and a combination thereof.

For example, a thickness t17 of the third layer 813 in the vertical direction DR3 may be different from a thickness t15 of the first layer 811 in the vertical direction DR3. In some embodiments, the thickness t17 of the third layer 813 in the vertical direction DR3 may be greater than the thickness t15 of the first layer 811 in the vertical direction DR3. However, the present disclosure is not limited thereto. In some embodiments, the thickness t17 of the third layer 813 in the vertical direction DR3 may be smaller than the thickness t15 of the first layer 811 in the vertical direction DR3.

For example, the thickness t15 of the first layer 811 in the vertical direction DR3 may be greater than a thickness t16 of the second layer 812 in the vertical direction DR3. For example, the thickness t16 of the second layer 812 in the vertical direction DR3 may be smaller than each of the thickness t1 of any one of the plurality of first lower nanosheets BNW1 in the vertical direction DR3 and the thickness t2 of any one of the plurality of first upper nanosheets UNW1 in the vertical direction DR3. The interface layer 121 may be disposed between a sidewall of the second layer 812 and the gate insulating layer 122. The interface layer 121 may be in contact with the sidewall of the second layer 812.

Hereinafter, a semiconductor device according to some embodiments of the present disclosure will be described with reference to FIG. 49. Differences from the semiconductor device illustrated in FIGS. 1 to 5 will be mainly described.

Figure 49:
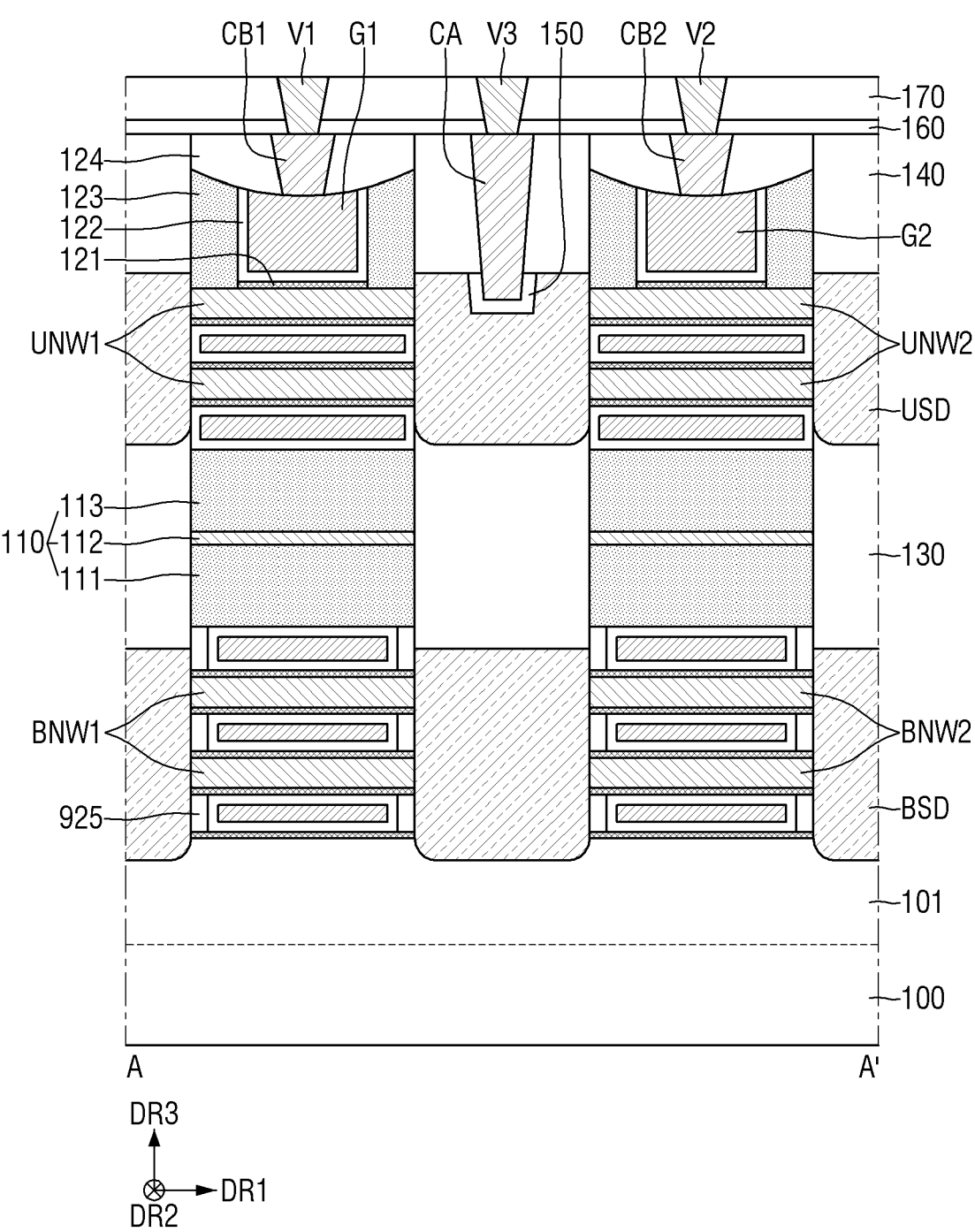
FIG. 49 is a cross-sectional view for describing a semiconductor device according to some embodiments.

FIG. 49 is a cross-sectional view for describing a semiconductor device according to some embodiments.

Referring to FIG. 49, in a semiconductor device according to some embodiments of the present disclosure, an internal spacer 925 may be disposed between the first gate electrode G1 and the lower source/drain region BSD and between the second gate electrode G2 and the lower source/drain region BSD.

For example, the internal spacer 925 may be disposed at opposite sides of each of the first and second gate electrodes G1 and G2 between the active pattern 101 and the separation structure 110. The internal spacer 925 may be in contact with the lower source/drain region BSD. The internal spacer 925 may be in contact with the gate insulating layer 122.

In some embodiments, the internal spacer 925 may be disposed between the first gate electrode G1 and the upper source/drain region USD and between the second gate electrode G2 and the upper source/drain region USD.

Embodiments of the present disclosure have been described hereinabove with reference to the accompanying drawings, but the present disclosure is not limited to the above-described embodiments, and may be implemented in various different forms, and one of ordinary skill in the art to which the present disclosure pertains may understand that the present disclosure may be implemented in other specific forms without changing the technical spirit or essential features of the present disclosure. Therefore, it should be understood that the embodiments described above are illustrative in all aspects and not restrictive.

What is claimed is:

1. A semiconductor device comprising:
a substrate;
an active pattern extending in a first horizontal direction on the substrate;
a plurality of lower nanosheets stacked, while being spaced apart from each other in a vertical direction, on the active pattern;
a separation structure spaced apart from the plurality of lower nanosheets in the vertical direction and disposed on the plurality of lower nanosheets, and including a first layer, a second layer, and a third layer sequentially stacked on each other;
a plurality of upper nanosheets spaced apart from the separation structure in the vertical direction and disposed on the separation structure, and stacked, while being spaced apart from each other in the vertical direction, on the separation structure; and
a gate electrode extending in a second horizontal direction different from the first horizontal direction, and surrounding the separation structure, each lower nanosheet of the plurality of lower nanosheets, and each upper nanosheet of the plurality of upper nanosheets to form a multi-bridge channel field effect transistor,
wherein the first layer and the third layer include the same material, and
wherein each of the first layer and the third layer includes a material different from a material of the second layer.

2. The semiconductor device of claim 1,
wherein the second layer includes the same material as each lower nanosheet of the plurality of lower nanosheets and each upper nanosheet of the plurality of upper nanosheets.

3. The semiconductor device of claim 1,
wherein a thickness of the second layer in the vertical direction is smaller than each of a thickness of the first layer in the vertical direction and a thickness of the third layer in the vertical direction.

4. The semiconductor device of claim 1,
wherein a thickness of the second layer in the vertical direction is smaller than each of a thickness of each lower nanosheet of the plurality of lower nanosheets in the vertical direction and a thickness of each upper nanosheet of the plurality of upper nanosheets in the vertical direction.

5. The semiconductor device of claim 1, further comprising:
an interlayer insulating layer contacting sidewalls of the separation structure in the first horizontal direction.

6. The semiconductor device of claim 1, further comprising:
a lower source/drain region disposed on sidewalls of the plurality of lower nanosheets; and
an upper source/drain region disposed on sidewalls of the plurality of upper nanosheets,
wherein the upper source/drain region is spaced apart from the lower source/drain region in the vertical direction, and
wherein each of the lower source/drain region and the upper source/drain region does not contact the separation structure.

7. The semiconductor device of claim 1, further comprising:

a gate insulating layer disposed between the gate electrode and the separation structure, and contacting an uppermost surface of the separation structure.

8. The semiconductor device of claim 1, further comprising:

a gate insulating layer disposed between the gate electrode and the separation structure; and an interface layer disposed between the gate insulating layer and an uppermost surface of the separation structure, and contacting the uppermost surface of the separation structure.

9. The semiconductor device of claim 8, wherein the interface layer is disposed between the first layer and the second layer, and between the second layer and the third layer.

10. The semiconductor device of claim 1, further comprising:

a gate insulating layer disposed between the gate electrode and sidewalls of the second layer; and an interface layer disposed between the gate insulating layer and the sidewalls of the second layer, and contacting the sidewalls of the second layer.

11. The semiconductor device of claim 1, further comprising:

a gate insulating layer disposed between the gate electrode and the plurality of lower nanosheets; and an interface layer disposed between the gate insulating layer and each lower nanosheet of the plurality of lower nanosheets, wherein the second layer includes the same material as the interface layer.

12. The semiconductor device of claim 1, wherein the gate electrode further includes:

a first gate electrode surrounding each lower nanosheet of the plurality of lower nanosheets, and a second gate electrode surrounding each upper nanosheet of the plurality of upper nanosheets, and wherein the second gate electrode is spaced apart from the first gate electrode in the vertical direction.

13. The semiconductor device of claim 1, wherein the gate electrode includes a first portion surrounding the separation structure, a second portion surrounding each lower nanosheet of the plurality of lower nanosheets, and a third portion surrounding each upper nanosheet of the plurality of upper nanosheets, and wherein the first portion is connected to the second portion and the third portion.

* * * * *